(12) United States Patent
Ogiwara et al.

(10) Patent No.: US 11,043,638 B2
(45) Date of Patent: Jun. 22, 2021

(54) ORGANIC ELECTROLUMINESCENCE DEVICE AND ELECTRONIC DEVICE

(71) Applicant: IDEMITSU KOSAN CO., LTD., Chiyoda-ku (JP)

(72) Inventors: Toshinari Ogiwara, Sodegaura (JP); Kei Yoshida, Sodegaura (JP); Yuichiro Kawamura, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 308 days.

(21) Appl. No.: 14/909,023

(22) PCT Filed: Oct. 6, 2015

(86) PCT No.: PCT/JP2015/078365
§ 371 (c)(1),
(2) Date: Jan. 29, 2016

(87) PCT Pub. No.: WO2016/056559
PCT Pub. Date: Apr. 14, 2016

(65) Prior Publication Data
US 2016/0190469 A1  Jun. 30, 2016

(30) Foreign Application Priority Data
Oct. 7, 2014 (JP) .............................. JP2014-206797

(51) Int. Cl.
*H01L 51/00* (2006.01)
*C09K 11/06* (2006.01)
(Continued)

(52) U.S. Cl.
CPC .......... *H01L 51/0067* (2013.01); *C09K 11/06* (2013.01); *H01L 51/008* (2013.01);
(Continued)

(58) Field of Classification Search
CPC ............... H01L 51/0067; H01L 51/006; H01L 51/0071; H01L 51/0072; H01L 51/5012;
(Continued)

(56) References Cited

U.S. PATENT DOCUMENTS

2011/0121268 A1  5/2011  Nagao et al.
2012/0001161 A1  1/2012  Nakano et al.
(Continued)

FOREIGN PATENT DOCUMENTS

CN  101952389 A  1/2011
CN  102333783 A  1/2012
(Continued)

OTHER PUBLICATIONS

"Yuki Hando-tai no Debaisu Bussei (Device Physics of Organic Semiconductors)," (With English translation), (Total 19 pages), 2012.
(Continued)

*Primary Examiner* — Ruiyun Zhang
(74) *Attorney, Agent, or Firm* — Oblon, McClelland, Maier & Neustadt, L.L.P.

(57) ABSTRACT

An organic electroluminescence device includes an anode, an emitting layer and a cathode, in which the emitting layer includes a first compound and a second compound. The first compound is a delayed-fluorescent compound. The second compound is represented by a formula (2) below, in which X is a nitrogen atom or a carbon atom bonded to Y; $R_{21}$ to $R_{26}$ are each independently a hydrogen atom or a substituent; $Z_{21}$ and $Z_{22}$ are each independently selected from the group consisting of a halogen atom, a substituted or unsubstituted aryl group, a substituted or unsubstituted alkoxy group, and a substituted or unsubstituted aryloxy group.

(Continued)

(2)

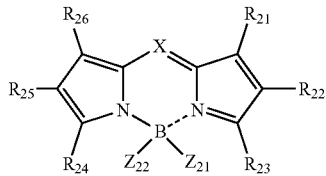

22 Claims, 4 Drawing Sheets

(51) Int. Cl.
  *H05B 33/14* (2006.01)
  *H05B 33/20* (2006.01)
  *H01L 51/50* (2006.01)
(52) U.S. Cl.
  CPC .......... *H05B 33/14* (2013.01); *H05B 33/145* (2013.01); *H05B 33/20* (2013.01); *C09K 2211/1007* (2013.01); *C09K 2211/1022* (2013.01); *C09K 2211/1029* (2013.01); *C09K 2211/1059* (2013.01); *C09K 2211/188* (2013.01); *H01L 51/006* (2013.01); *H01L 51/0071* (2013.01); *H01L 51/0072* (2013.01); *H01L 51/5012* (2013.01); *H01L 51/5056* (2013.01); *H01L 51/5072* (2013.01); *H01L 2251/308* (2013.01)
(58) Field of Classification Search
  CPC ... H01L 51/5056; H05B 33/14; H05B 33/145; H05B 33/20; C09K 2211/1007; C09K 2211/1022; C09K 2211/1029; C09K 2211/1059; C09K 2211/188
  USPC .................. 428/690, 917; 257/40, E51.024; 548/405; 436/172
  See application file for complete search history.

(56) References Cited

U.S. PATENT DOCUMENTS

| | | | |
|---|---|---|---|
| 2012/0037890 | A1 | 2/2012 | Okuda et al. |
| 2015/0105564 | A1* | 4/2015 | Adachi .................. C09K 11/06 548/440 |
| 2015/0188070 | A1* | 7/2015 | Ogiwara ............. H01L 51/5012 257/40 |

FOREIGN PATENT DOCUMENTS

| | | |
|---|---|---|
| CN | 102369614 A | 3/2012 |
| JP | 2003-012676 A | 1/2003 |
| JP | 2011-014886 A | 1/2011 |
| JP | 2012-079915 A | 4/2012 |
| JP | 4947142 B2 | 6/2012 |
| JP | 2013-105665 A | 5/2013 |
| JP | 6722579 B | 6/2020 |
| WO | 2009/116456 A1 | 9/2009 |
| WO | 2010/001817 A1 | 1/2010 |
| WO | 2010/098098 A1 | 9/2010 |
| WO | 2010/113743 A1 | 10/2010 |
| WO | 2012/133188 A1 | 10/2012 |
| WO | 2012/153780 A1 | 11/2012 |
| WO | 2013/038650 A1 | 3/2013 |
| WO | 2013/180241 A1 | 12/2013 |
| WO | 2014/010611 A1 | 1/2014 |
| WO | 2014/013947 A1 | 1/2014 |
| WO | WO 2014/054452 A1 | 4/2014 |
| WO | 2014/092083 A1 | 6/2014 |
| WO | 2014/104346 A1 | 7/2014 |
| WO | 2015/098975 A1 | 7/2015 |
| WO | 2015/159706 A1 | 10/2015 |

OTHER PUBLICATIONS

International Search Report dated Dec. 8, 2015 in PCT/JP15/78365 Filed Oct. 6, 2015.
Office Action issued in corresponding Japanese Patent Application No. 2020-107179, dated Jan. 26, 2021.
Office Action issued in corresponding Chinese Patent Application No. 201910426700.X dated Dec. 25, 2020.

\* cited by examiner

ORGANIC ELECTROLUMINESCENCE DEVICE AND ELECTRONIC DEVICE

TECHNICAL FIELD

The present invention relates to an organic electroluminescence device and an electronic device.

BACKGROUND ART

When a voltage is applied to an organic electroluminescence device (hereinafter, occasionally referred to as an "organic EL device"), holes are injected from an anode into an emitting layer and electrons are injected from a cathode into the emitting layer. The injected electrons and holes are recombined in an emitting layer to form excitons. According to the electron spin statistics theory, singlet excitons and triplet excitons are generated at a ratio of 25%:75%.

A fluorescent organic EL device, which uses emission caused by singlet excitons, has been used in full-color displays of a mobile phone, TV and the like. However, a further study for improving performance of the fluorescent EL device has been made (see, for instance, Patent Literatures 1 to 5).

CITATION LIST

Patent Literature(s)

Patent Literature 1: International Publication No. WO2012/133188
Patent Literature 2: International Publication No. WO2014/013947
Patent Literature 3: JP-A-2003-12676
Patent Literature 4: International Publication No. WO2010/098098
Patent Literature 5: Japanese Patent No. 4947142

SUMMARY OF THE INVENTION

Problems to be Solved by the Invention

An object of the invention is to provide an organic electroluminescence device with high performance, and an electronic device including the organic electroluminescence device.

Means for Solving the Problems

According to an aspect of the invention, an organic electroluminescence device includes an anode, an emitting layer and a cathode, in which the emitting layer includes a first compound and a second compound, the first compound is a delayed fluorescent compound, and the second compound is represented by a formula (2) below.

[Formula 1]

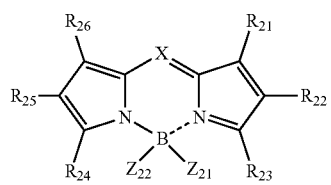

(2)

In the formula (2), X is a nitrogen atom or a carbon atom to be bonded to Y. Y is a hydrogen atom or a substituent. $R_{21}$ to $R_{26}$ are each independently a hydrogen atom or a substituent. When Y and $R_{21}$ to $R_{26}$ are substituents, the substituents are selected from the group consisting of a substituted or unsubstituted alkyl group, a substituted or unsubstituted cycloalkyl group, a substituted or unsubstituted aryl group, a substituted or unsubstituted alkoxy group, a substituted or unsubstituted alkylthio group, a substituted or unsubstituted aryloxy group, a substituted or unsubstituted arylthio group, a substituted or unsubstituted alkenyl group, a substituted or unsubstituted aralkyl group, a substituted or unsubstituted heteroaryl group, a halogen atom, a haloalkyl group, a carboxy group, an ester group, a carbamoyl group, an amino group, a nitro group, a cyano group, a silyl group, and a siloxanyl group. $Z_{21}$ and $Z_{22}$ are each independently selected from the group consisting of a halogen atom, a substituted or unsubstituted aryl group, a substituted or unsubstituted alkoxy group, and a substituted or unsubstituted aryloxy group.

According to another aspect of the invention, an electronic device includes the above-described organic electroluminescence device.

With this arrangement, an organic electroluminescence device with high performance can be provided. Moreover, with this arrangement, an electronic device including the organic electroluminescence device can be provided.

DESCRIPTION OF EMBODIMENT(S)

First Exemplary Embodiment

An organic EL device according to a first exemplary embodiment will be described below.

The organic EL device includes: electrodes (i.e., an anode and a cathode); and an organic layer disposed between the electrodes. The organic layer includes at least one layer formed of an organic compound. The organic layer may further include an inorganic compound. The organic EL device according to the first exemplary embodiment includes at least one emitting layer as the organic layer. The organic layer may be provided by a single emitting layer. Alternatively, the organic layer may include any layer(s) employed in an organic EL device such as a hole injecting layer, a hole transporting layer, an electron injecting layer, an electron transporting layer, a hole blocking layer, and an electron blocking layer.

Figure 1:
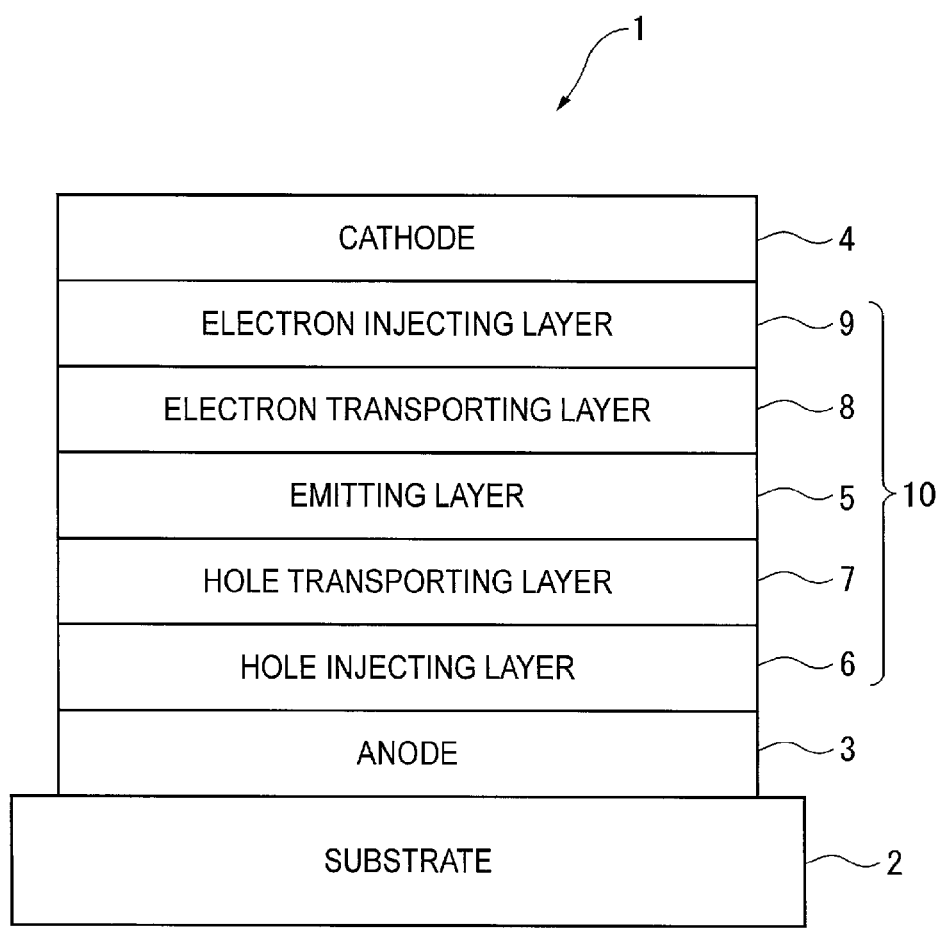
FIG. 1 schematically shows an exemplary arrangement of an organic electroluminescence device according to an exemplary embodiment.

FIG. 1 schematically shows an arrangement of an organic EL device according to the exemplary embodiment.

An organic EL device 1 includes a light-transmissive substrate 2, an anode 3, a cathode 4 and an organic layer 10 disposed between the anode 3 and the cathode 4. The organic layer 10 includes a hole injecting layer 6, a hole transporting layer 7, an emitting layer 5, an electron transporting layer 8, and an electron injecting layer 9, which are sequentially laminated from the anode 3.

Emitting Layer

The emitting layer of the organic EL device contains a first compound and a second compound. The emitting layer may contain a metal complex. However, in the exemplary embodiment, the emitting layer preferably contains no phosphorescent metal complex, more preferably contains no other metal complex in addition to the phosphorescent metal complex.

First Compound

The first compound in the exemplary embodiment is a delayed fluorescent compound. The first compound is preferably represented by a formula (1) below. The first compound of the exemplary embodiment is not a metal complex.

Examples of the first compound are the compound represented by the formula (1) below.

[Formula 2]

$$\{(B)_b\text{-}(L)_c\text{-}_d\text{-}(A)\}_a \quad (1)$$

In the formula (1): A is an acceptor moiety, which is a group having a partial structure selected from formulae (a-1) to (a-7) below; <<nret>> when a plurality of A are present, the plurality of A may be mutually the same or different and may be mutually bonded to form a saturated or unsaturated ring; B is a donor moiety, which is a group having a partial structure selected from formulae (b-1) to (b-6) below; <<nret>> when a plurality of B are present, the plurality of B may be mutually the same or different and may be mutually bonded to form a saturated or unsaturated ring; a, b and d are each independently an integer of 1 to 5; c is an integer of 0 to 5; when c is 0, A is bonded to B by a single bond or a spiro bond; when c is an integer of 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms; when a plurality of L are present, the plurality of L may be mutually the same or different and may be mutually bonded to form a saturated or unsaturated ring.

[Formula 3]

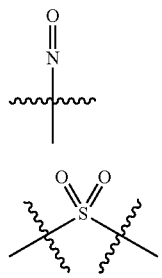
(a-1)

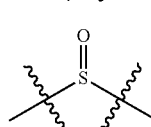
(a-2)

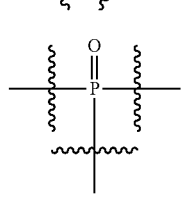
(a-3)

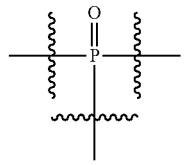
(a-4)

(a-5)

(a-6)

(a-7)

[Formula 4]

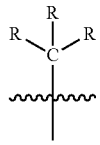
(b-1)

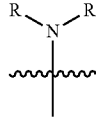
(b-2)

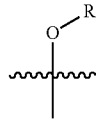
(b-3)

(b-4)

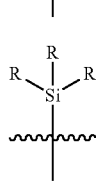
(b-5)

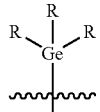
(b-6)

In the formulae (b-1) to (b-6): R is each independently a hydrogen atom or a substituent; when R is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms; and when a plurality of R are present, the plurality of R may be mutually the same or different and may be mutually bonded to form a saturated or unsaturated ring.

A bonding pattern of the compound represented by the formula (1) is exemplified by bonding patterns shown in Table 1 below.

TABLE 1

| No. | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, B<A,A |
| (1D) | 1 | 2 | 0 | 1 | B—B—A, B,B>A |
| (1E) | 2 | 1 | 1 | 1 | B—L—A—A, B—L<A,A |
| (1F) | 1 | 2 | 1 | 1 | B—B—L—A, B,B>L—A |
| (1G) | 1 | 1 | 2 | 1 | B—L—L—A |
| (1H) | 1 | 1 | 1 | 2 | B—L>A,A, B—L>A; B—L—B—L—A |

Specific examples of the first compound are given below. It should be noted that the first compound according to the invention is not limited to these specific examples.

[Formula 5]

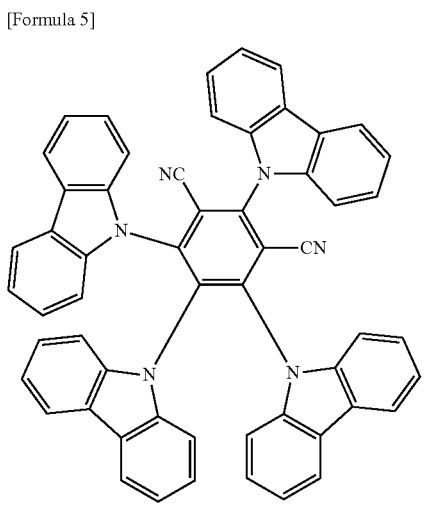

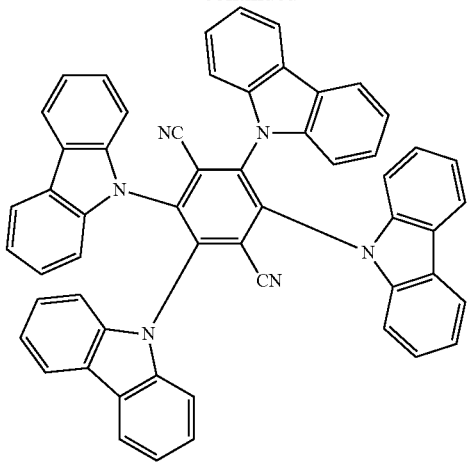

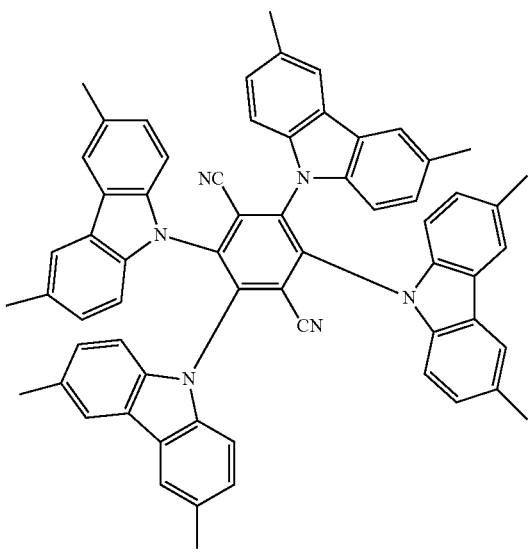

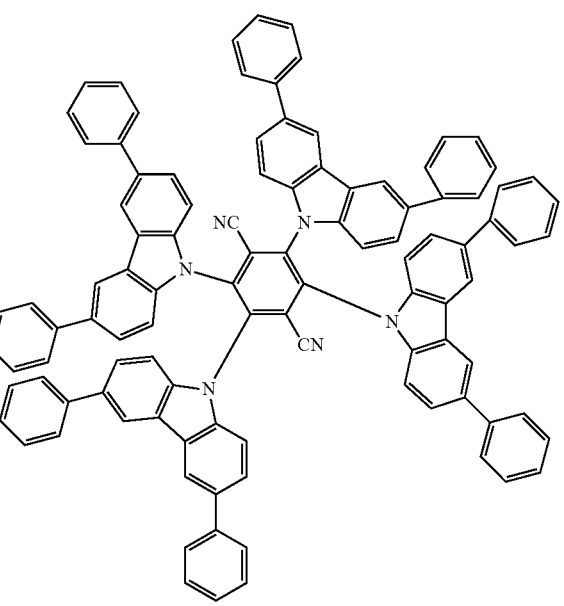

[Formula 6]
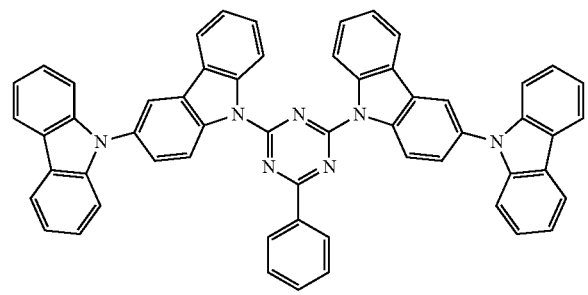
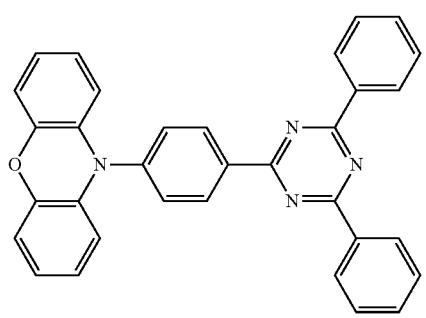
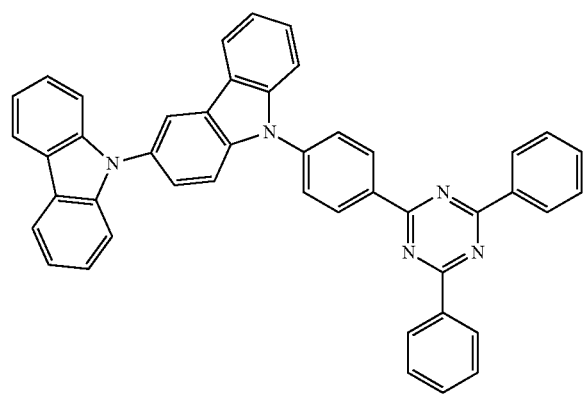
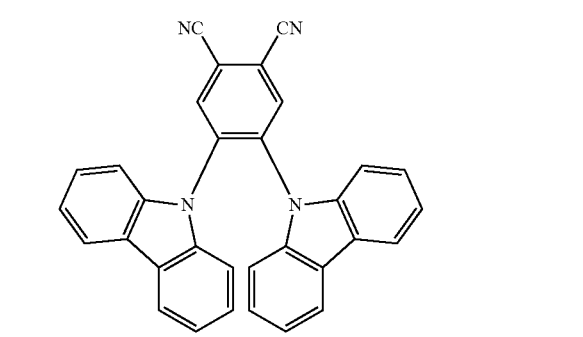
[Formula 7]
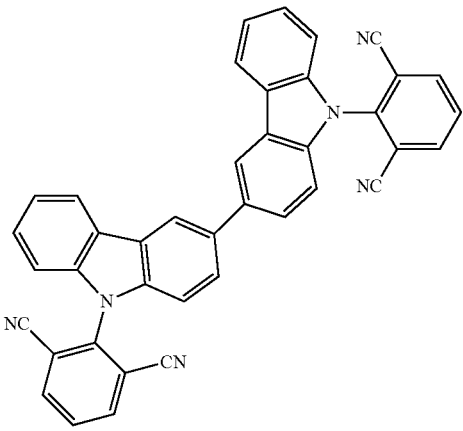
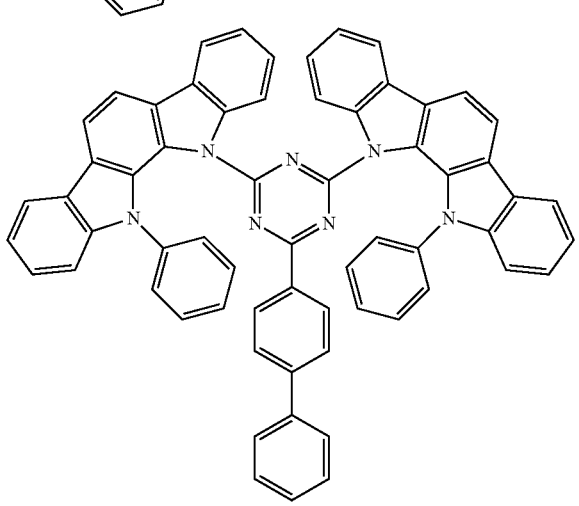
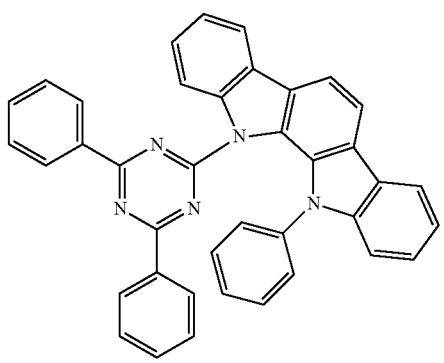

[Formula 8]
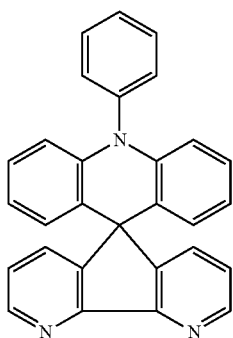
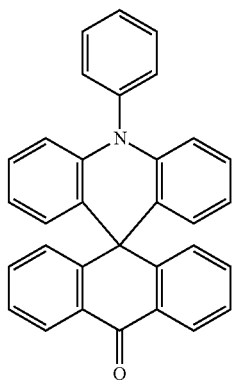
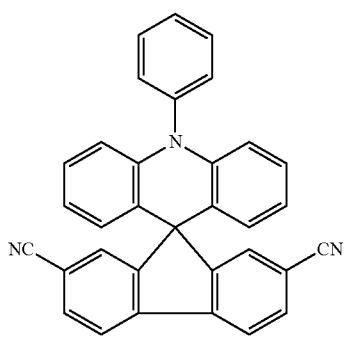
[Formula 9]
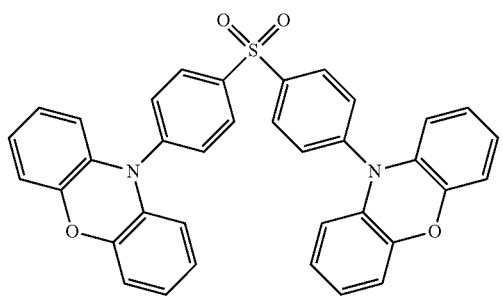
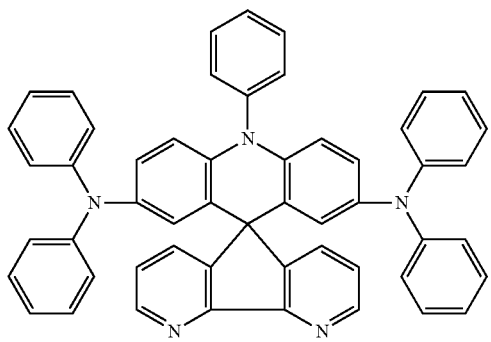
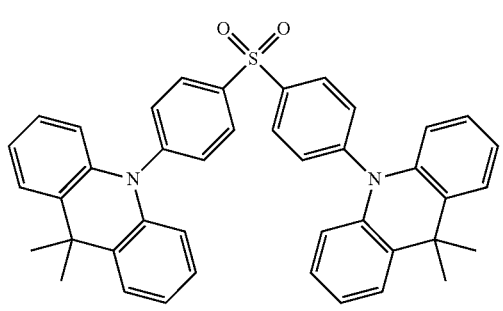
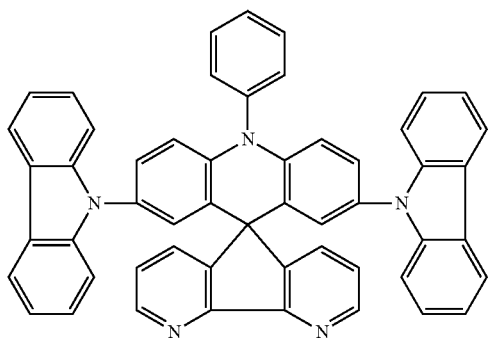
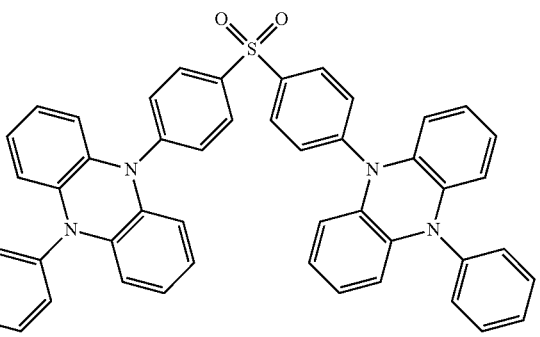

-continued
[Formula 10]
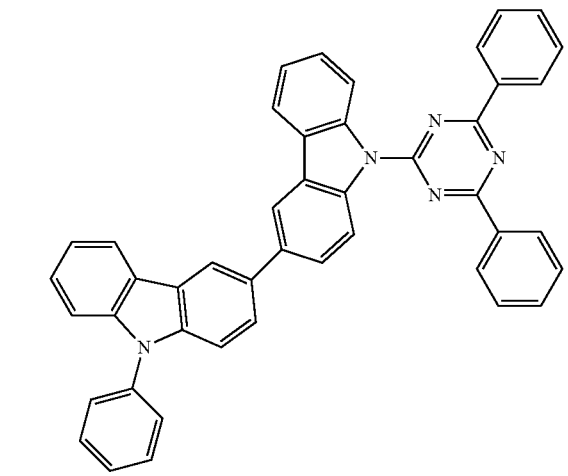
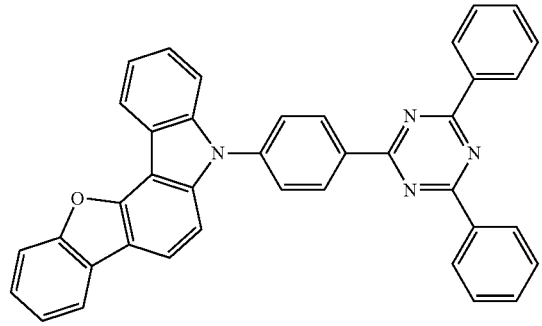
[Formula 11]
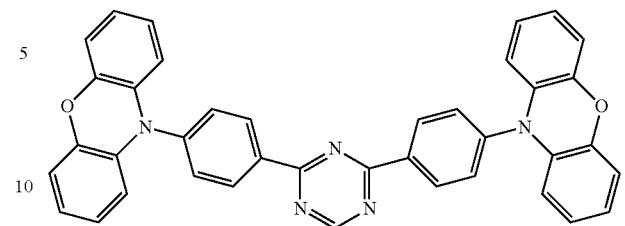
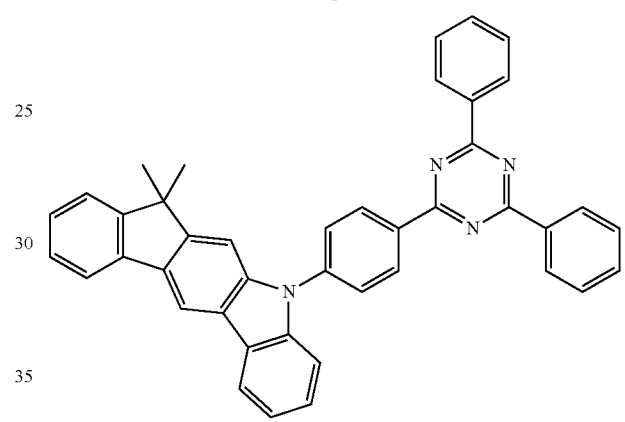
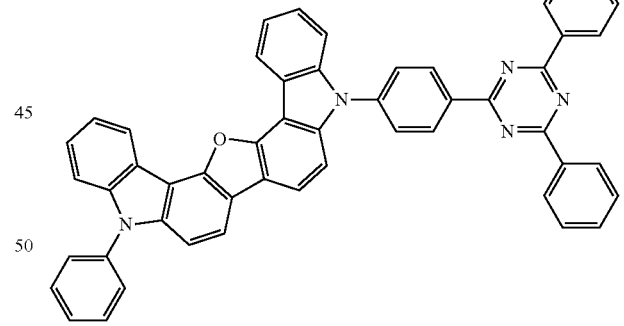
[Formula 12]
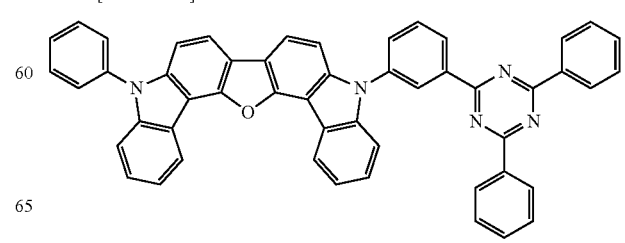

-continued

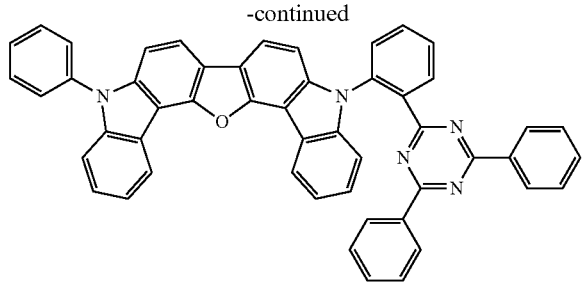

Method of Preparing First Compound

The first compound can be prepared by methods disclosed in International Publication Nos. WO2013/180241, WO2014/092083, WO2014/104346 and the like.

Delayed Fluorescence

Thermally activated delayed fluorescence is described in "Yuki Hando-tai no Debaisu Bussei (Device Physics of Organic Semiconductors)" edited by Chihaya Adachi, published by Kodansha Company Ltd, pages 261 to 268. This document describes that, when an energy gap $\Delta E_{13}$ between a singlet state and a triplet state of a fluorescent material can be decreased, in spite of a typical low transition probability, inverse energy transfer from the triplet state to the singlet state occurs at a high efficiency to express thermally stimulated delayed fluorescence (TADF). Further, a generating mechanism of delayed fluorescence is described in FIG. 10.38 in this document. The first compound in the exemplary embodiment is a compound emitting thermally activated delayed fluorescence to be generated by such a mechanism. Delayed fluorescence can be observed by measuring transient PL (Photo Luminescence).

Behavior of delayed fluorescence can also be analyzed based on the decay curve obtained by measuring the transient PL. The transient PL measurement is a method for measuring reduction behavior (transitional property) of PL emission obtained after irradiating pulse laser on a sample to excite the sample and stopping irradiating the pulse laser. PL emission using a TADF material is divided into an emission component from singlet excitons generated by the first PL excitation and an emission component from singlet excitons generated via triplet excitons. Lifetime of the singlet excitons initially generated in the PL excitation is very short at a nano-second order. Accordingly, the emission from the singlet excitons is rapidly reduced after pulse laser radiation.

On the other hand, since delayed fluorescence provides emission from singlet excitons generated through long-life triplet excitons, emission is gradually reduced. Thus, there is a large difference in time between the emission from the singlet excitons initially generated in the PL excitation and the emission from the singlet excitons derived from the triplet excitons. Accordingly, a luminous intensity derived from delayed fluorescence is obtainable.

Figure 2:
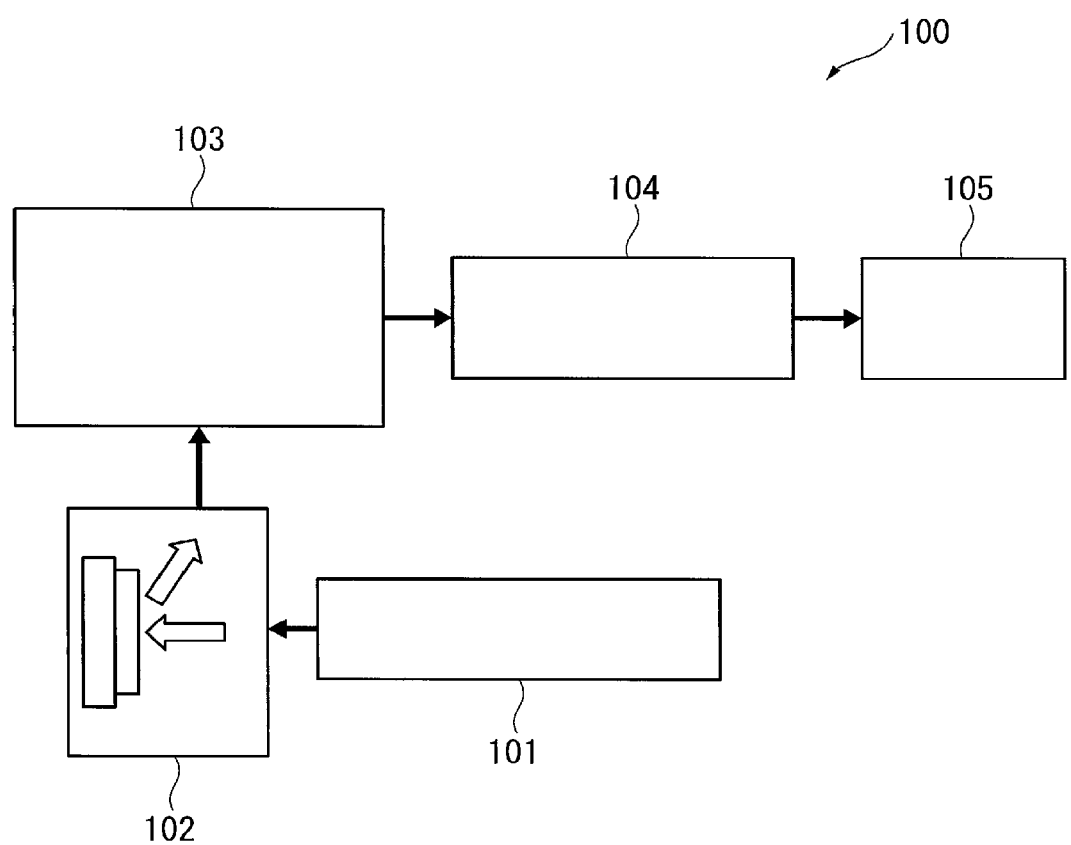
FIG. 2 is a schematic illustration of a measuring device of transient PL.

FIG. 2 is a schematic illustration of an exemplary device for measuring the transient PL.

In the exemplary embodiment, a transient PL measuring device 100 includes a pulse laser 101 configured to irradiate light having a predetermined wavelength, a sample chamber 102 configured to house a measurement sample, a spectrometer 103 configured to disperse the light irradiated from the measurement sample, a streak camera 104 configured to produce a two-dimensional image, and a personal computer 105 configured to import and analyze the two-dimensional image. A device usable for the measurement of the transient PL is not limited to the device described in the first exemplary embodiment.

The sample housed in the sample chamber 102 is obtained by forming a thin film, in which a doping material is doped to a matrix material at a concentration of 12 mass %, on the quartz substrate.

The thin film sample housed in the sample chamber 102 is irradiated with pulse laser from the pulse laser 101 to excite the doping material. Emission is extracted at 90 degrees angle relative to an irradiation direction of the excited light. The extracted emission is dispersed with the spectrometer 103 to form a two-dimensional image in the streak camera 104. As a result, the two-dimensional image expressed in coordinates of which ordinate axis indicates time and of which abscissa axis indicates a wavelength, in which a luminous point indicates a luminous intensity, can be obtained. If the two-dimensional image is cut out along a predetermined time axis, emission spectrum expressed in coordinates of which ordinate axis indicates a luminous intensity and of which abscissa axis indicates the wavelength can be obtained. If the two-dimensional image is cut out along a wavelength axis, a decay curve (transient PL) expressed in coordinates of which ordinate axis indicates a logarithm of the luminous intensity and of which abscissa axis indicates time can be obtained.

For instance, using a reference compound H1 below as the matrix material and a reference compound D1 as the doping material, a thin film sample A was prepared as described above and the transitional PL was measured.

[Formula 13]

(Reference Compound H1)

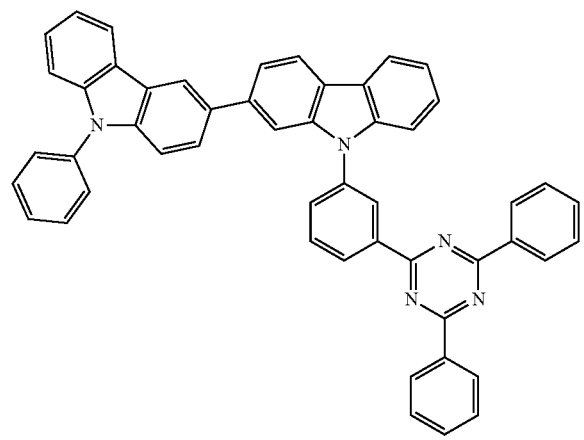

(Reference Compound D1)

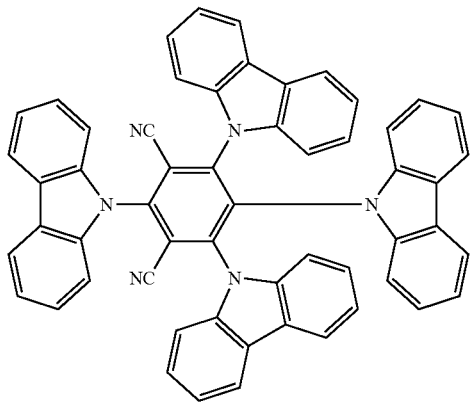

Herein, the decay curve was analyzed using the above-described thin film sample A and a thin film sample B. The thin film sample B was prepared as described above, using a reference compound H2 below as the matrix material and the reference compound D1 as the doping material.

Figure 3:
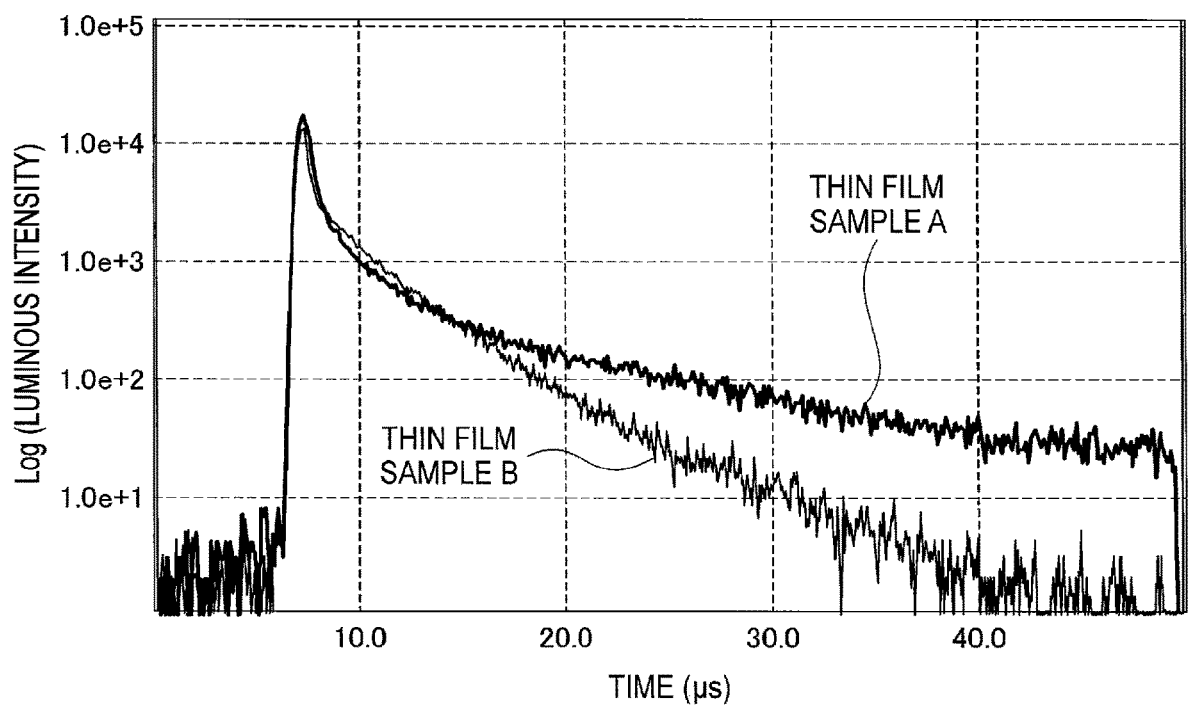
FIG. 3 shows an example of a decay curve of the transient PL.

FIG. 3 shows a decay curve obtained from the measured transitional PL of the thin film sample A and the thin film sample B.

[Formula 14]

(Reference Compound H2)

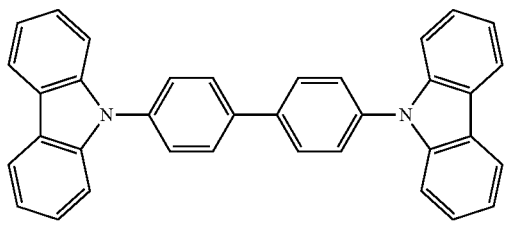

An emission decay curve expressed in coordinates of which ordinate axis indicates a luminous intensity and of which abscissa axis indicates time can be obtained by measuring the transient PL as described above. Based on the emission decay curve, a fluorescence intensity ratio between fluorescence in the single state generated by light excitation and the delayed fluorescence in the singlet state generated by the inverse energy transfer through the triplet state can be estimated. In the delayed fluorescence material, a ratio of the delayed fluorescence intensity to be gradually reduced is larger to some extent than a ratio of the fluorescence intensity to be rapidly reduced.

In the first exemplary embodiment, an amount of the delayed fluorescence can be calculated using the device of FIG. 2. In the first compound after excited with pulse light (light irradiated from the pulse laser) having a wavelength to be absorbed in the first compound, Prompt Emission that is immediately observed in the excited state and Delay Emission that is not observed immediately after the excitation but is later observed are present. In the first exemplary embodiment, an amount of Delay Emission is preferably 5% or more based on an amount of Prompt Emission.

The amount of Prompt Emission and the amount of Delay Emission can be obtained according to the method as a method described in "Nature 492, 234-238, 2012." The amount of Prompt emission and the amount of Delay emission may be calculated using a device different from one described in the above Reference Literature.

A sample usable for measuring delayed fluorescence is obtained, for instance, by co-depositing the first compound and a compound TH-2 described later on a quartz substrate so that a ratio of the first compound is 12 mass %, thereby forming a 100-nm-thick thin film.

[Formula 15]

TH-2

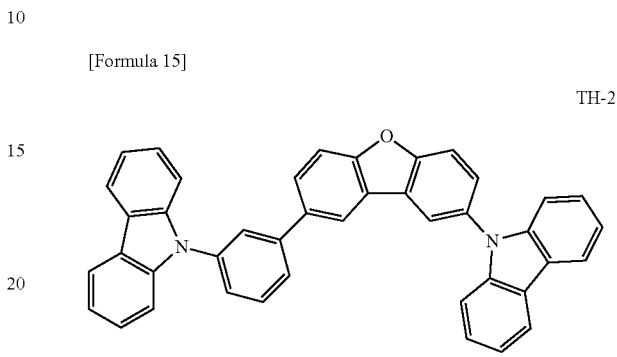

Second Compound

A second compound is represented by a formula (2) below.

[Formula 16]

(2)

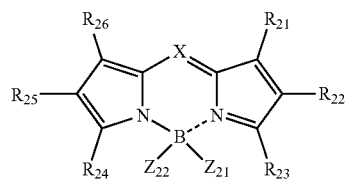

In the formula (2): X is a nitrogen atom or a carbon atom to be bonded to Y; Y is a hydrogen atom or a substituent; $R_{21}$ to $R_{26}$ are each independently a hydrogen atom or a substituent; when Y and $R_{21}$ to $R_{26}$ are substituents, the substituents are selected from the group consisting of a substituted or unsubstituted alkyl group, a substituted or unsubstituted cycloalkyl group, a substituted or unsubstituted aromatic hydrocarbon group, a substituted or unsubstituted alkoxy group, a substituted or unsubstituted alkylthio group, a substituted or unsubstituted aryloxy group, a substituted or unsubstituted arylthio group, a substituted or unsubstituted alkenyl group, a substituted or unsubstituted aralkyl group, a substituted or unsubstituted heterocyclic group, a halogen atom, a haloalkyl group, a carboxy group, an ester group, a carbamoyl group, an amino group, a nitro group, a cyano group, a silyl group, and a siloxanyl group; $Z_{21}$ and $Z_{22}$ are each independently selected from the group consisting of a halogen atom, a substituted or unsubstituted aromatic hydrocarbon group, a substituted or unsubstituted alkoxy group, and a substituted or un substituted aryloxy group.

Two or more of $R_{21}$ to $R_{26}$ in the formula (2) may be bonded to each other to form a cyclic structure. For instance, when $R_{25}$ and $R_{26}$ are mutually bonded to form a six-membered aromatic cyclic structure, the second compound is represented by a formula (21) below.

[Formula 17]

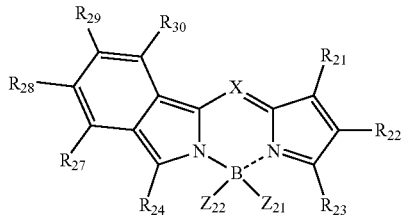

(21)

In the formula (21), X, Y, $R_{21}$ to $R_{24}$, $Z_{21}$ and $Z_{22}$ respectively represent the same as X, Y, $R_{21}$ to $R_{24}$, $Z_{21}$ and $Z_{22}$ in the formula (2); $R_{27}$ to $R_{30}$ are each independently a hydrogen atom or a substituent; and when $R_{27}$ to $R_{30}$ are substituents, the substituents are the same as the above-described examples of the substituents in $R_{21}$ to $R_{24}$.

At least one of $Z_{21}$ and $Z_{22}$ is preferably an alkoxy group substituted by a fluorine atom, an aryloxy group substituted by a fluorine atom, or an aryloxy group substituted by a fluoroalkyl group.

At least one of $Z_{21}$ and $Z_{22}$ is also preferably a fluorine atom. Both of $Z_{21}$ and $Z_{22}$ are more preferably fluorine atoms.

At least one of $Z_{21}$ and $Z_{22}$ is also preferably represented by a formula (2a) below.

[Formula 18]

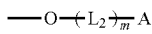

(2a)

In the formula (2a): A is a substituted or unsubstituted alkyl group having 1 to 6 carbon atoms or a substituted or unsubstituted aryl group having 6 to 12 ring carbon atoms; $L_2$ is a substituted or unsubstituted alkylene group having 1 to 6 carbon atoms or a substituted or unsubstituted arylene group having 6 to 12 ring carbon atoms; m is an integer of 0 to 7; and a plurality of $L_2$ may be mutually the same or different. m is preferably an integer of 0 to 2. When m is 0, A is directly bonded to an oxygen atom (O).

When $Z_{21}$ and $Z_{22}$ in the formula (2) are represented by the formula (2a), the second compound is represented by a formula (20) below.

[Formula 19]

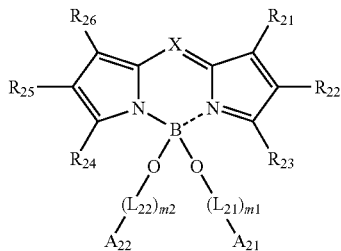

(20)

In the formula (20), X, Y and $R_{21}$ to $R_{26}$ respectively represent the same as X, Y and $R_{21}$ to $R_{26}$ in the formula (2). $A_{21}$ and $A_{22}$ represent the same as A in the formula (2a) and may be mutually the same or different. $L_{21}$ and $L_{22}$ represent the same as $L_2$ in the formula (2a) and may be mutually the same or different. m1 and m2 are each independently an integer of 0 to 7, preferably an integer of 0 to 2. A plurality of $L_{21}$ may be mutually the same or different and a plurality of $L_{22}$ may be mutually the same or different. When m1 is 0, $A_{21}$ is directly bonded to an oxygen atom (O). When m2 is 0, $A_{22}$ is directly bonded to an oxygen atom (O).

At least one of A and $L_2$ in the formula (2a) is preferably substituted by a halogen atom, more preferably substituted by a fluorine atom.

A in the formula (2a) is more preferably a perfluoroalkyl group having 1 to 6 carbon atoms or a perfluoroaryl group having 6 to 12 ring carbon atoms, further preferably a perfluoroalkyl group having 1 to 6 carbon atoms.

$L_2$ in the formula (2a) is more preferably a perfluoroalkylene group having 1 to 6 carbon atoms or a perfluoroarylene group having 6 to 12 ring carbon atoms, further preferably a perfluoroalkylene group having 1 to 6 carbon atoms.

In the formulae (2), (20) and (21), it is preferable that X is a carbon atom and Y is a hydrogen atom or a substituent selected from the group consisting of a substituted or unsubstituted alkyl group and a substituted or unsubstituted aryl group having 6 to 30 ring carbon atoms, and it is more preferable that Y is a substituted or unsubstituted aryl group having 6 to 30 ring carbon atoms.

The second compound may have the cyclic structure formed by bonding $Z_{21}$ to $Z_{22}$. However, it is preferable that the second compound does not have the cyclic structure formed by bonding $Z_{21}$ to $Z_{22}$.

In the formulae (2) and (20), at least one of $R_{21}$, $R_{23}$, $R_{24}$ and $R_{26}$ is preferably a substituted or unsubstituted alkyl group having 1 to 30 carbon atoms.

In the formulae (2) and (20), $R_{21}$, $R_{23}$, $R_{24}$ and $R_{26}$ are more preferably substituted or unsubstituted alkyl groups having 1 to 30 carbon atoms. In this arrangement, $R_{22}$ and $R_{25}$ are preferably hydrogen atoms.

In the formula (21), at least one of $R_{21}$, $R_{23}$ and $R_{24}$ is preferably a substituted or unsubstituted alkyl group having 1 to 30 carbon atoms.

In the formula (21), $R_{21}$, $R_{23}$ and $R_{24}$ are more preferably substituted or unsubstituted alkyl groups having 1 to 30 carbon atoms. In this arrangement, $R_{22}$ is preferably a hydrogen atom.

In the formulae (2) and (20), at least one of $R_{21}$, $R_{23}$, $R_{24}$ and $R_{26}$ is preferably a substituted or unsubstituted aryl group having 6 to 30 ring carbon atoms.

In the formulae (2) and (20), $R_{21}$, $R_{23}$, $R_{24}$ and $R_{26}$ are more preferably substituted or unsubstituted aryl groups having 6 to 30 ring carbon atoms. In this arrangement, $R_{22}$ and $R_{25}$ are preferably hydrogen atoms.

In the formula (21), at least one of $R_{21}$, $R_{23}$ and $R_{24}$ is preferably a substituted or unsubstituted aryl group having 6 to 30 ring carbon atoms.

In the formula (21), $R_{21}$, $R_{23}$ and $R_{24}$ are more preferably substituted or unsubstituted aryl groups having 6 to 30 ring carbon atoms. In this arrangement, $R_{22}$ is preferably a hydrogen atom.

When Y and $R_{21}$ to $R_{30}$ are substituents, the substituents each are preferably selected from the group consisting of a substituted or unsubstituted alkyl group having 1 to 30 carbon atoms, a substituted or unsubstituted cycloalkyl group having 3 to 30 carbon atoms, a substituted or unsubstituted aryl group having 6 to 30 ring carbon atoms, a substituted or unsubstituted alkoxy group having 1 to 30 carbon atoms, a substituted or unsubstituted alkylthio group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 6 to 30 ring carbon atoms, a substituted or unsubstituted heteroaryl group having 5 to 30 ring atoms, halogen atom, haloalkyl group, carboxy group, ester group, carbamoyl group, amino group, nitro group, cyano group, silyl group and siloxanyl group, more preferably selected from the group consisting of a substituted or unsubstituted alkyl group having 1 to 30 carbon atoms, a substituted or unsubstituted cycloalkyl group having 3 to 30 carbon atoms, a substituted or unsubstituted aryl group having 6 to 30 ring carbon atoms, a substituted or unsubstituted alkoxy group having 1 to 30 carbon atoms, a substituted or unsubstituted aryloxy group 6 to 30 ring carbon atoms, a substituted or unsubstituted heteroaryl group having 5 to 30 ring atoms, halogen atom and haloalkyl group.

$Z_{21}$ and $Z_{22}$ are preferably each independently selected from the group consisting of a halogen atom, a substituted or unsubstituted aryl group having 6 to 30 ring carbon atoms, a substituted or unsubstituted alkoxy group having 1 to 30 carbon atoms, and a substituted or unsubstituted aryloxy group having 6 to 30 ring carbon atoms.

Examples of the alkoxy group substituted by a fluorine atom include 2,2,2-trifluoroethoxy group, 2,2-difluoroethoxy group, 2,2,3,3,3-pentafluoro-1-propoxy group, 2,2,3,3-tetrafluoro-1-propoxy group, 1,1,1,3,3,3-hexafluoro-2-propoxy group, 2,2,3,3,4,4,4-heptafluoro-1-butyl oxy group, 2,2,3,3,4,4-hexafluoro-1-butyl oxy group, nonafluoro tertiary butyloxy group, 2,2,3,3,4,4,5,5,5-nonafluoropentanoxy group, 2,2,3,3,4,4,5,5,6,6,6-undecafluorohexanoxy group, 2,3-bis(trifluoromethyl)-2,3-butane dioxy group, 1,1,2,2-tetra(trifluoromethyl)ethylene glycoxy group, 4,4,5,5,6,6,6-heptafluorohexane-1,2-dioxy group, and 4,4,5,5,6,6,7,7,8,8,9,9,9-tridecafluorononane-1,2-dioxy group.

Examples of the aryloxy group substituted by a fluorine atom or the aryloxy group substituted by a fluoroalkyl group include a pentafluorophenoxy group, 3,4,5-trifluorophenoxy group, 4-trifluoromethylphenoxy group, 3,5-bistrifluoromethylphenoxy group, 3-fluoro-4-trifluoromethylphenoxy group, 2,3,5,6-tetrafluoro-4-trifluoromethylphenoxy group, 4-fluorocatecholato group, 4-trifluoromethylcatecholato group, and 3,5-bistrifluoromethylcatecholato group.

The second compound is preferably a fluorescent compound exhibiting an emission peak in a wavelength range from 500 nm to 550 nm. Use of the fluorescent second compound and the first compound in the emitting layer improves the performance of the organic EL device. The wavelength showing the emission peak means a peak wavelength of luminescence spectrum exhibiting a maximum luminous intensity among luminous spectra measured in a toluene solution in which a measurement target compound is dissolved at a concentration from $10^{-6}$ mol/l to $10^{-5}$ mol/l.

Specific examples of the second compound of the exemplary embodiment are shown below. It should be noted that the second compound according to the invention is not limited to these specific examples.

[Formula 20]

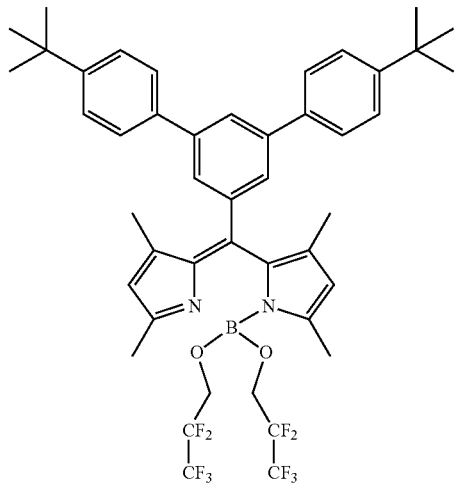

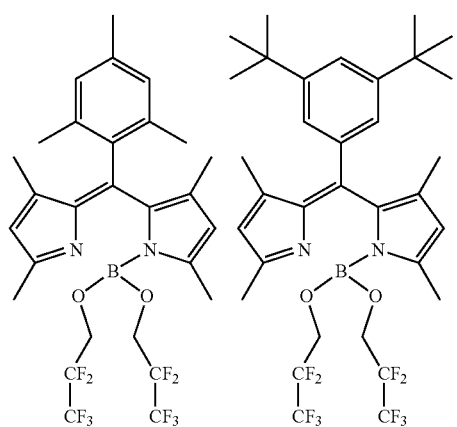

[Formula 21]

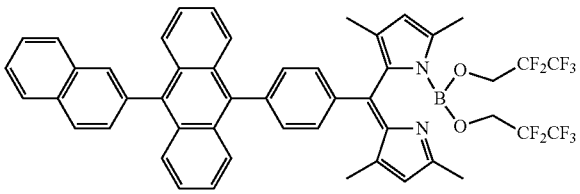

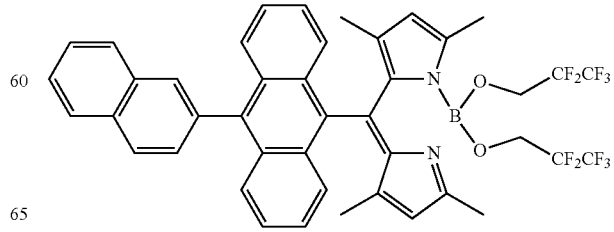

[Formula 22]
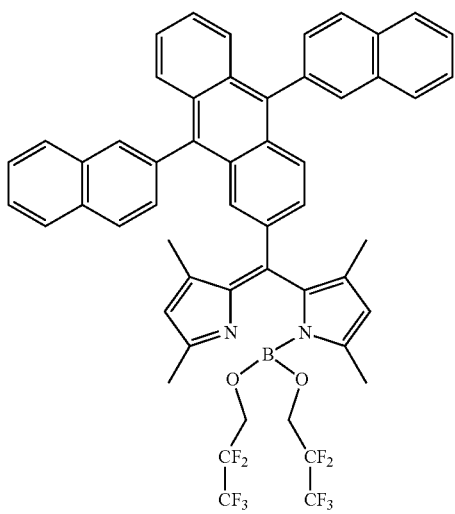
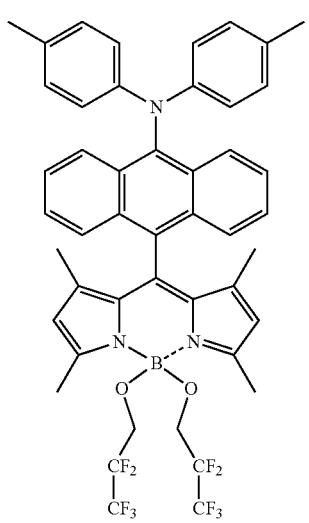
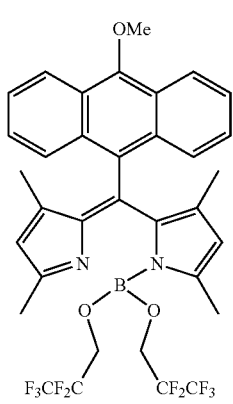
[Formula 23]
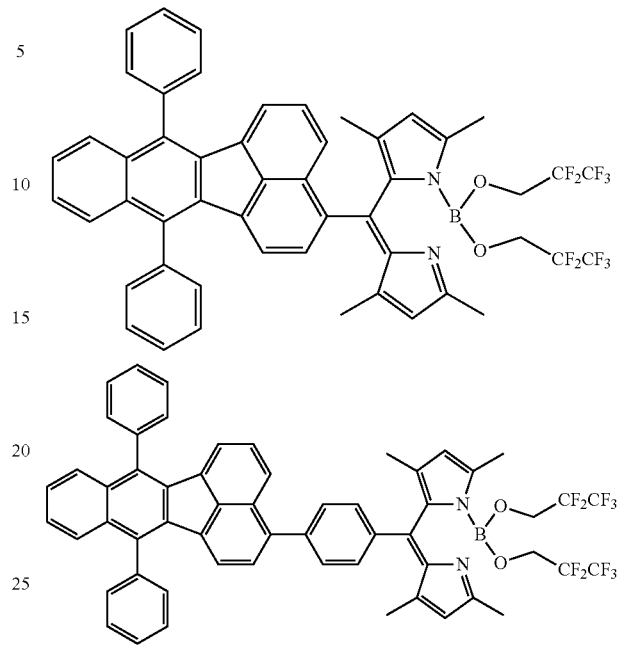
[Formula 24]
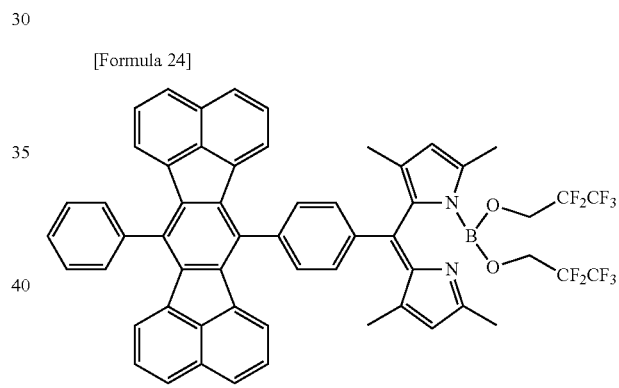
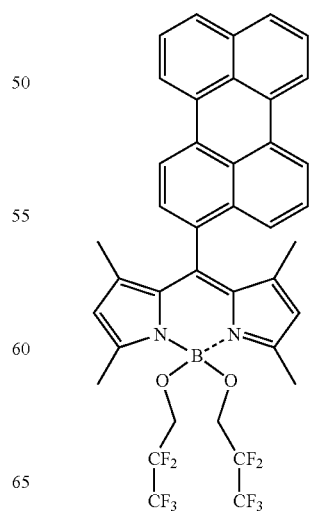

23
-continued
24
-continued
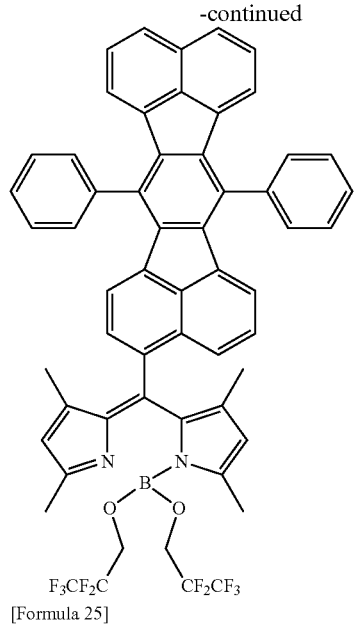
[Formula 25]
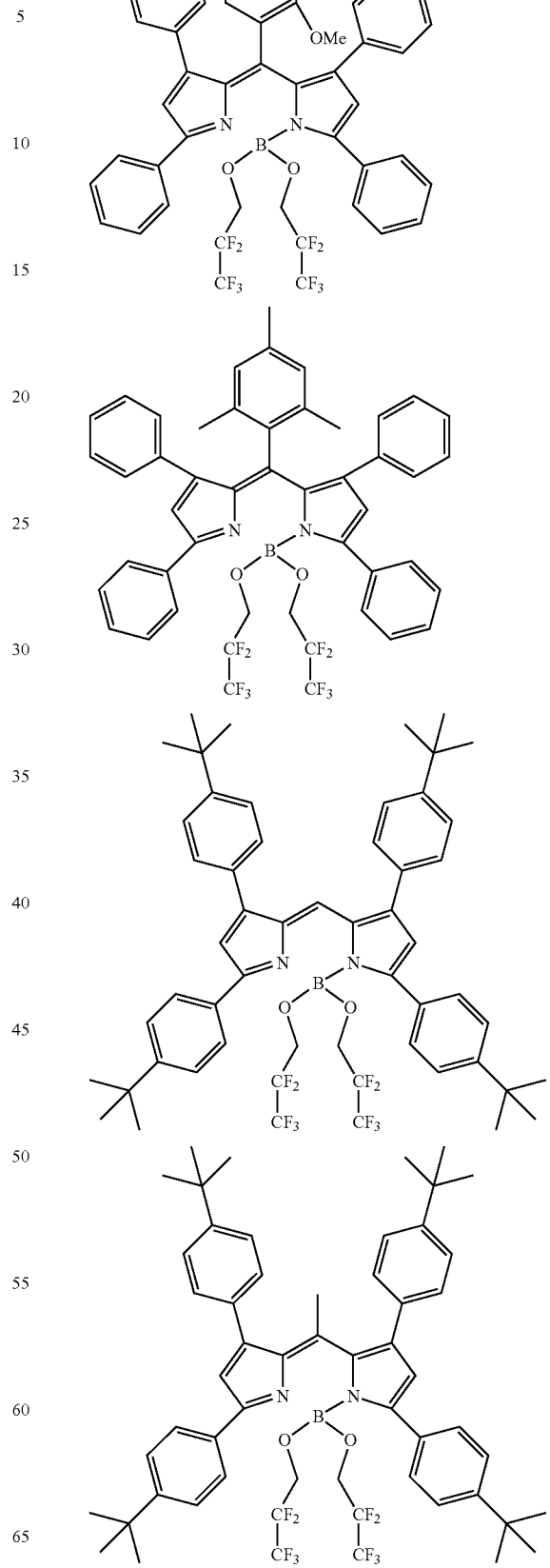

25
-continued
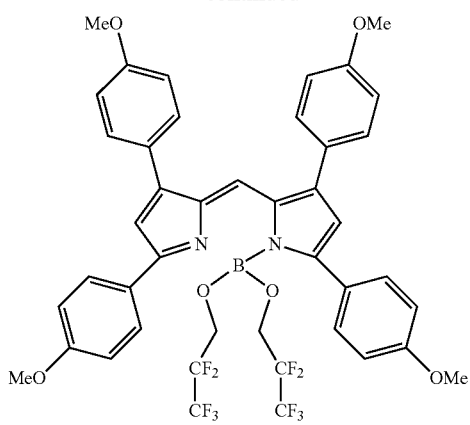
[Formula 26]
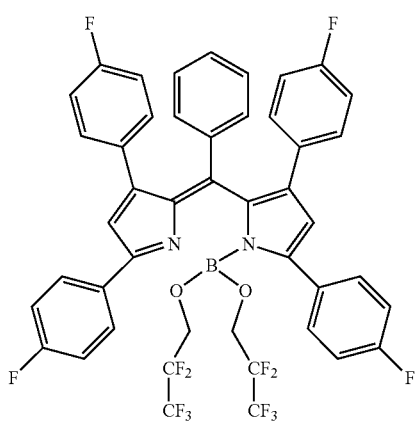
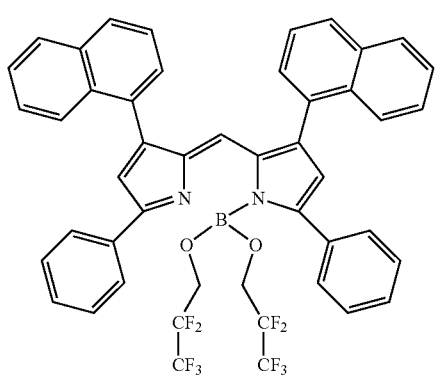
26
-continued
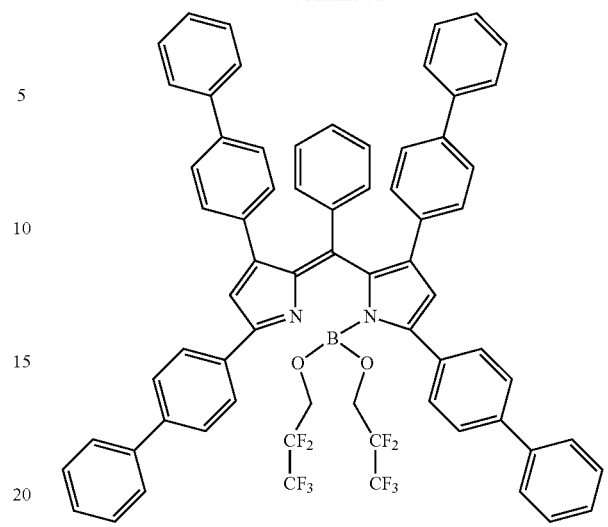
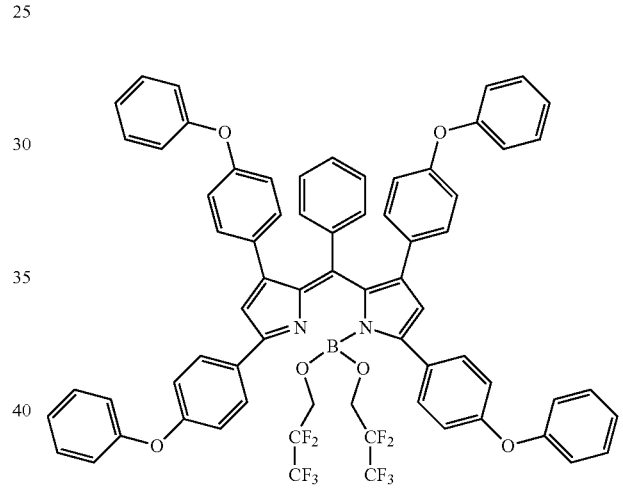
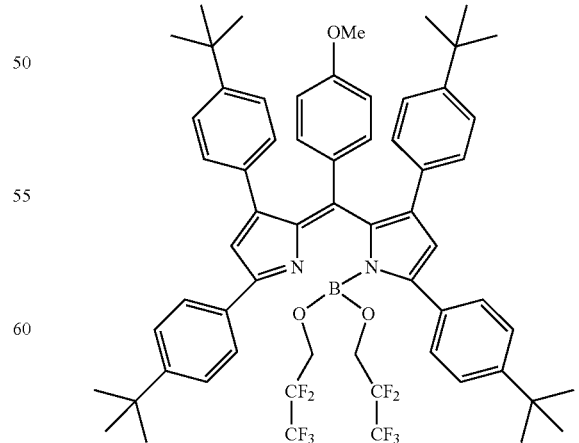

-continued
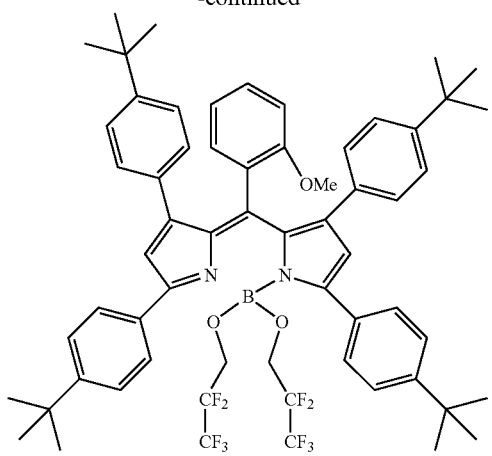
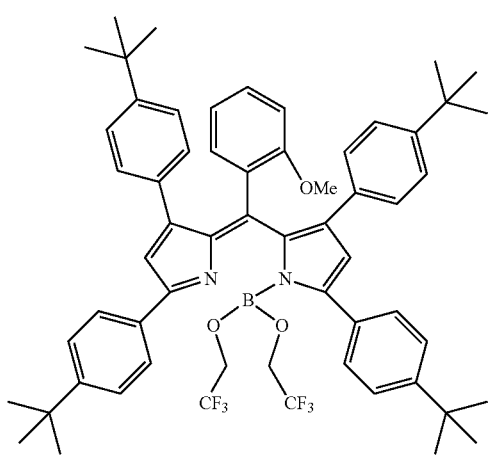
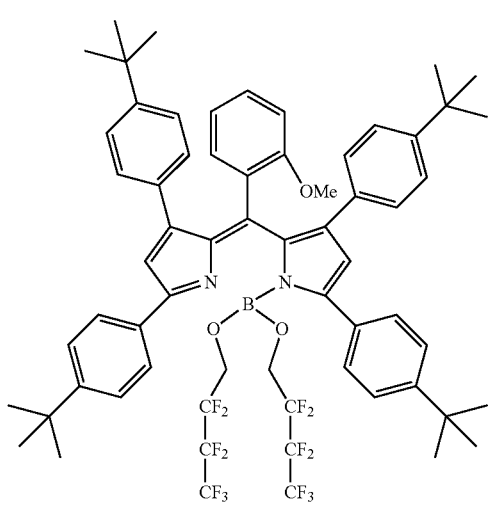
-continued
[Formula 27]
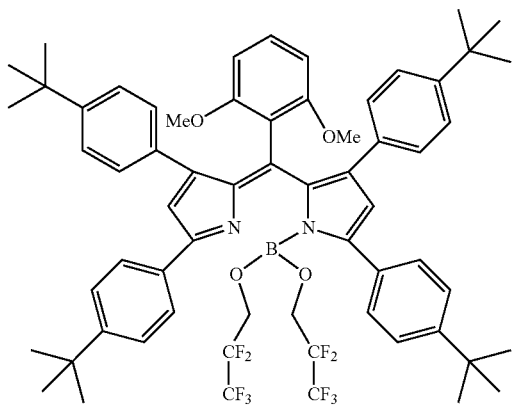
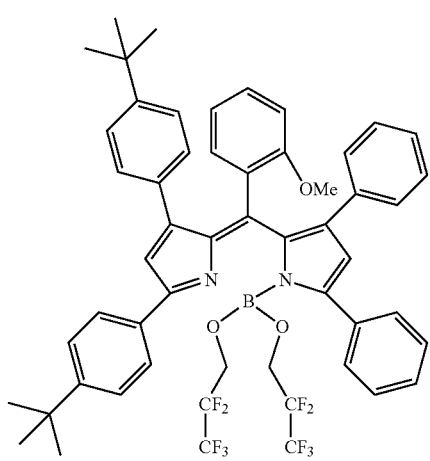
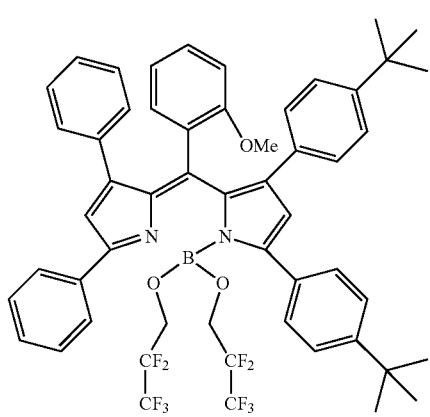

29
-continued
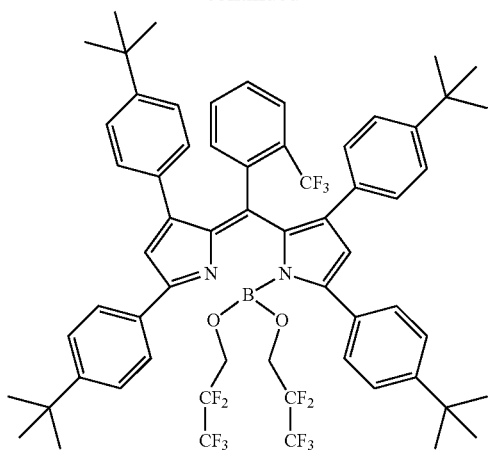
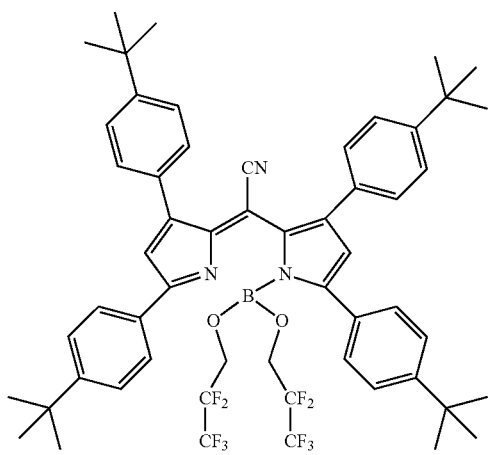
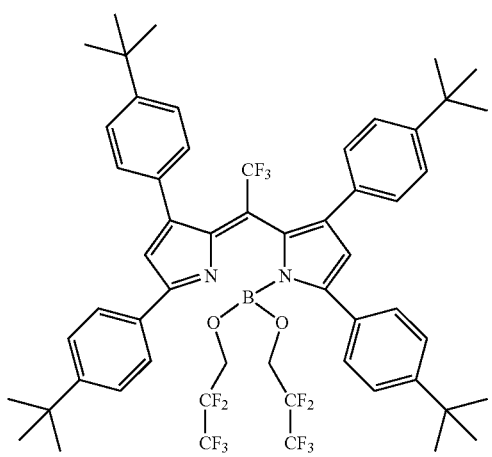
30
-continued
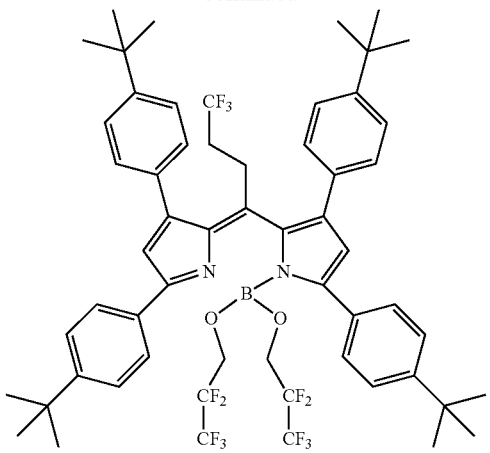
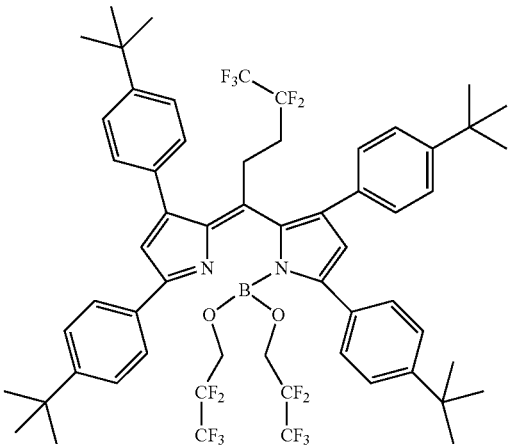
[Formula 28]
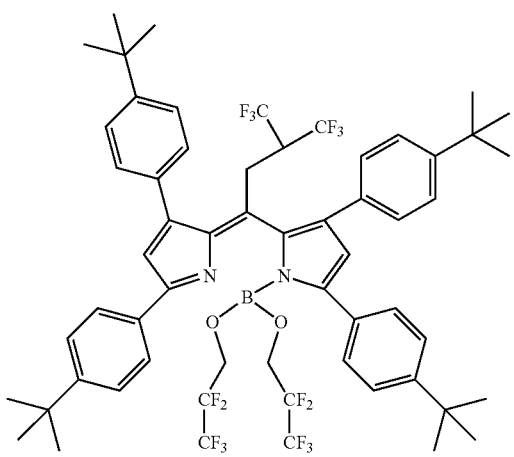

31
-continued
32
-continued
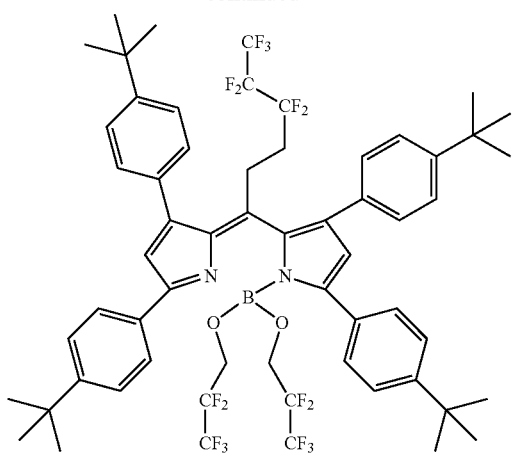
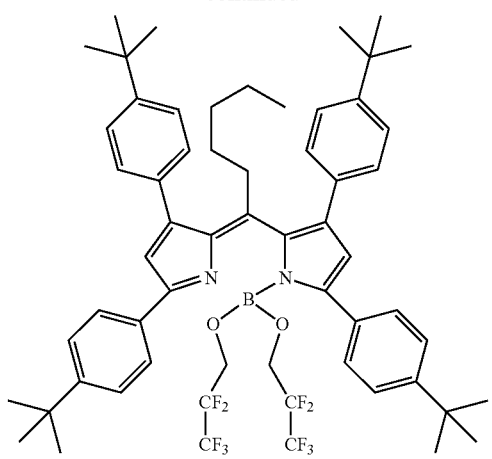
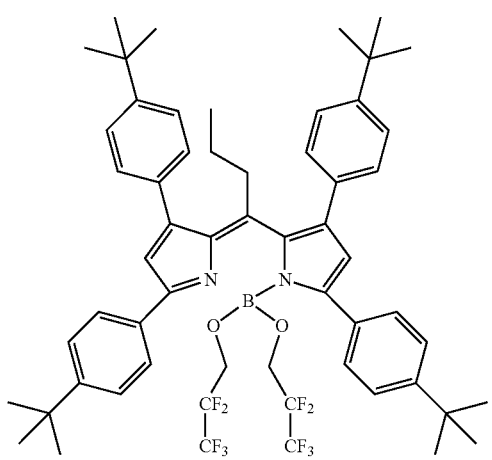
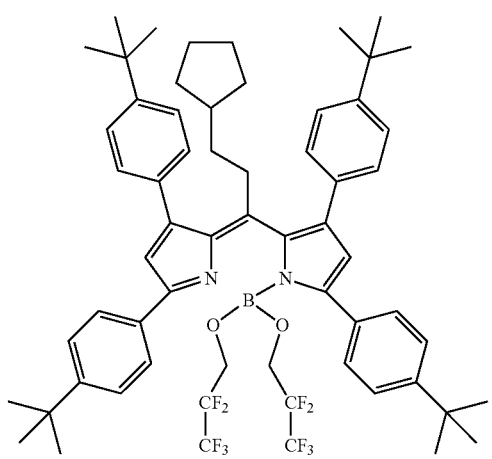
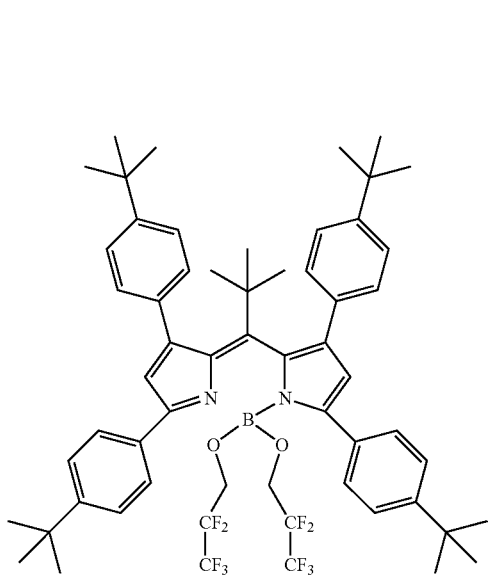
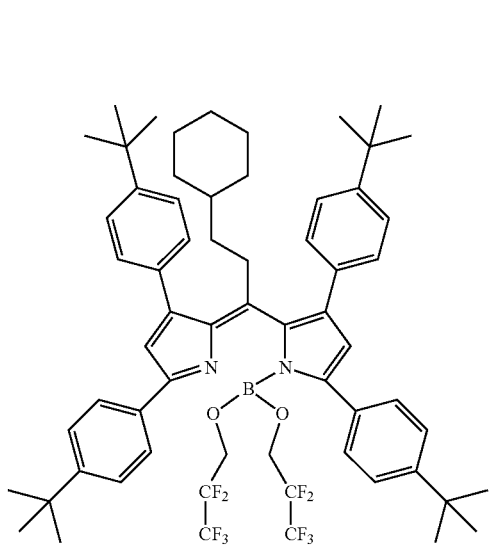

[Formula 29]
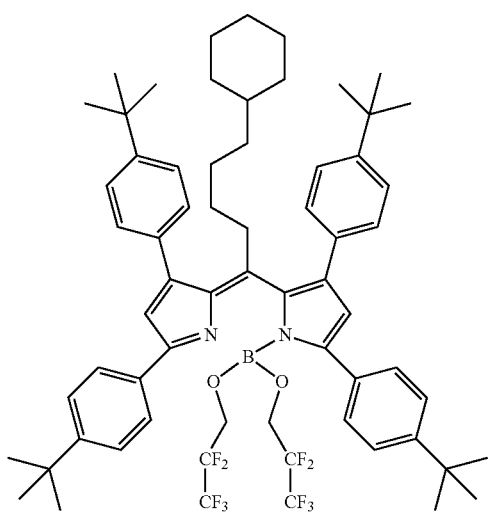
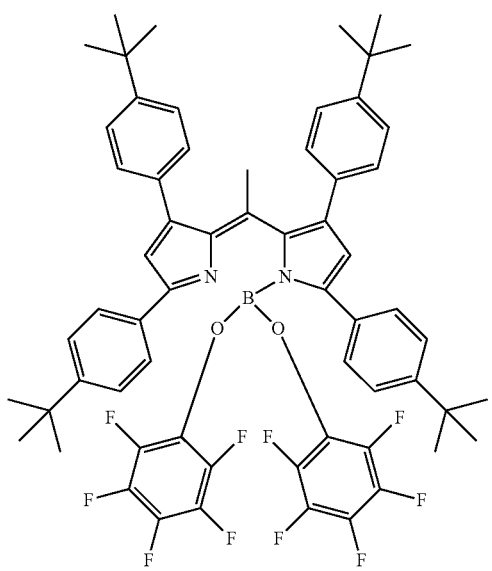
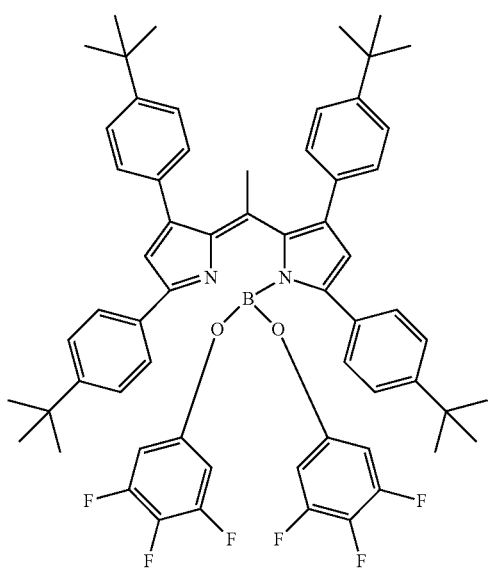
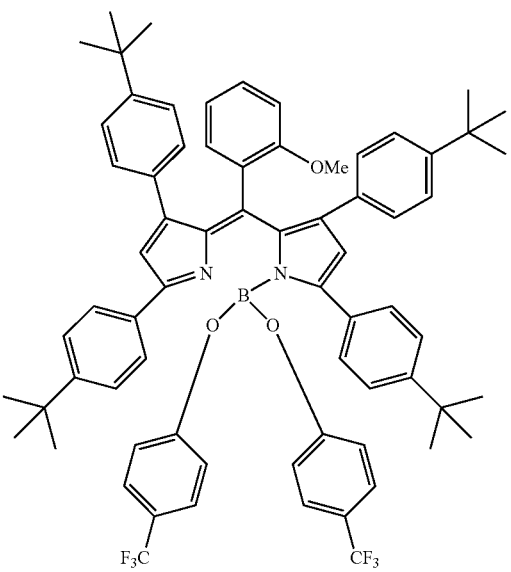
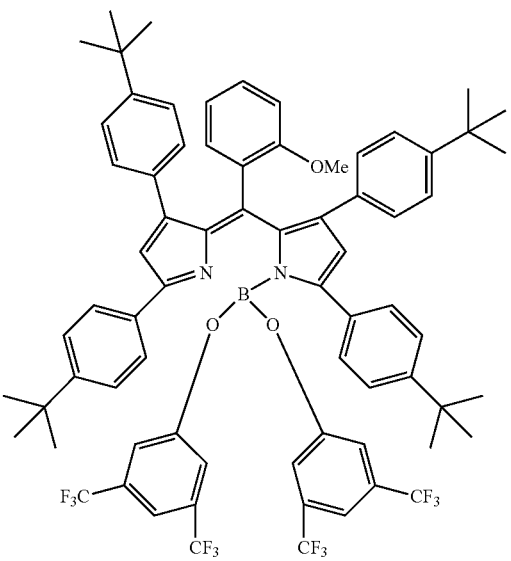
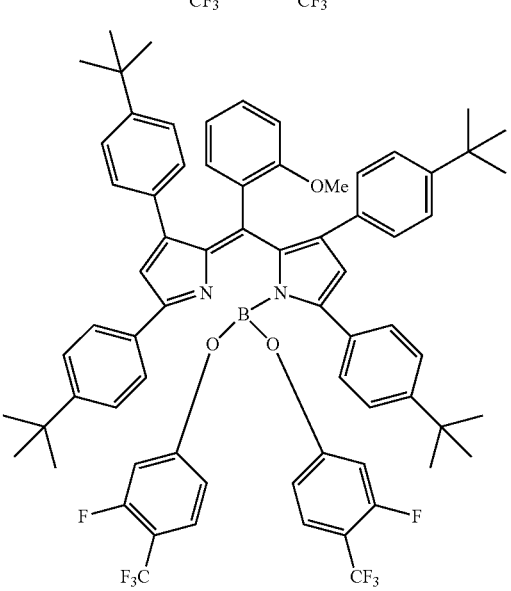

[Formula 30]
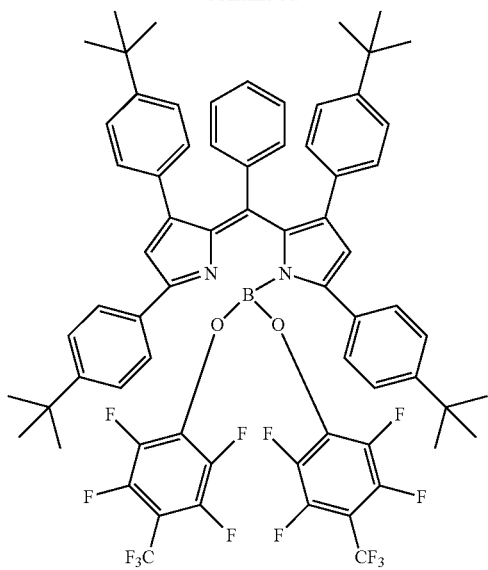
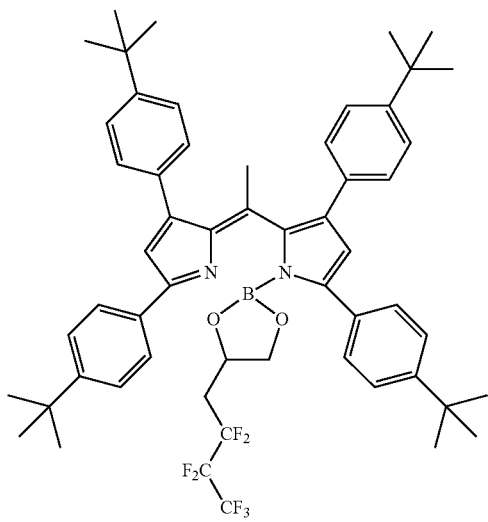
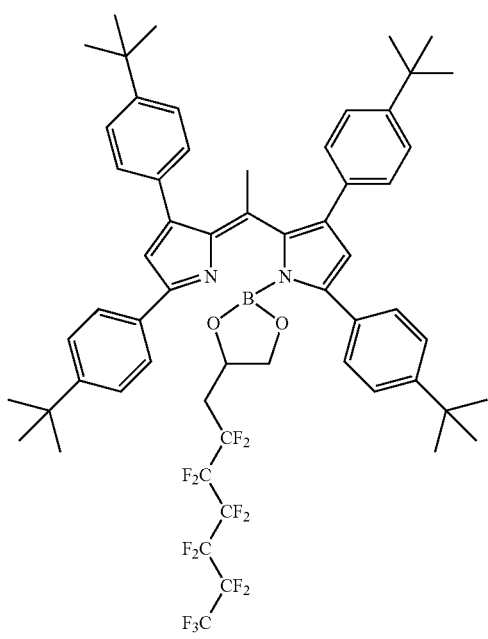
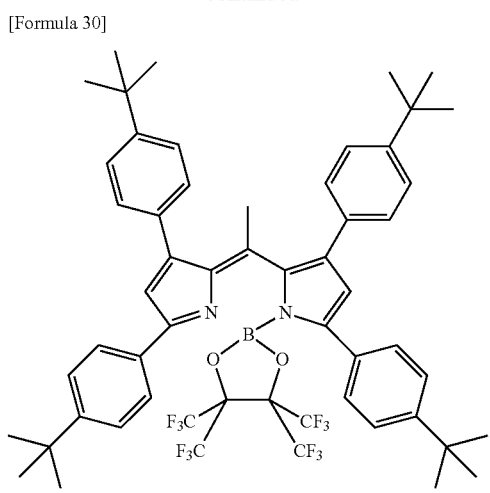
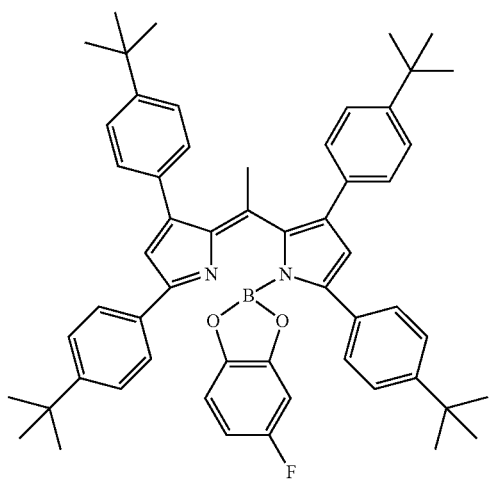
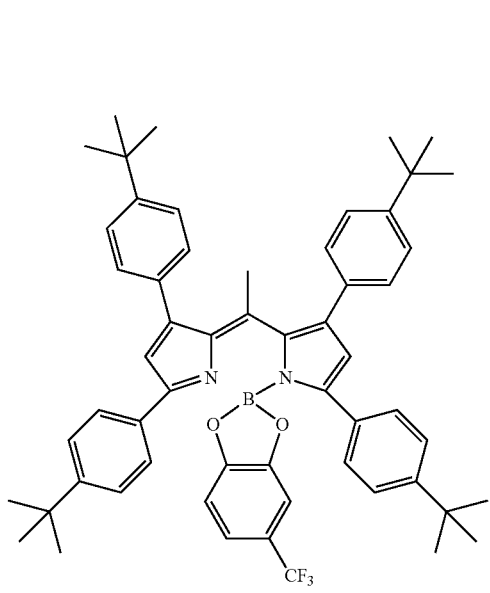

37
-continued
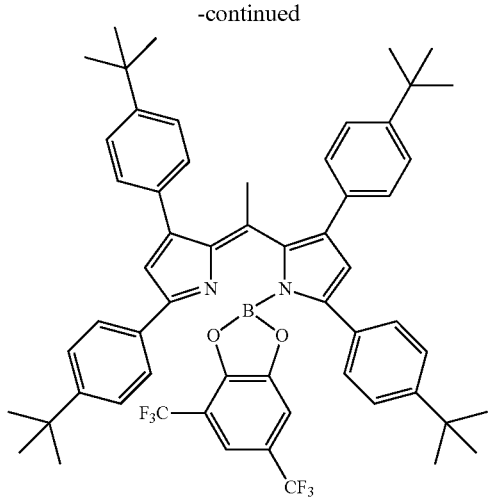
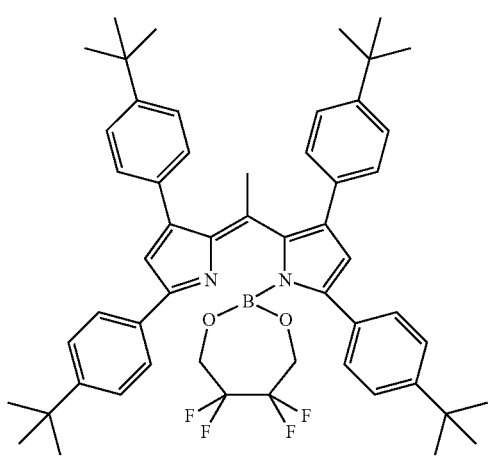
38
-continued
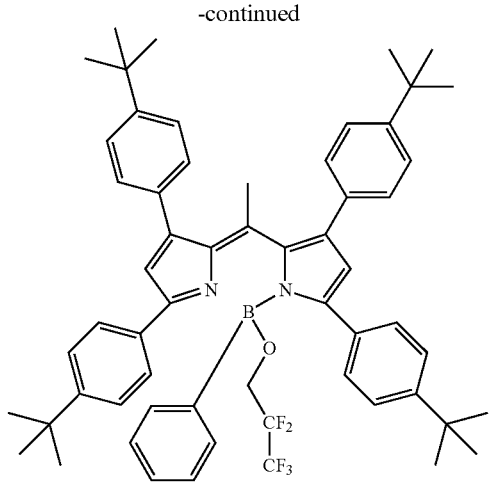
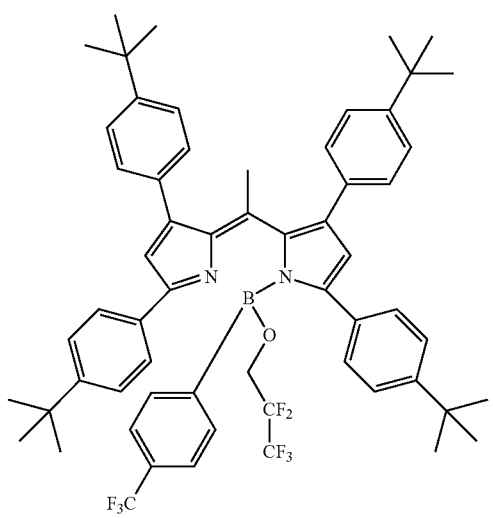
[Formula 31]
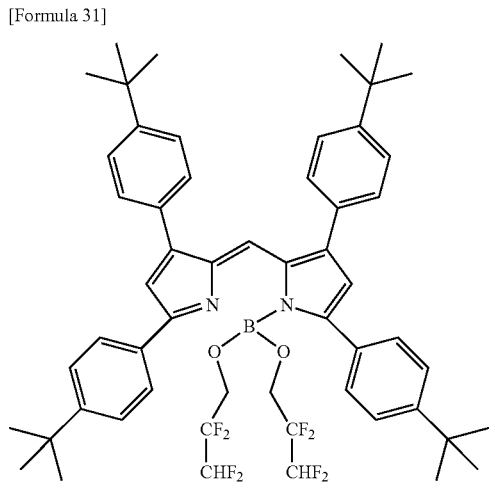

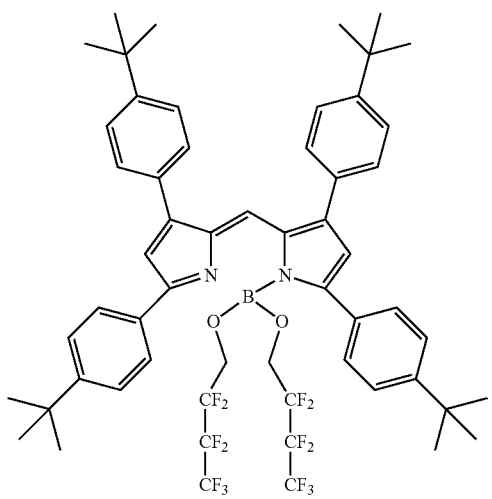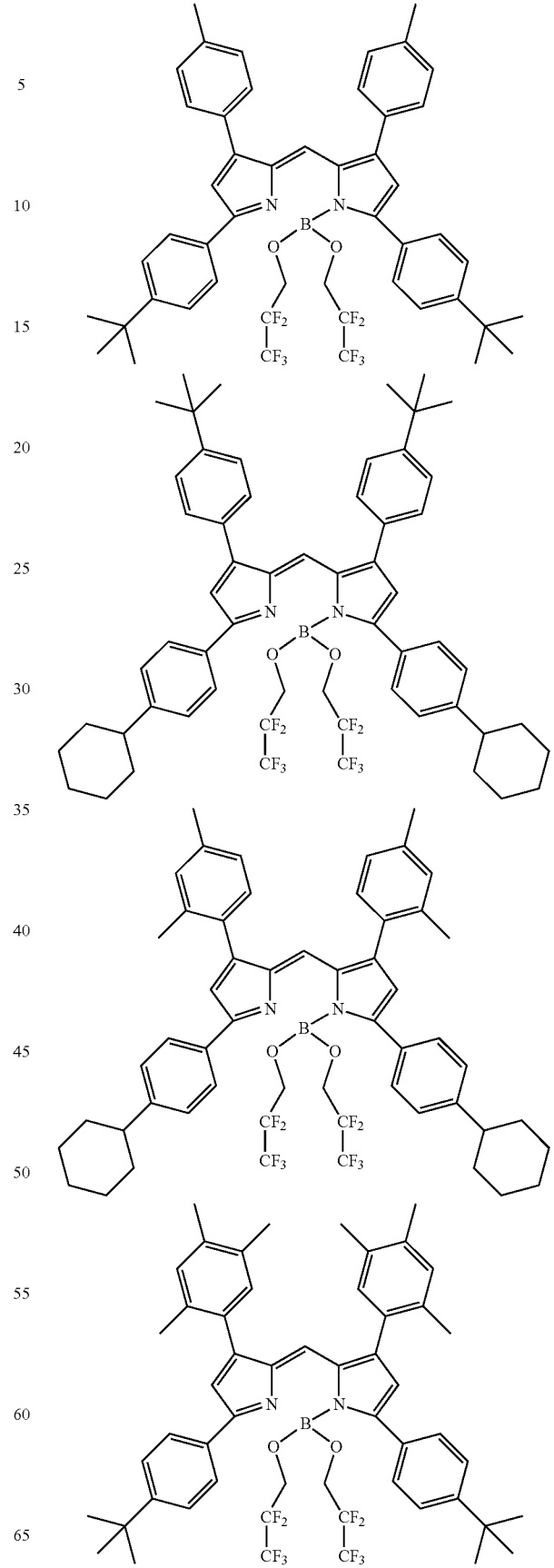

-continued
[Formula 32]
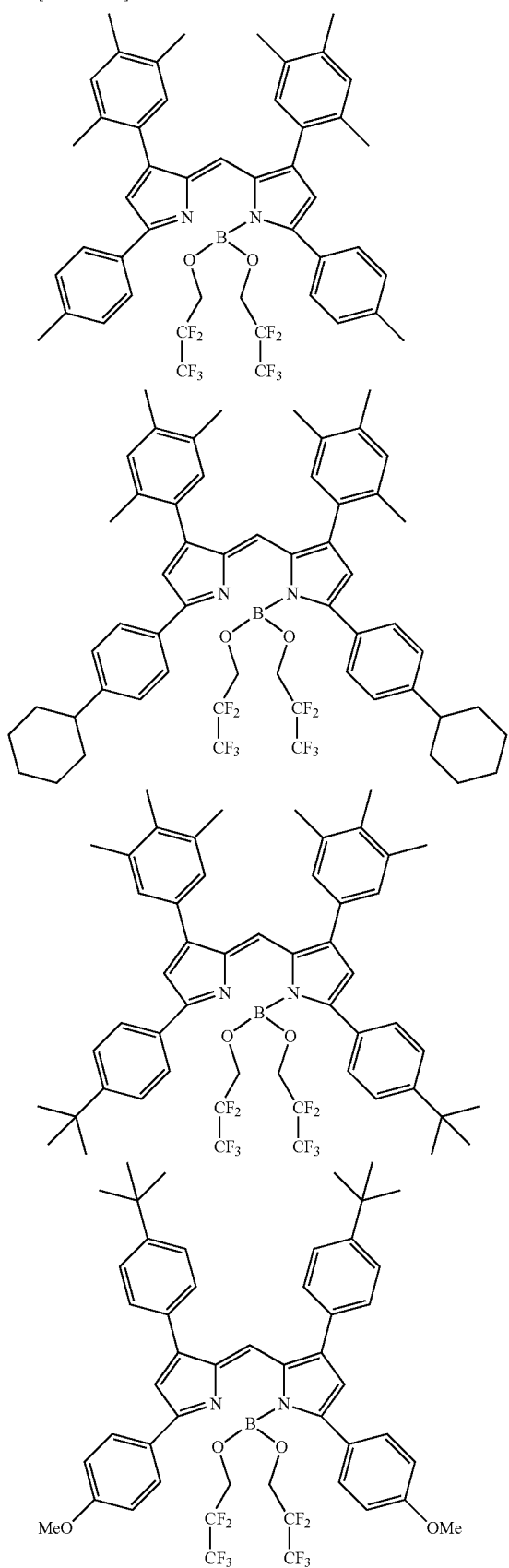
-continued
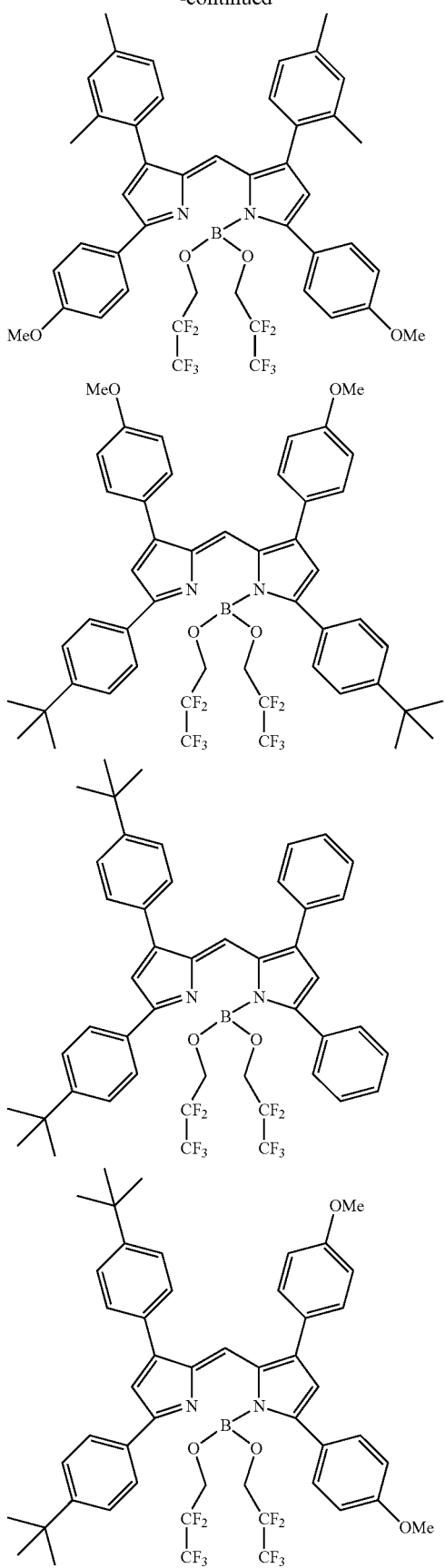

[Formula 33]
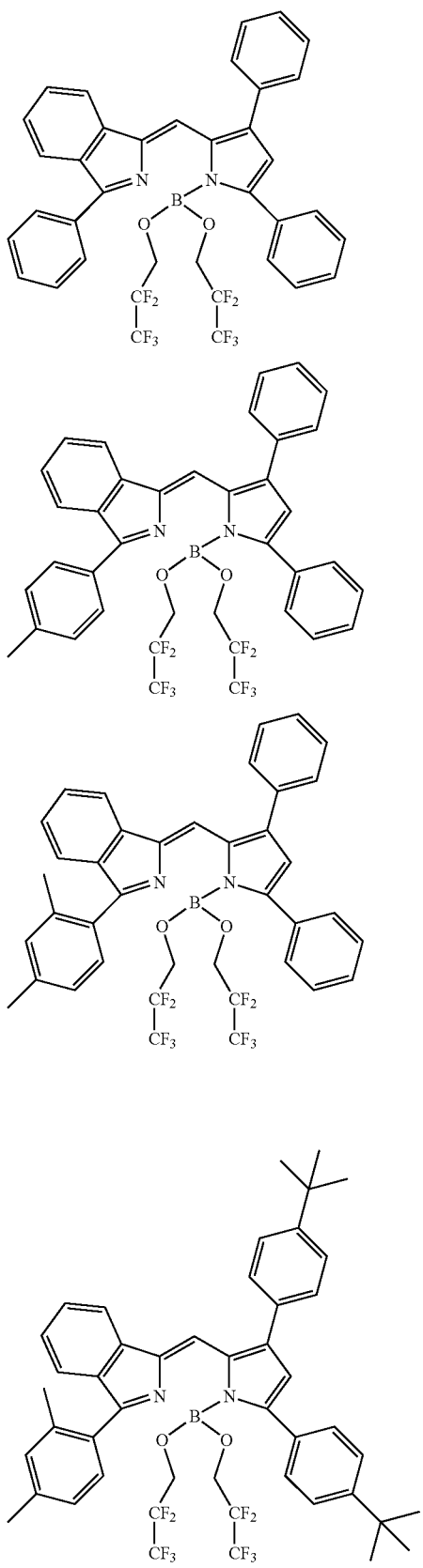
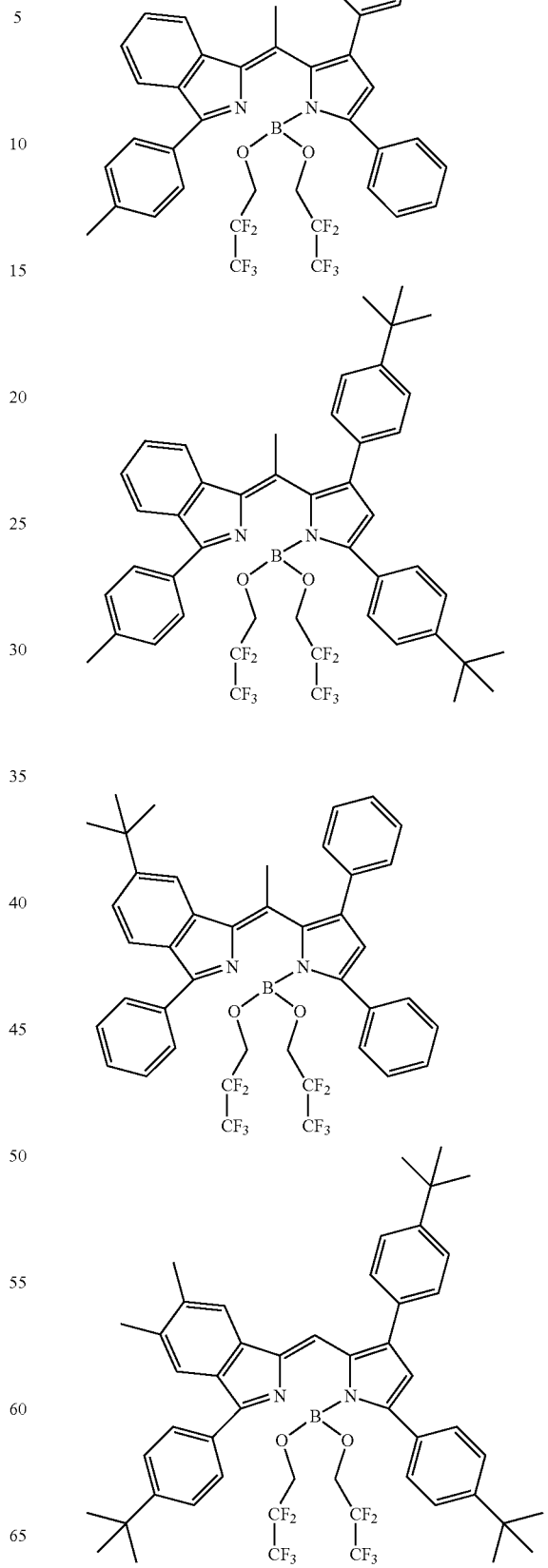

[Formula 34]
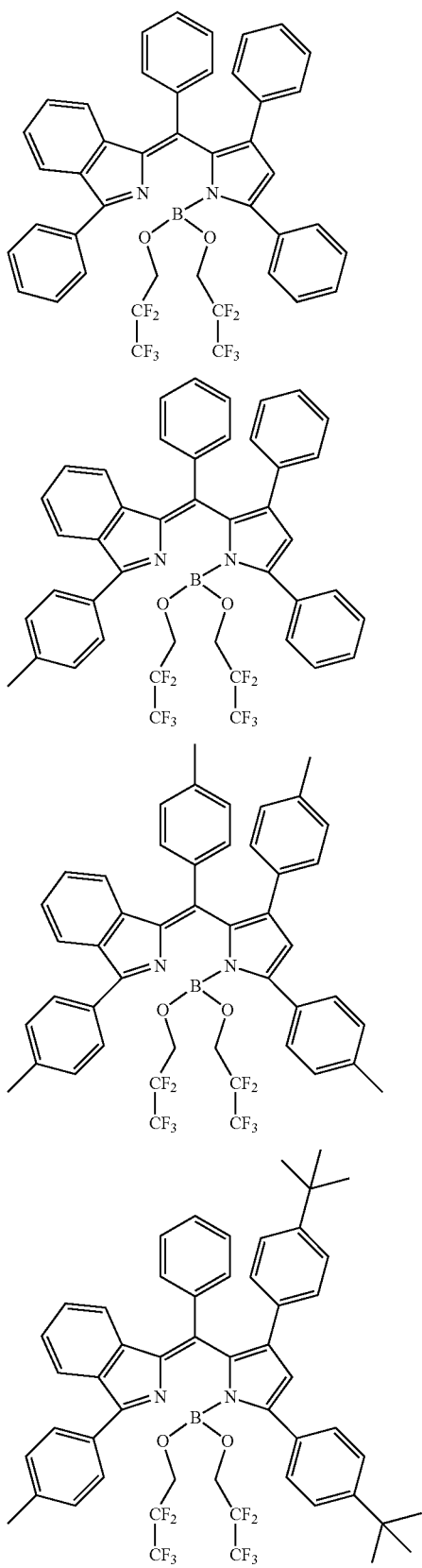
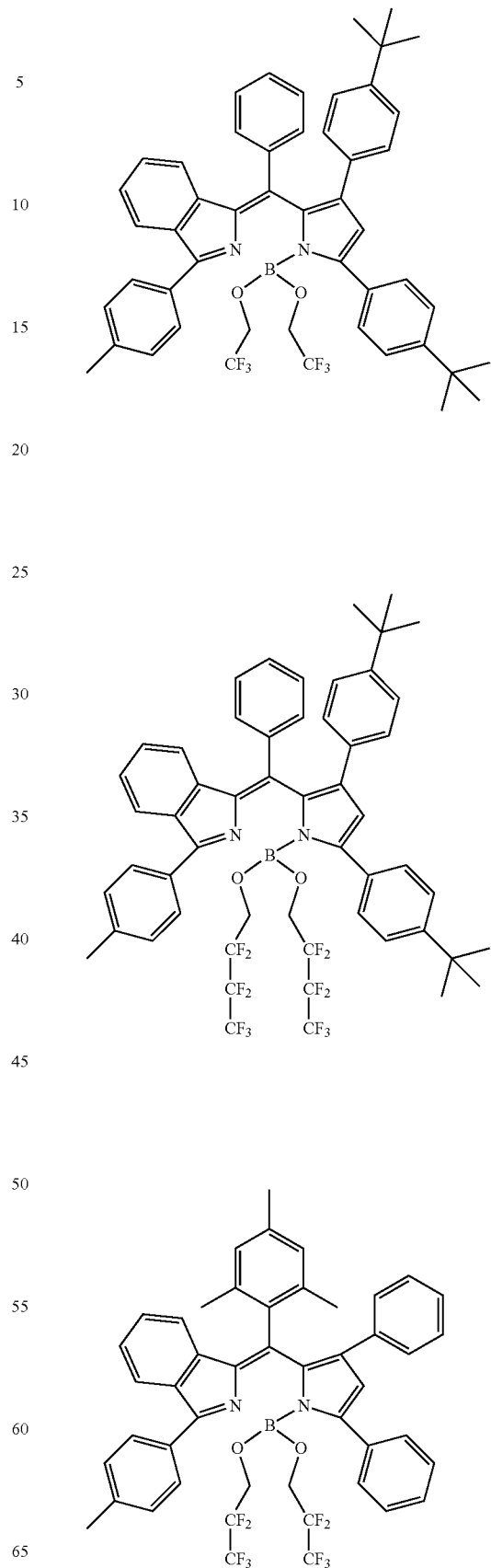

47
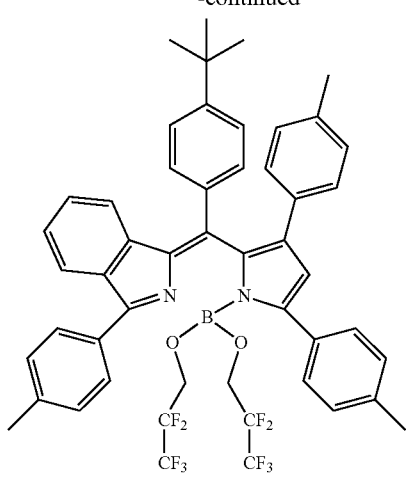
[Formula 35]
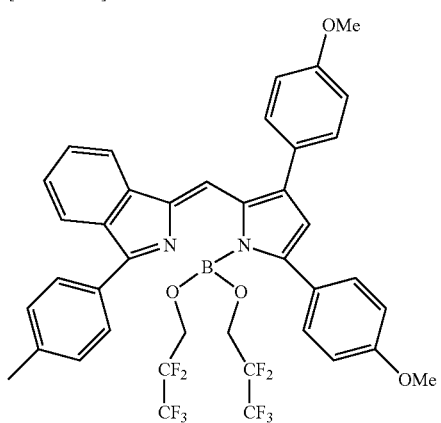
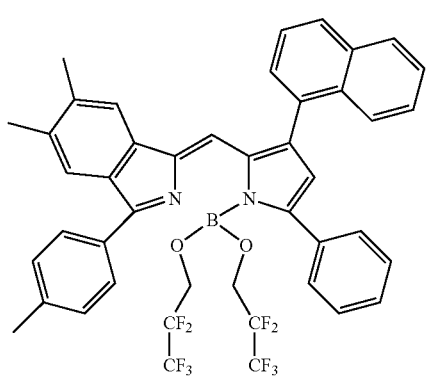
48
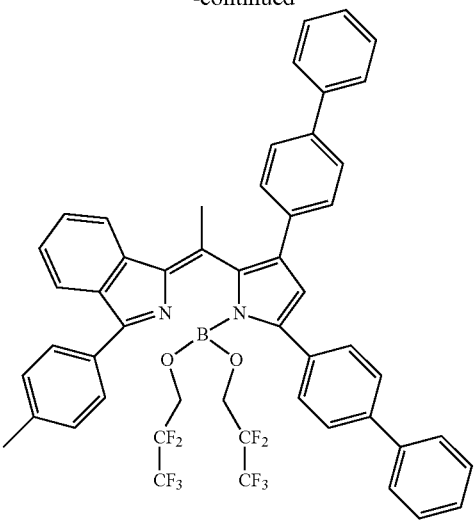
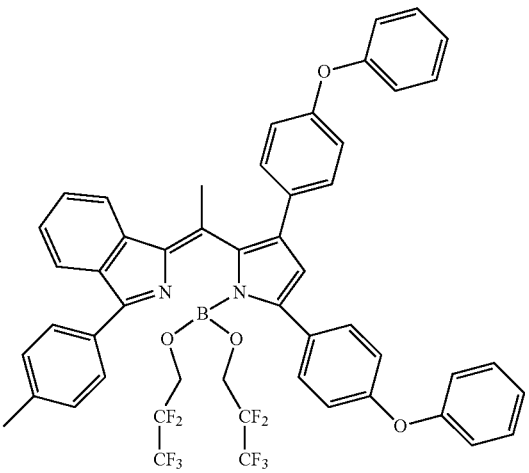
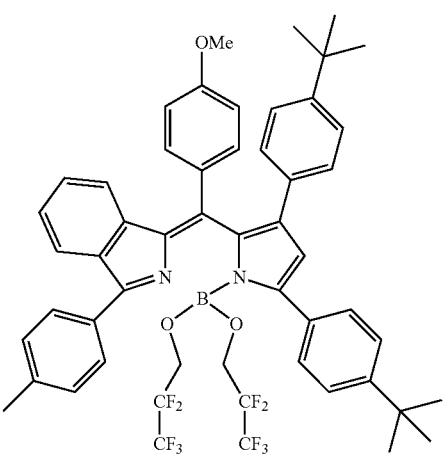

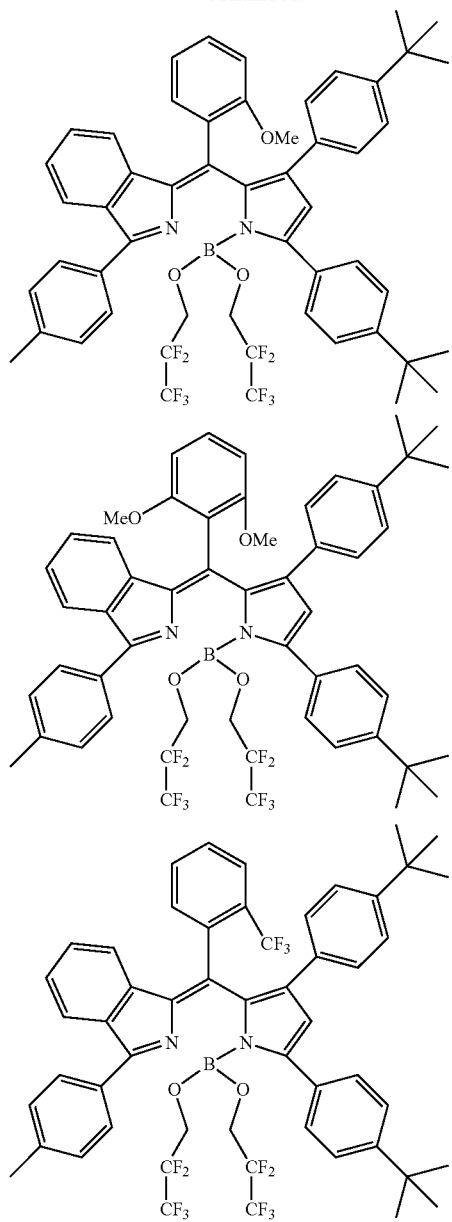
[Formula 36]
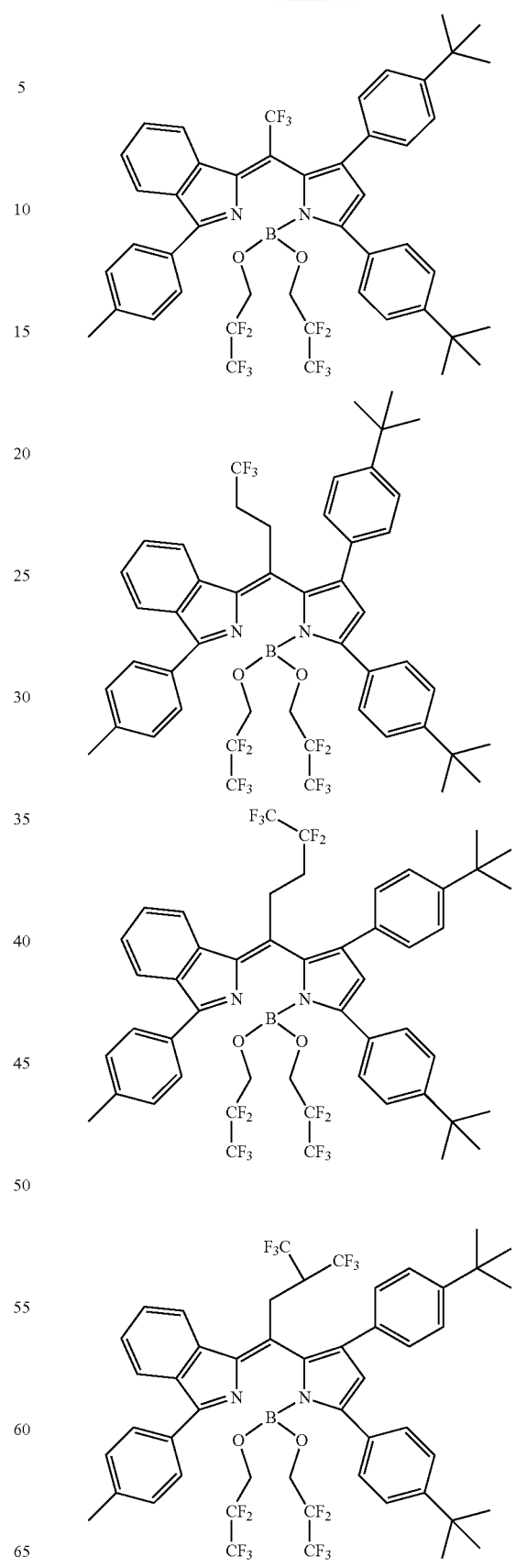

51
-continued
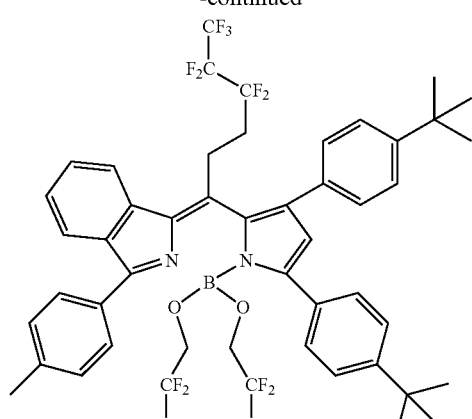
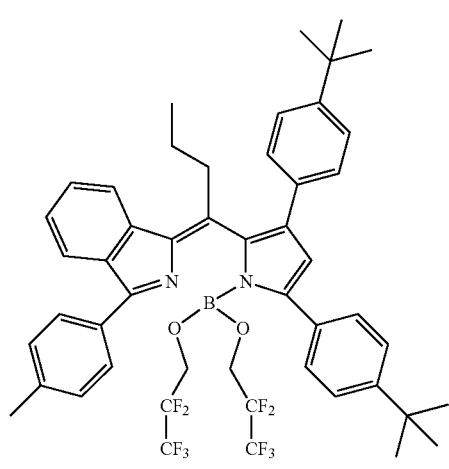
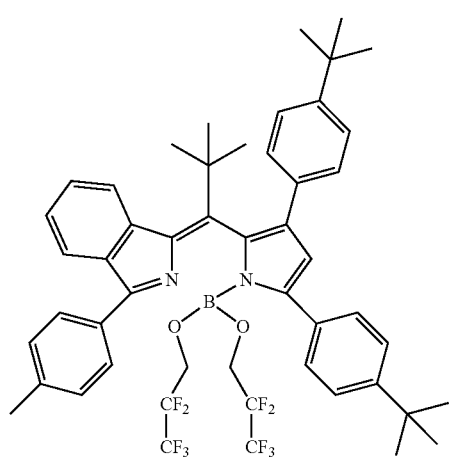
52
-continued
[Formula 37]
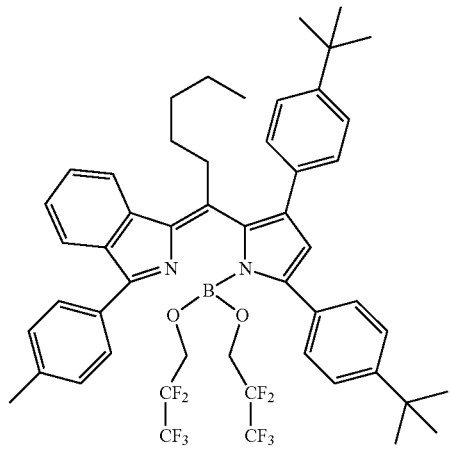
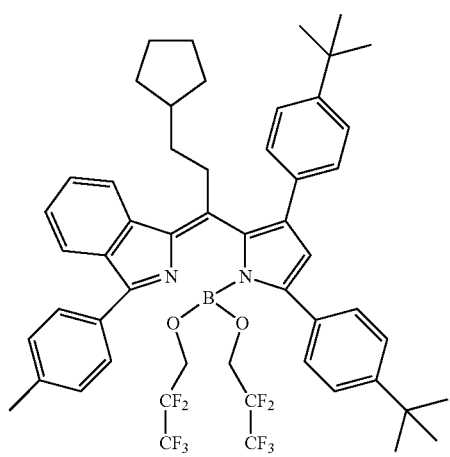
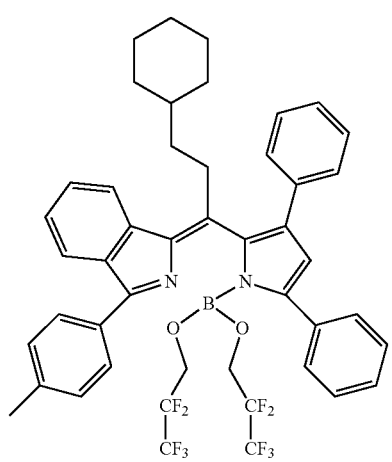

53
-continued
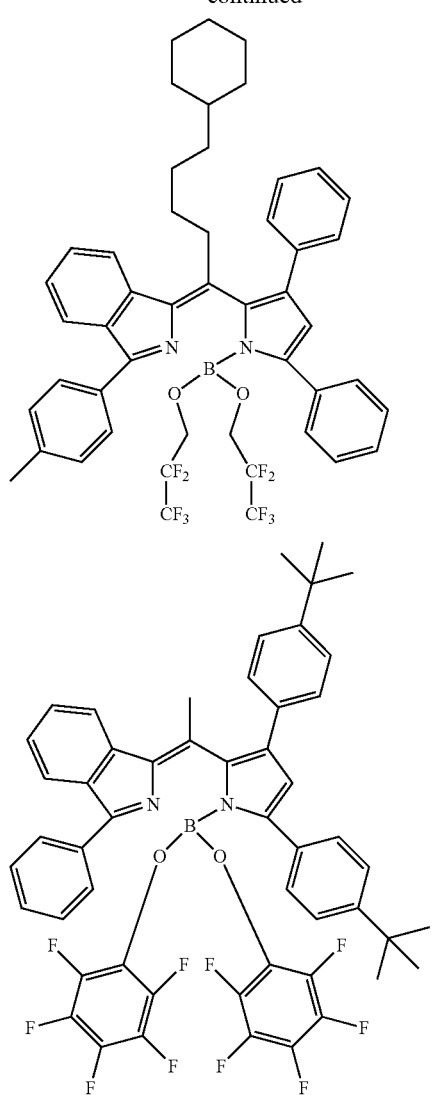
54
-continued
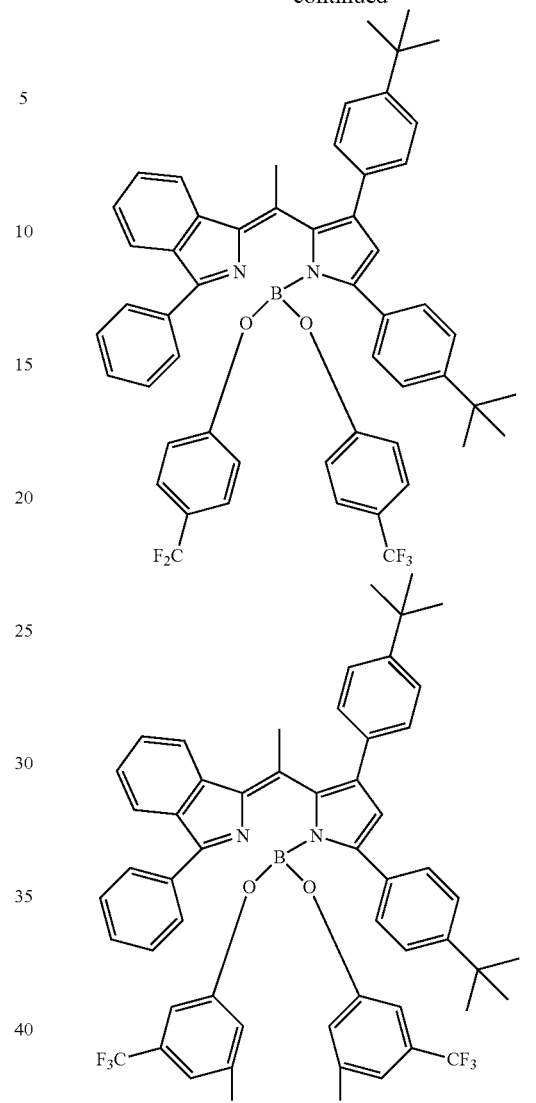
[Formula 38]
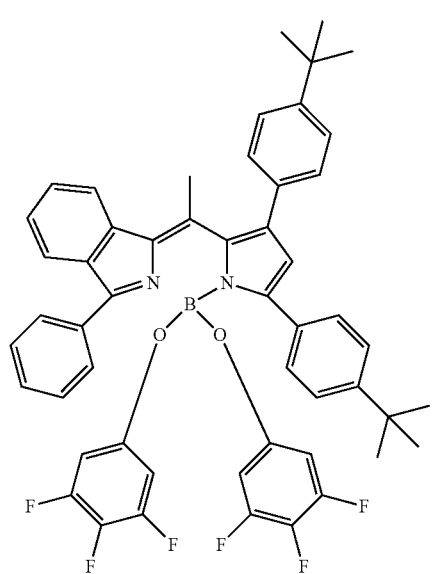
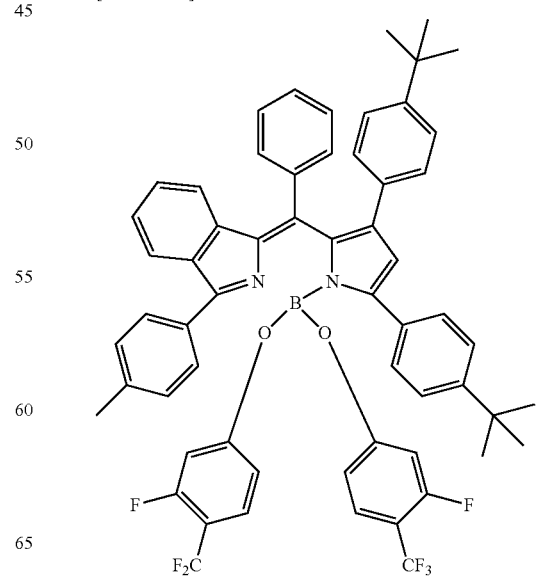

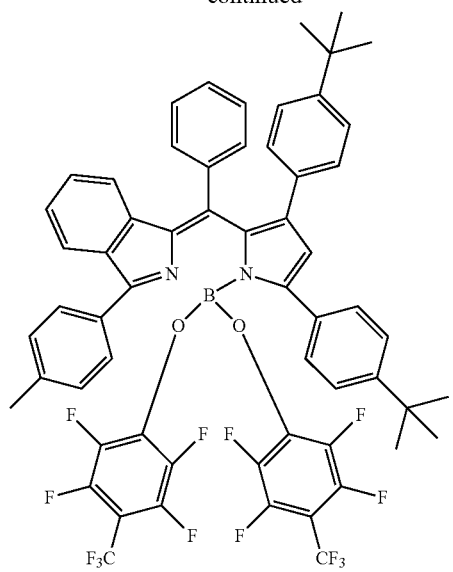
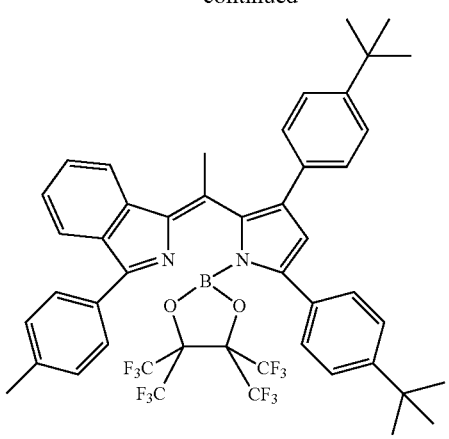
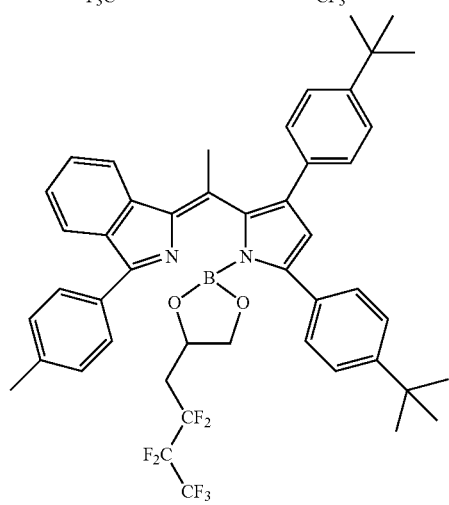
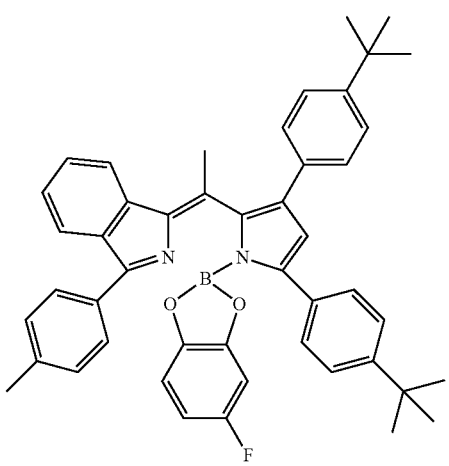
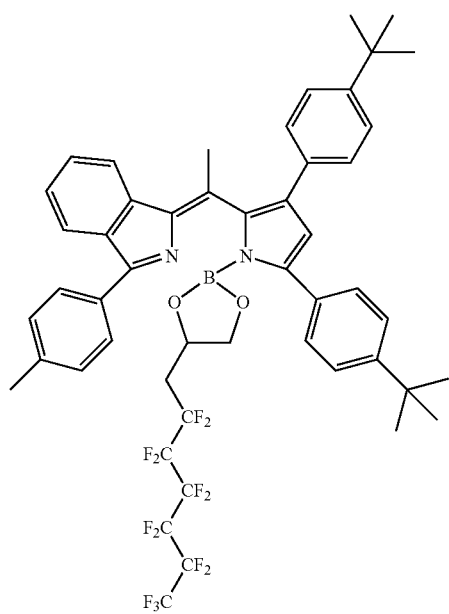
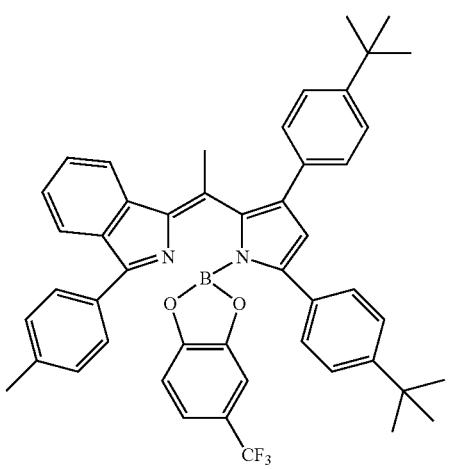

57
-continued
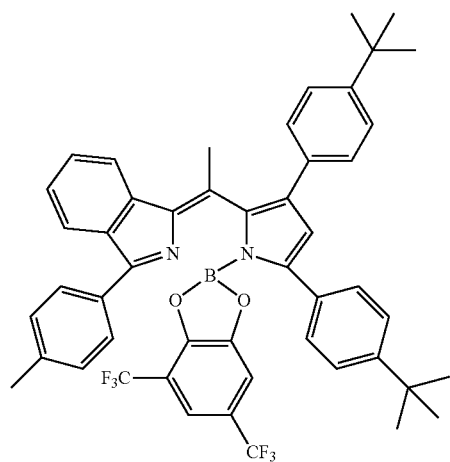
[Formula 39]
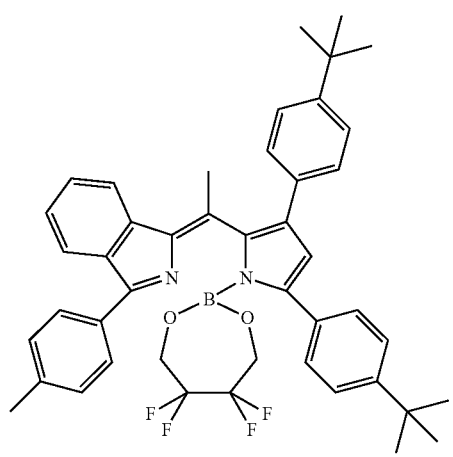
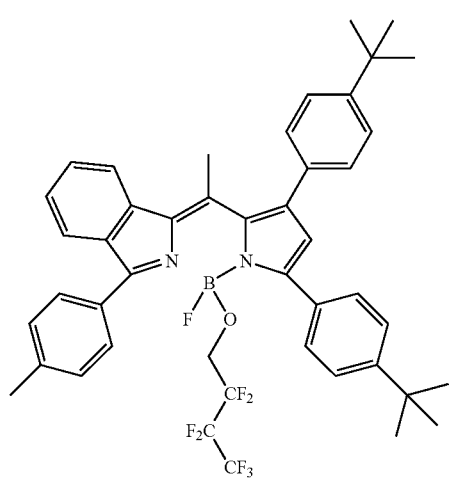
58
-continued
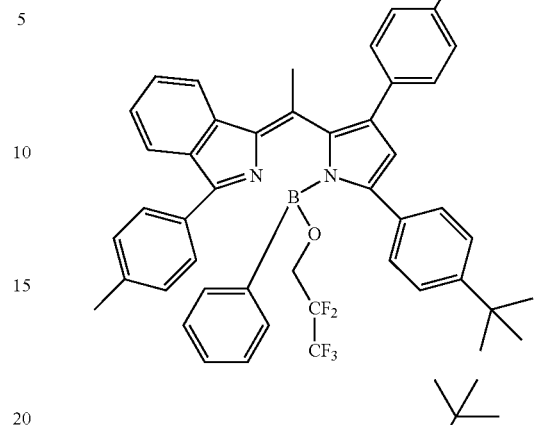
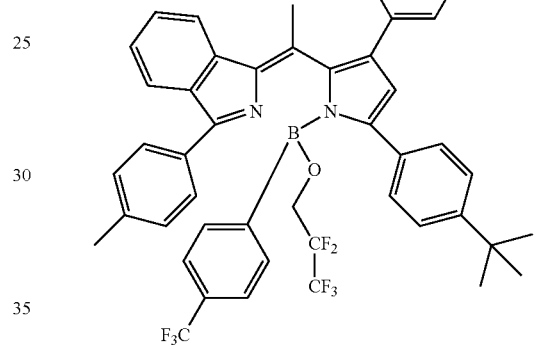
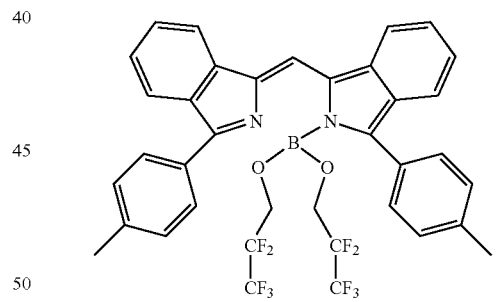
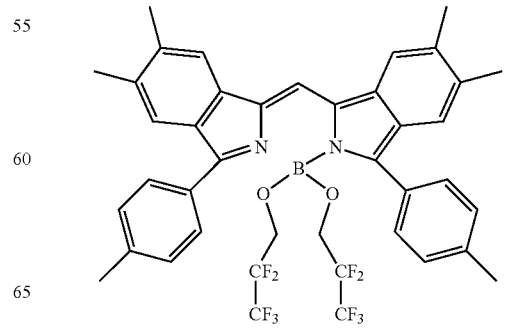

59
-continued
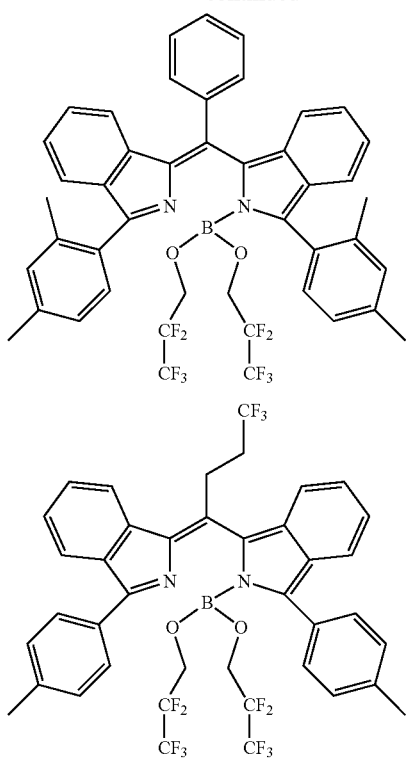
[Formula 40]
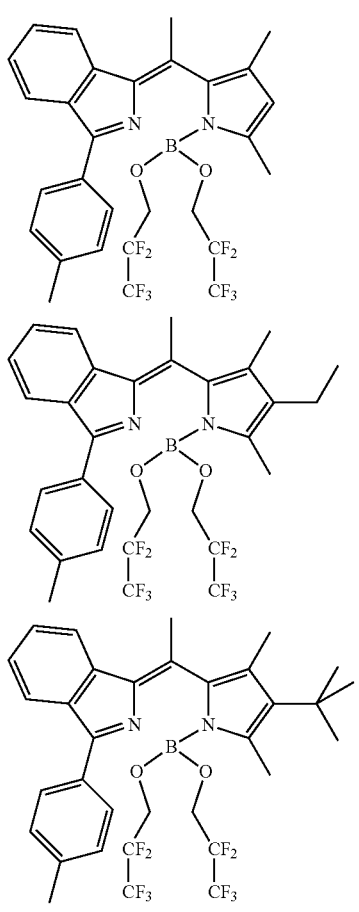
60
-continued
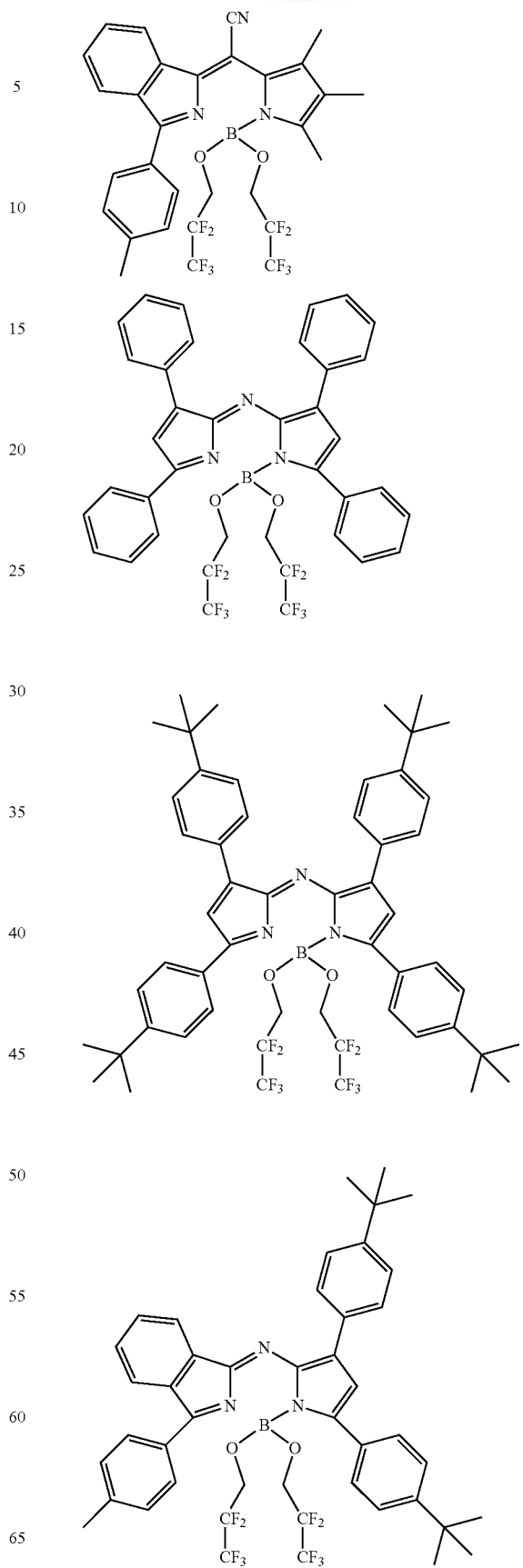

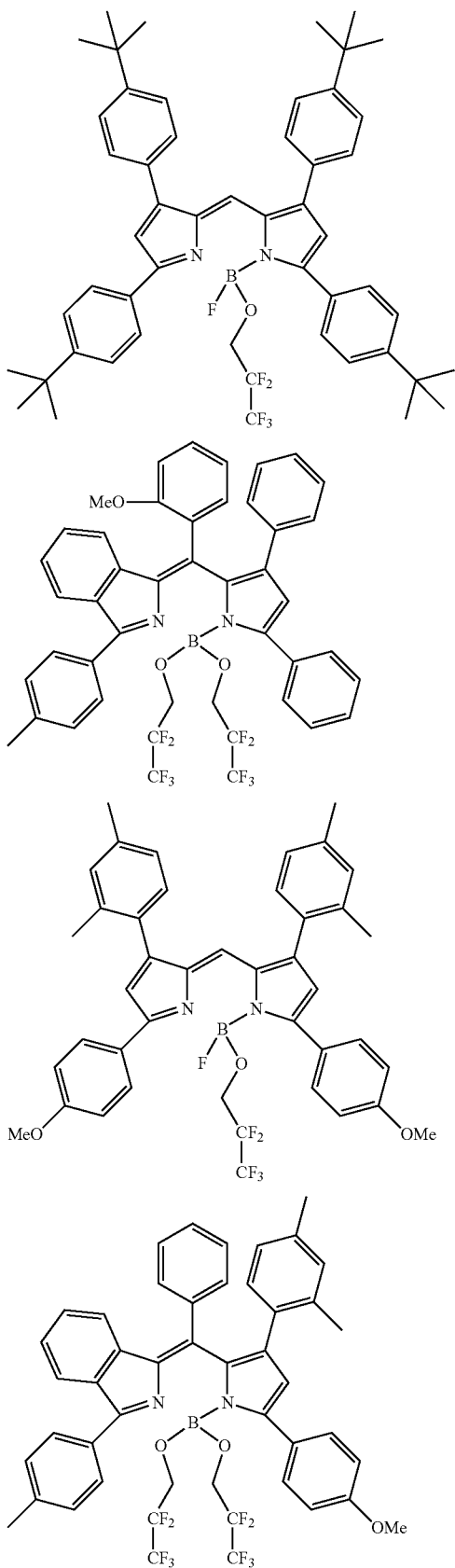
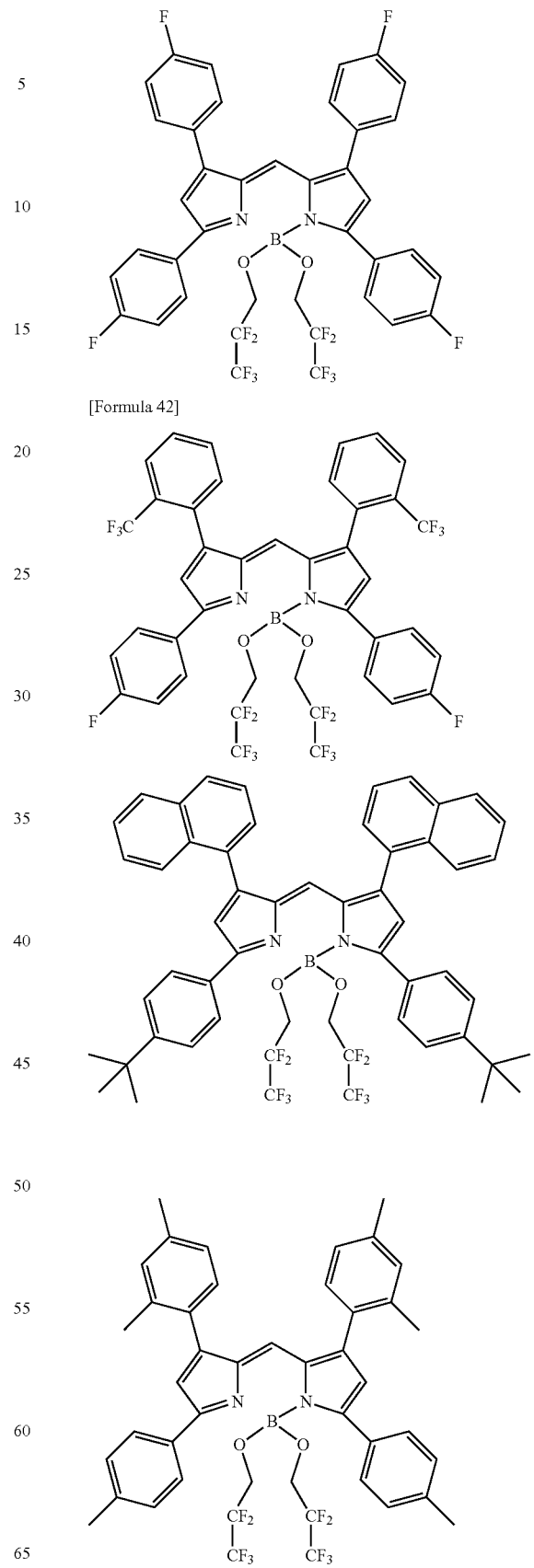

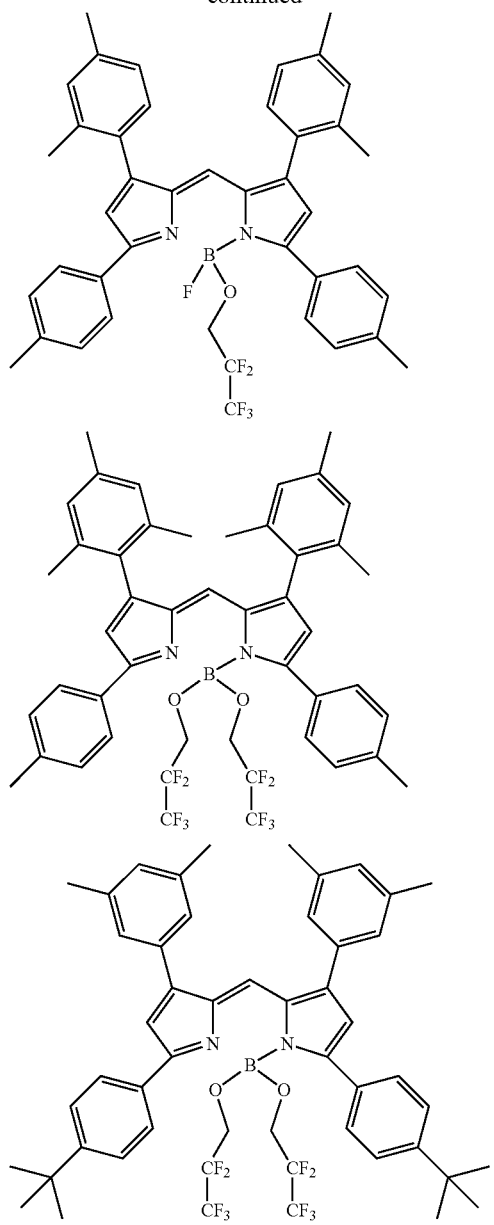
[Formula 43]
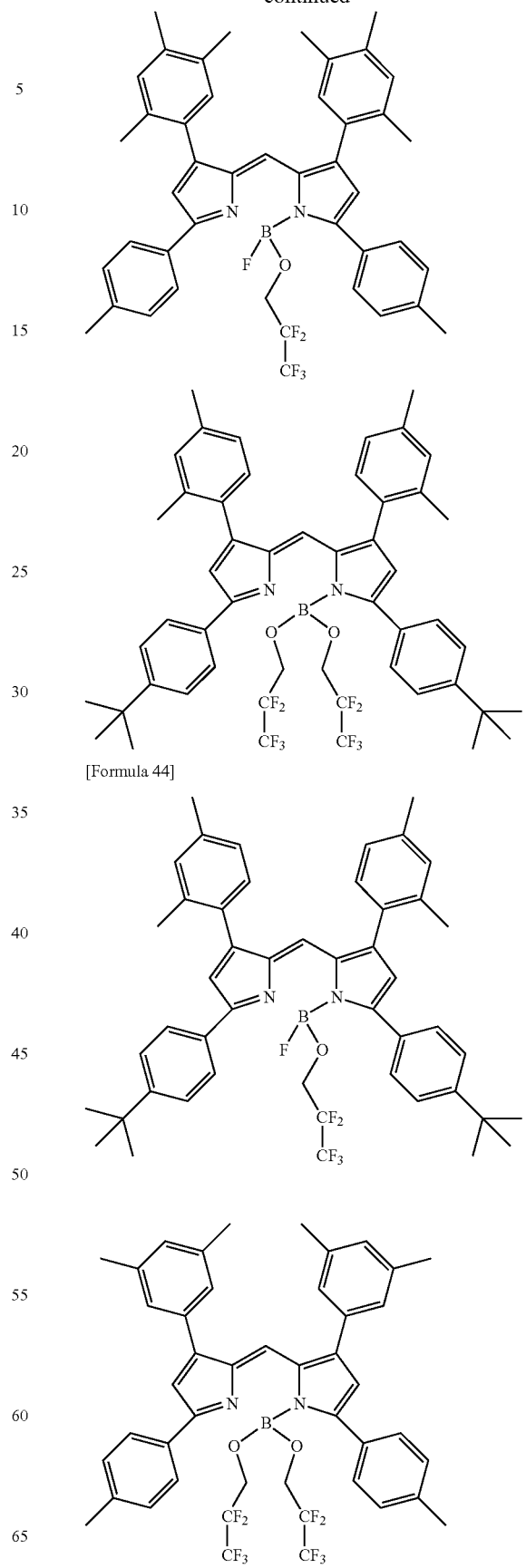
[Formula 44]

-continued
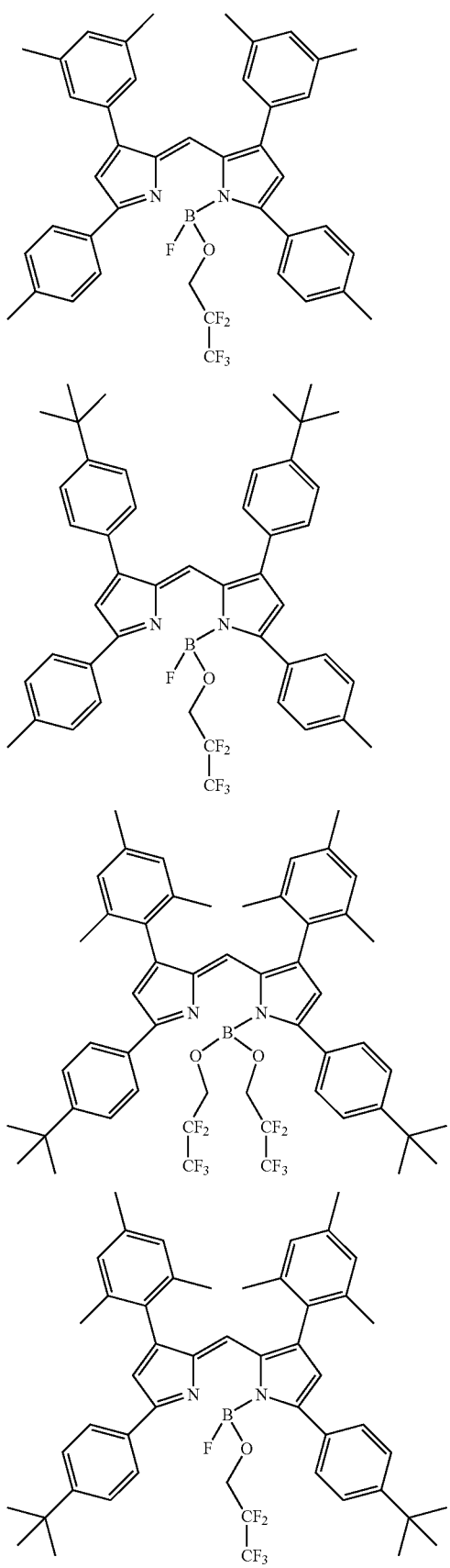
[Formula 45]
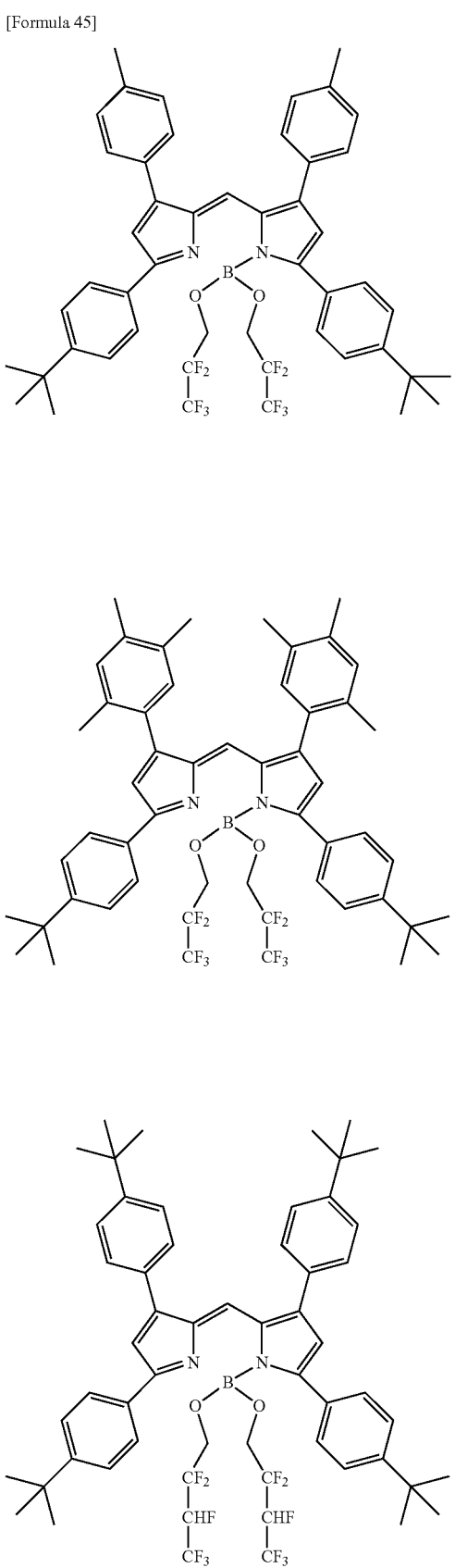

67
-continued
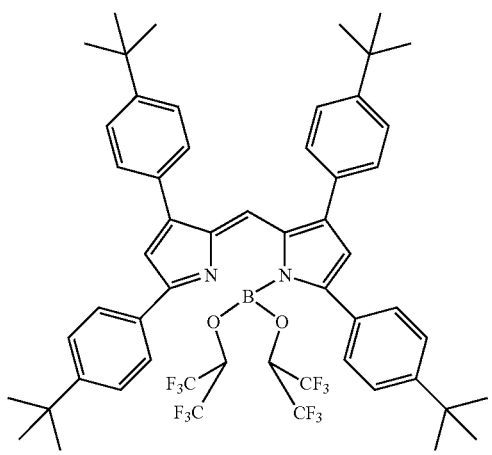
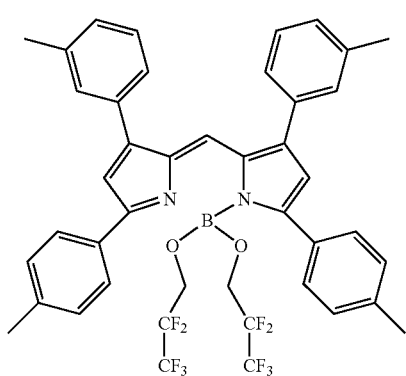
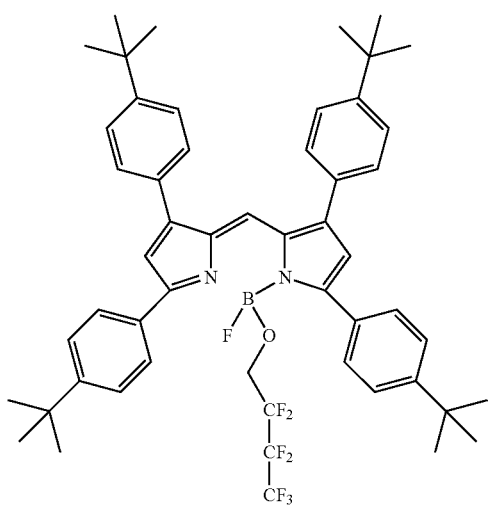
68
-continued
[Formula 46]
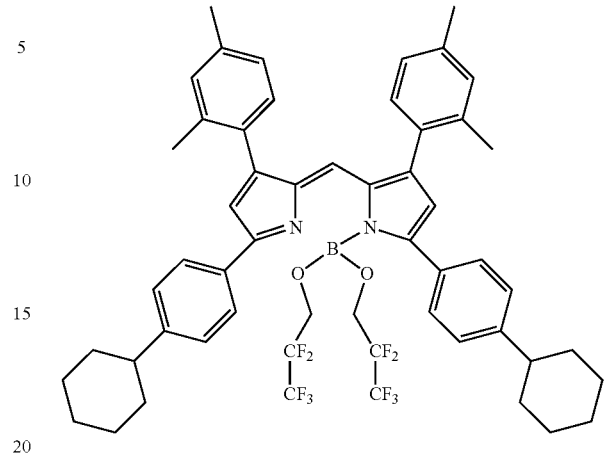
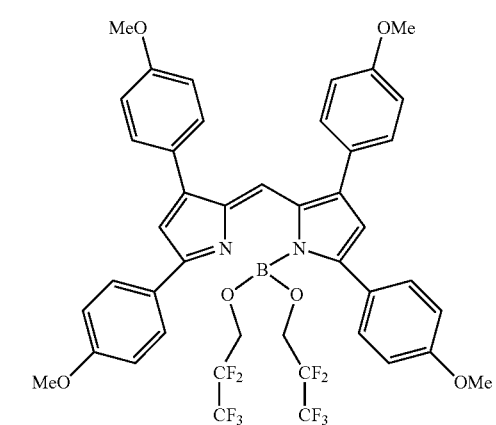
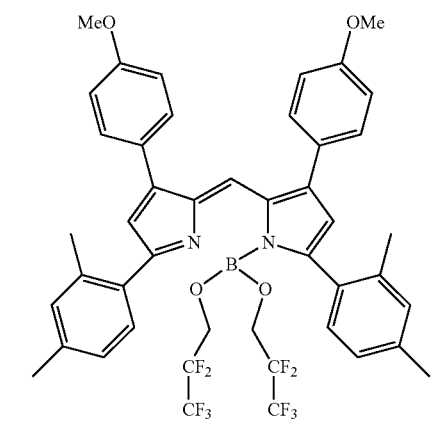

[Formula 47]
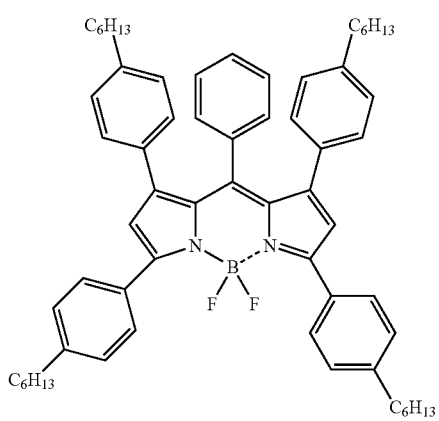
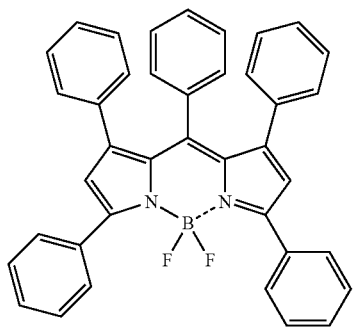
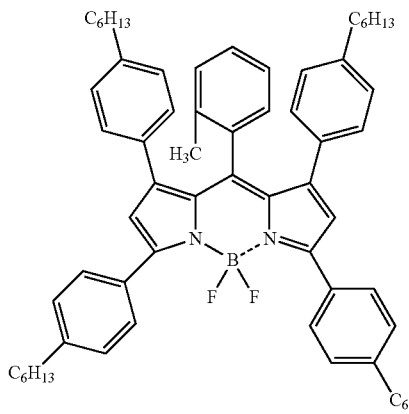
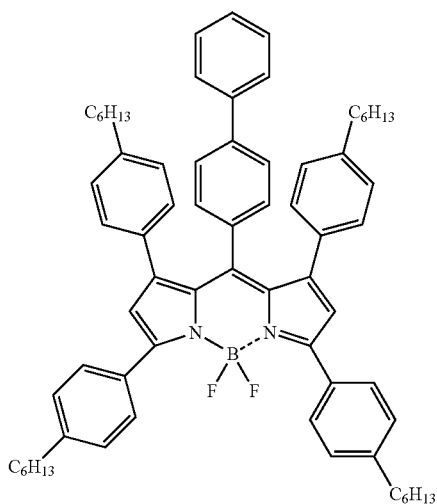
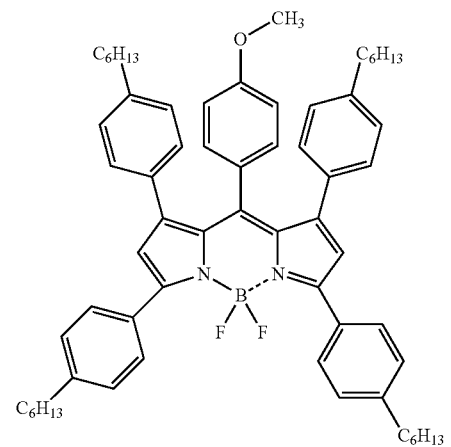
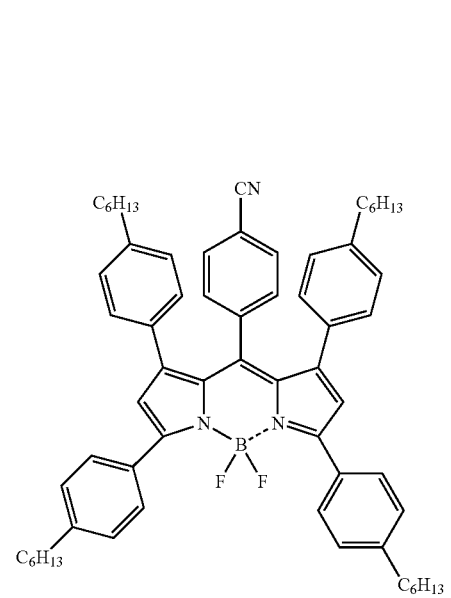
[Formula 48]
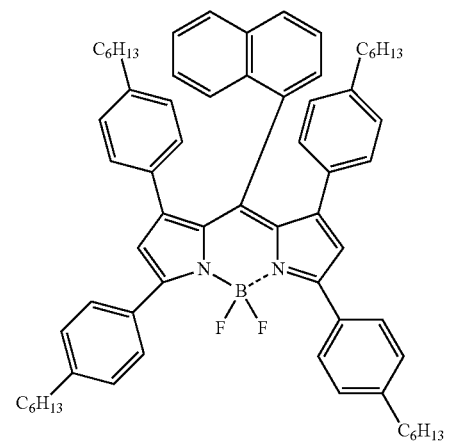

-continued
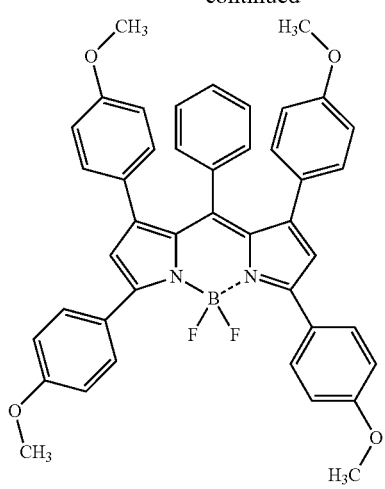
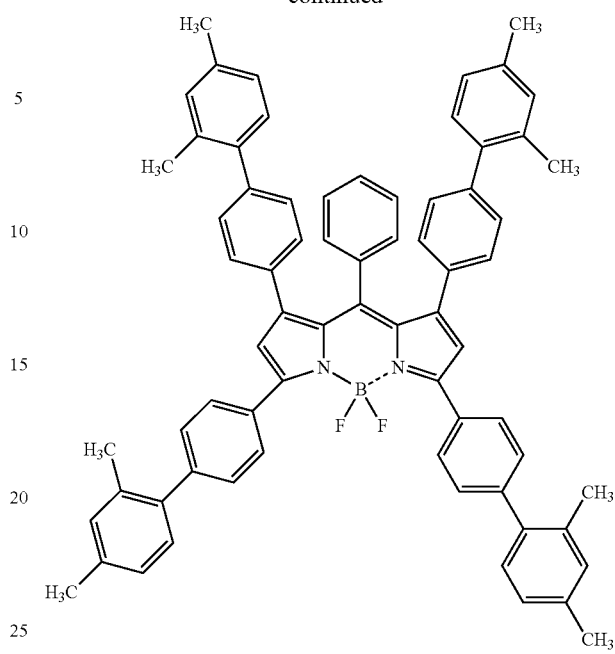
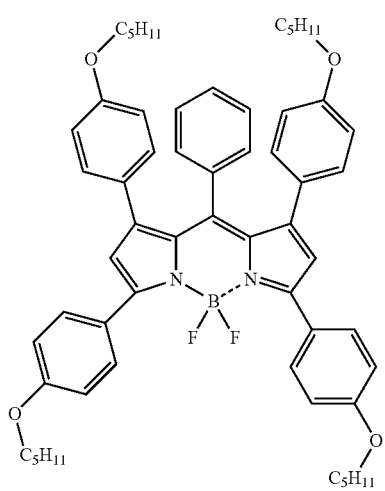
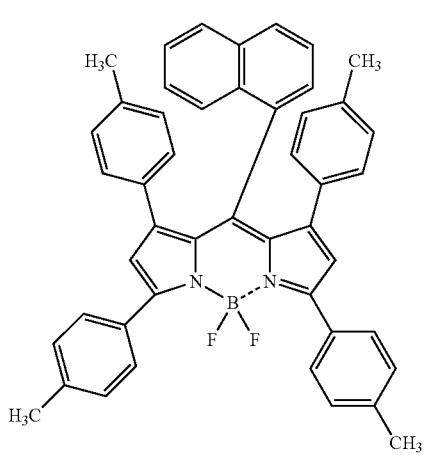
[Formula 49]
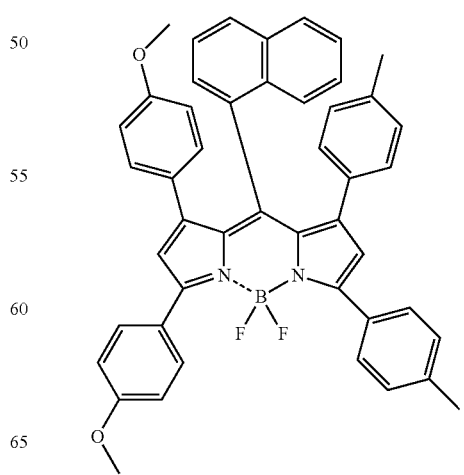

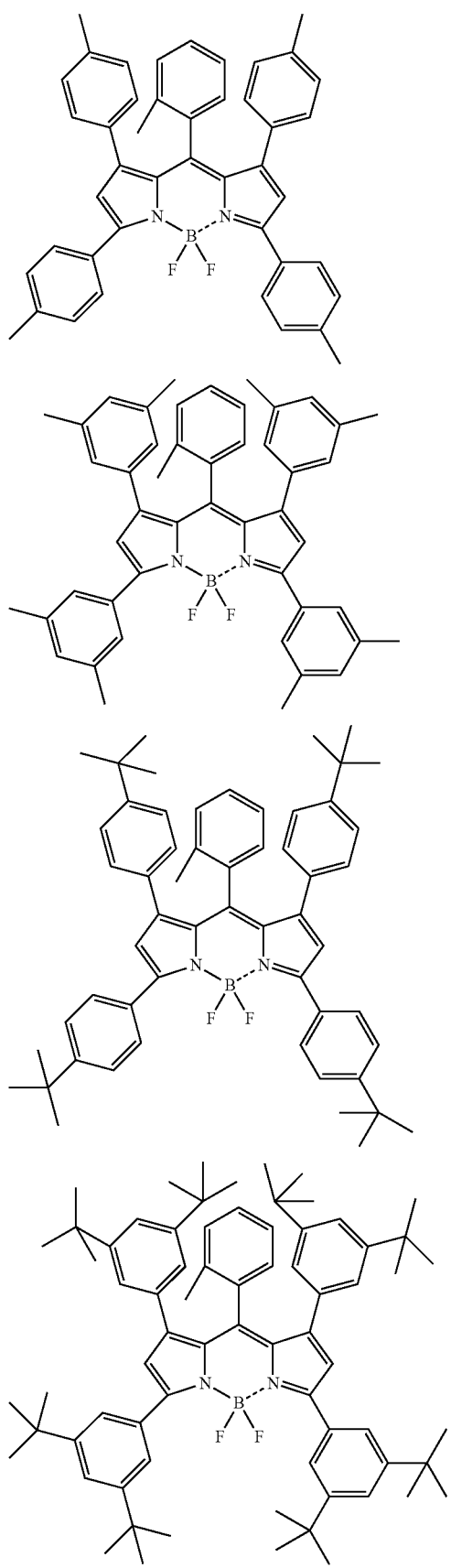
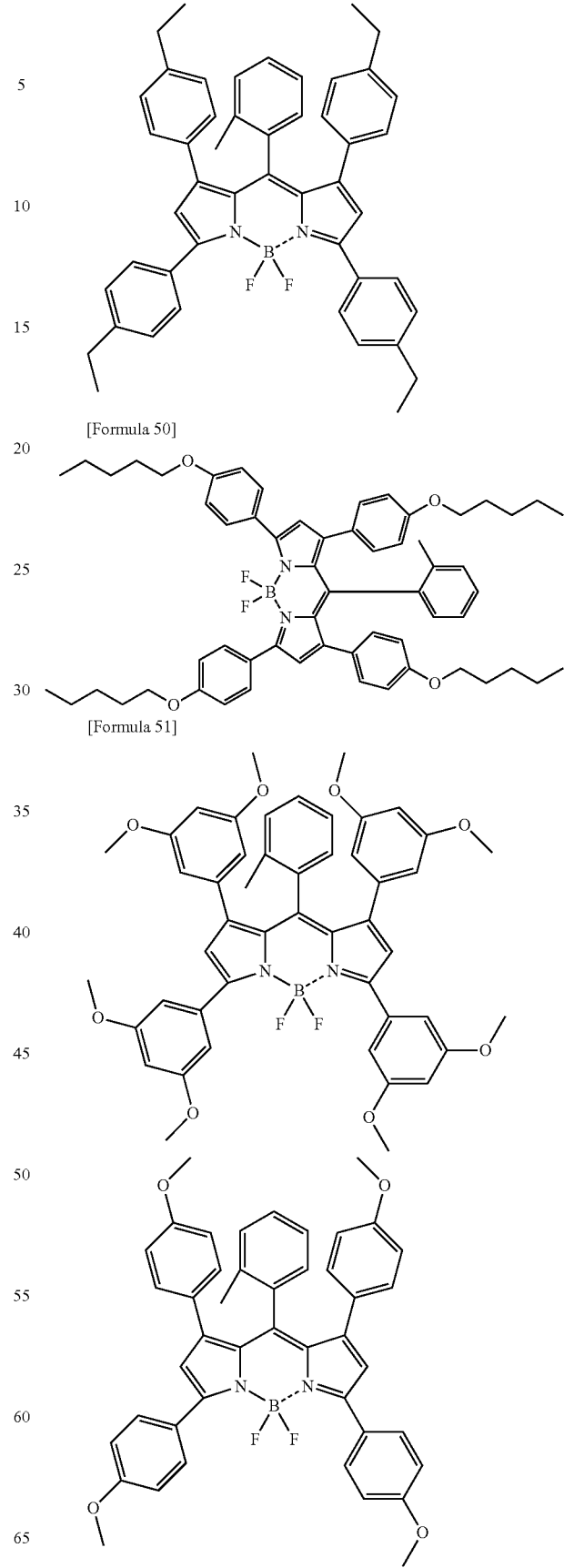
[Formula 50]
[Formula 51]

[Formula 52]
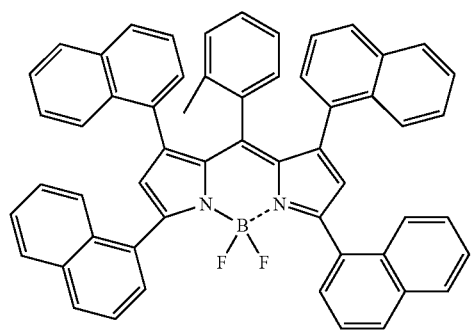
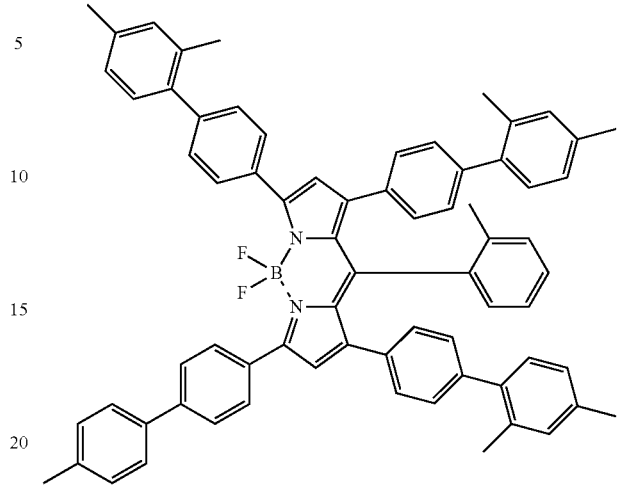
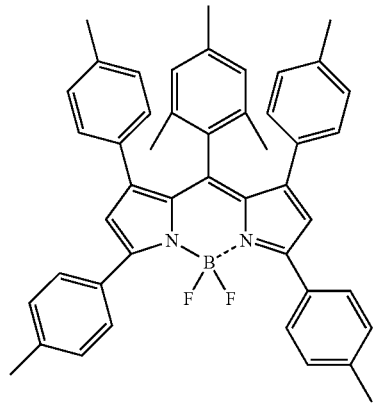
[Formula 53]
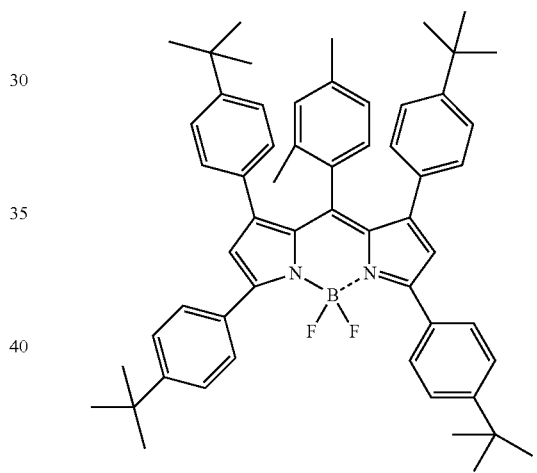
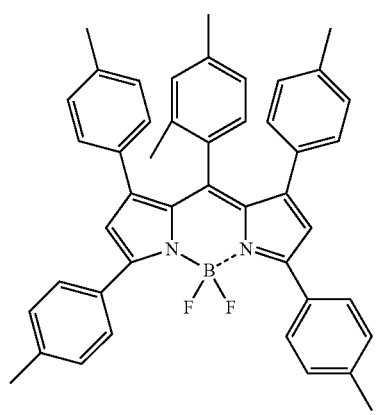
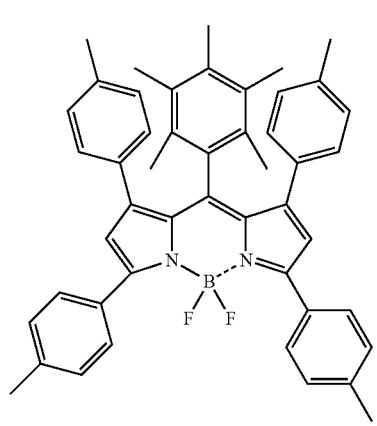
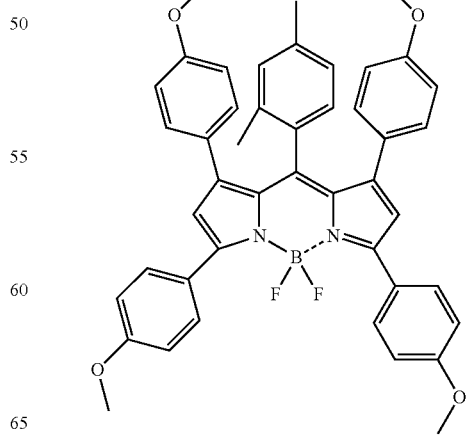

77
-continued
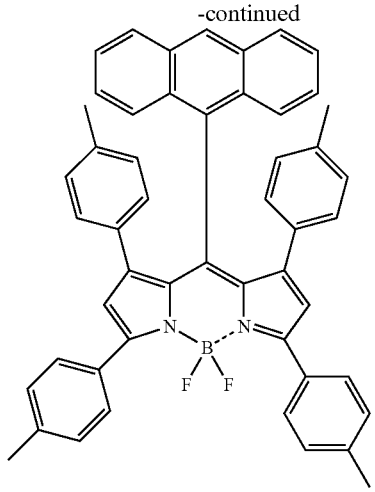
78
-continued
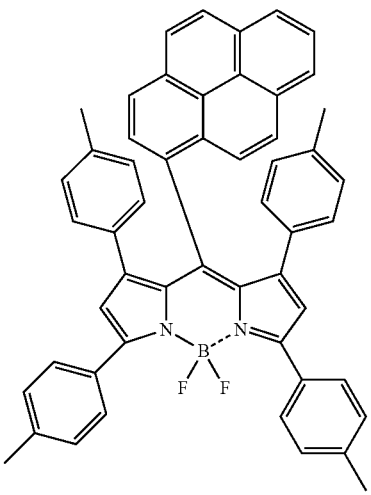
[Formula 54]
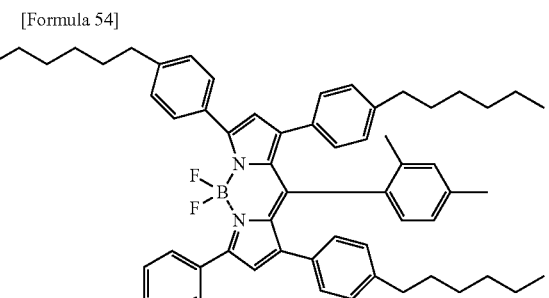
[Formula 55]
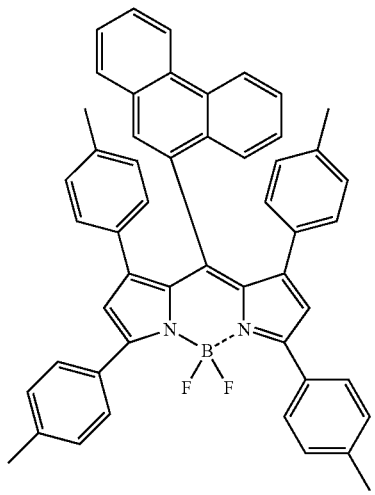
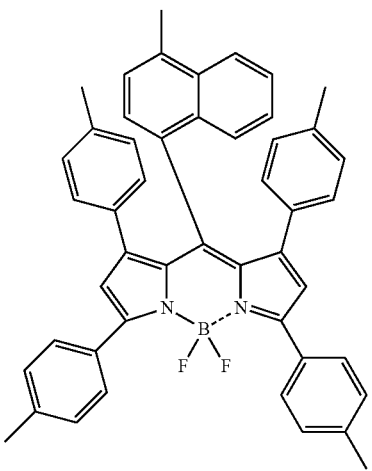

79
-continued
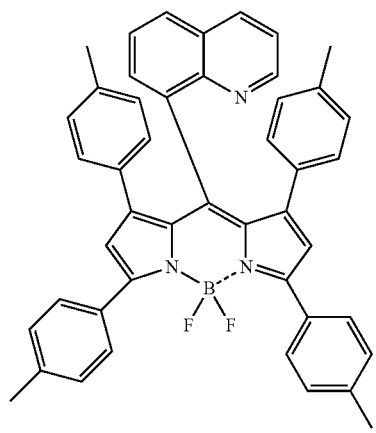
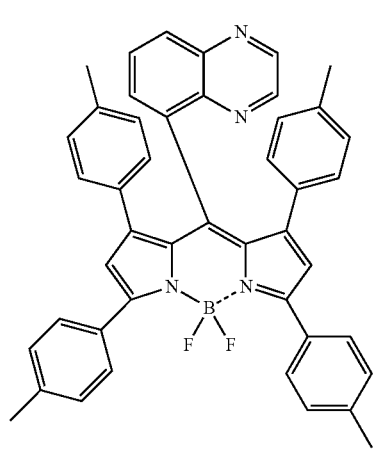
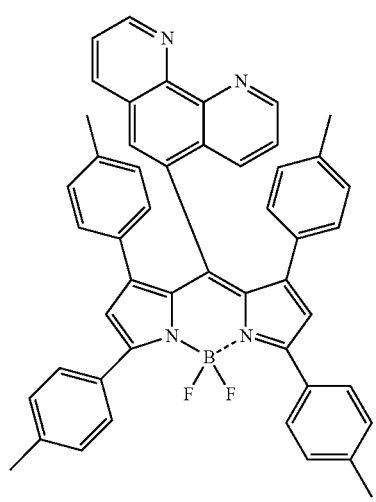
80
-continued
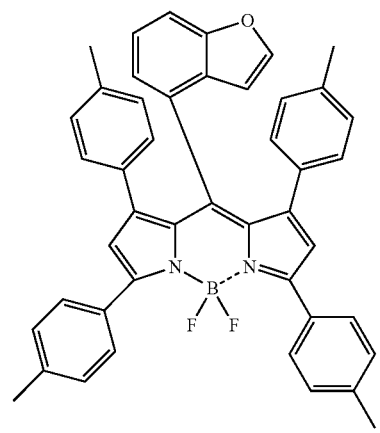
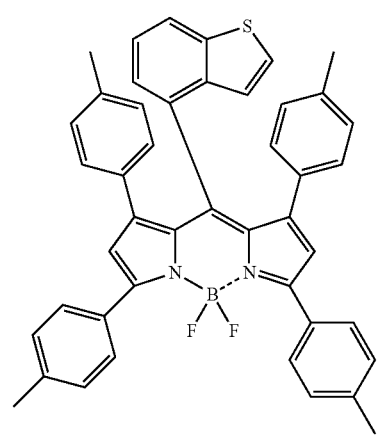
[Formula 56]

-continued
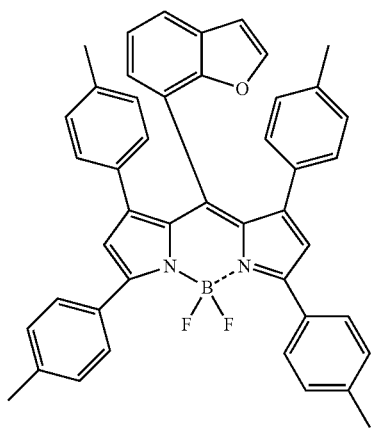
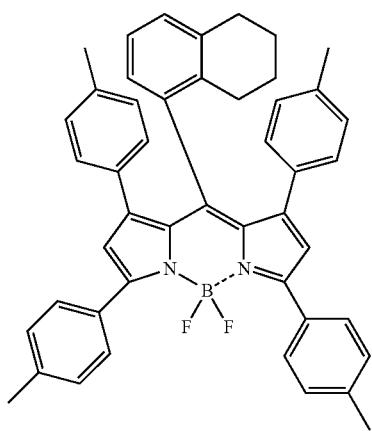
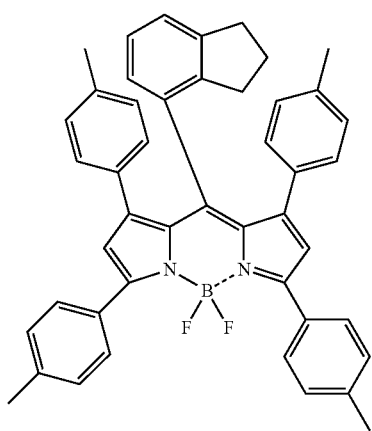
-continued
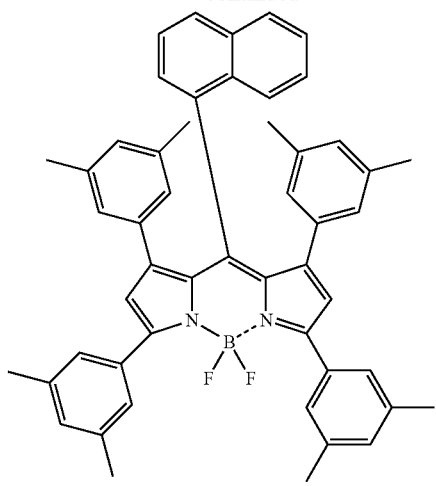
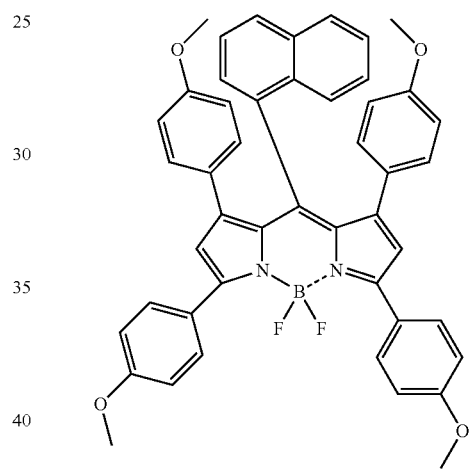
[Formula 57]
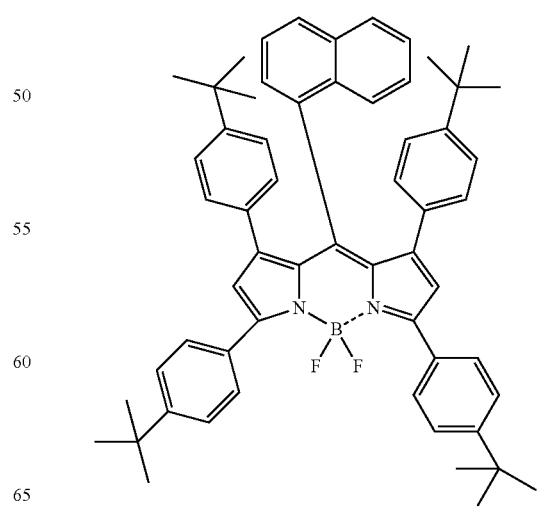

83
-continued
84
-continued
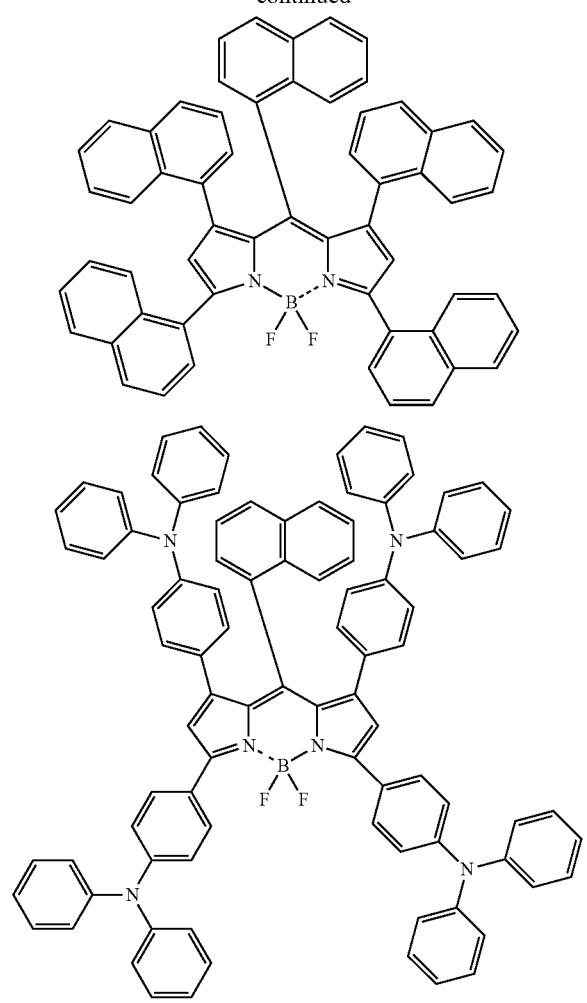
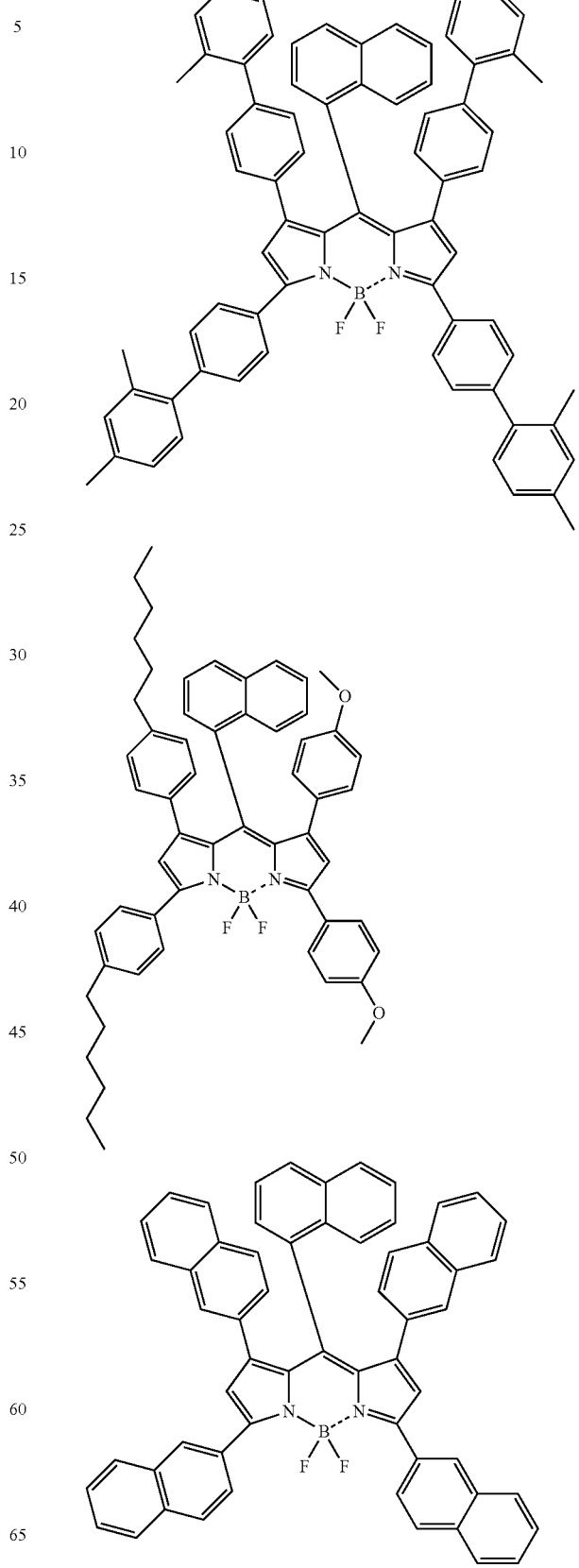
[Formula 58]
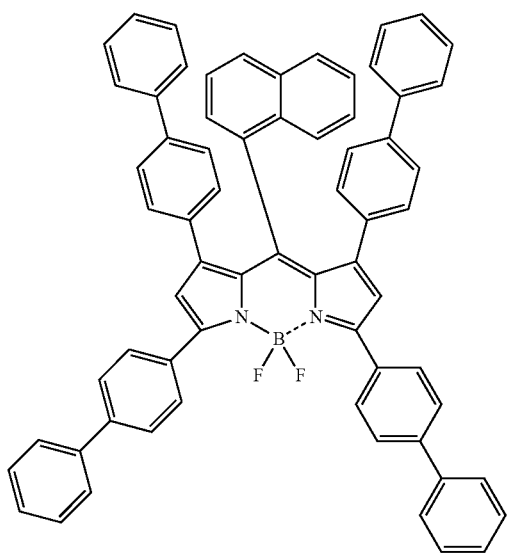

[Formula 59]
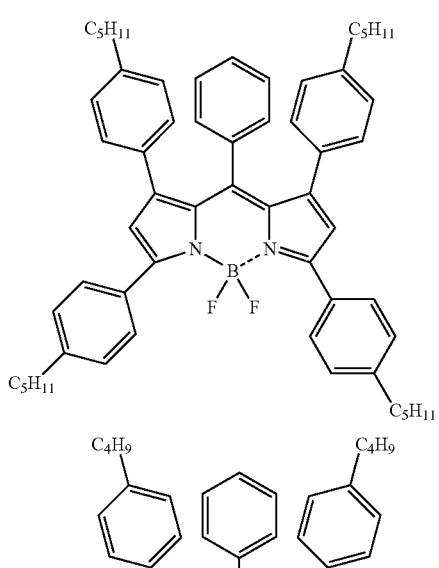
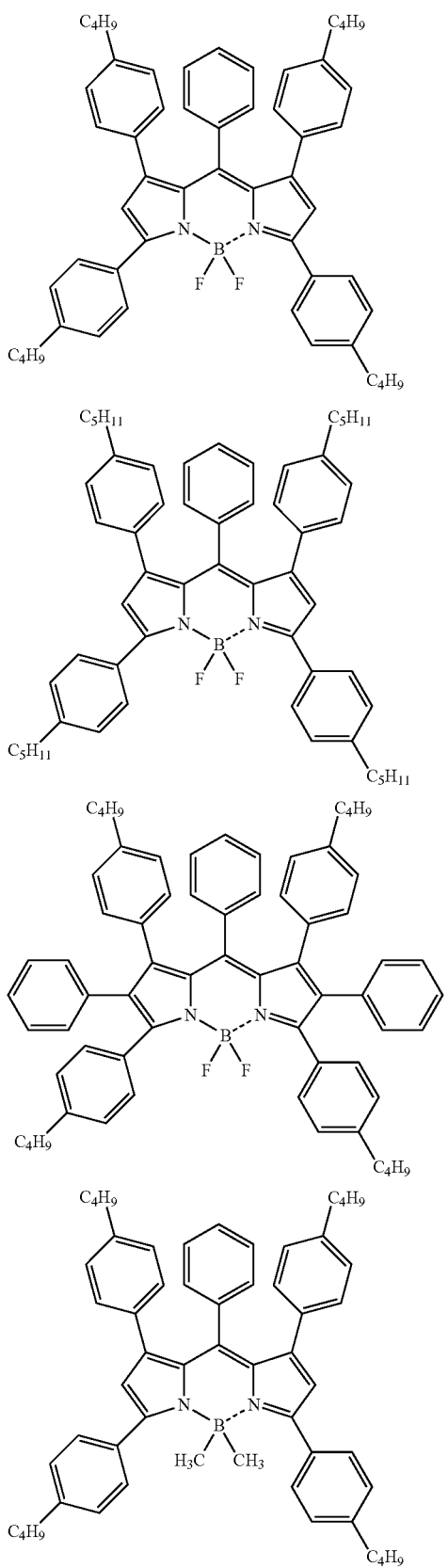
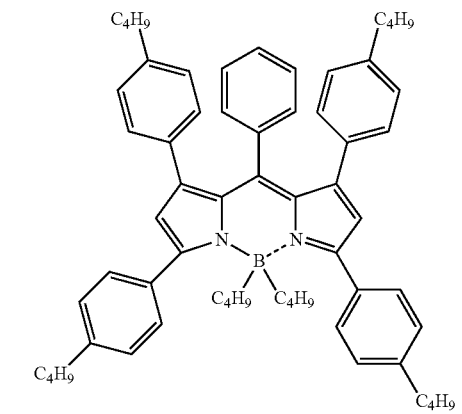
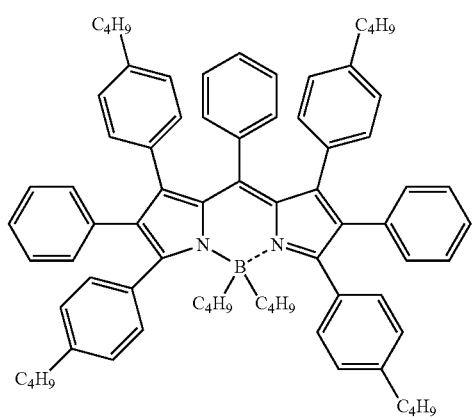
[Formula 60]
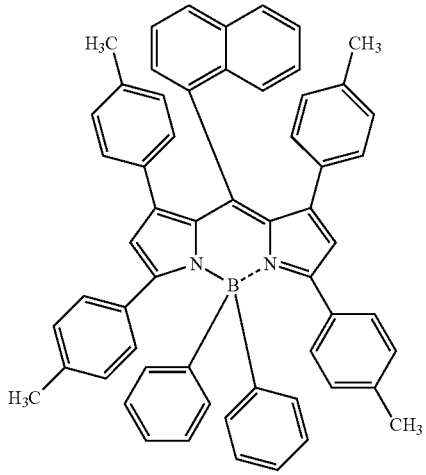

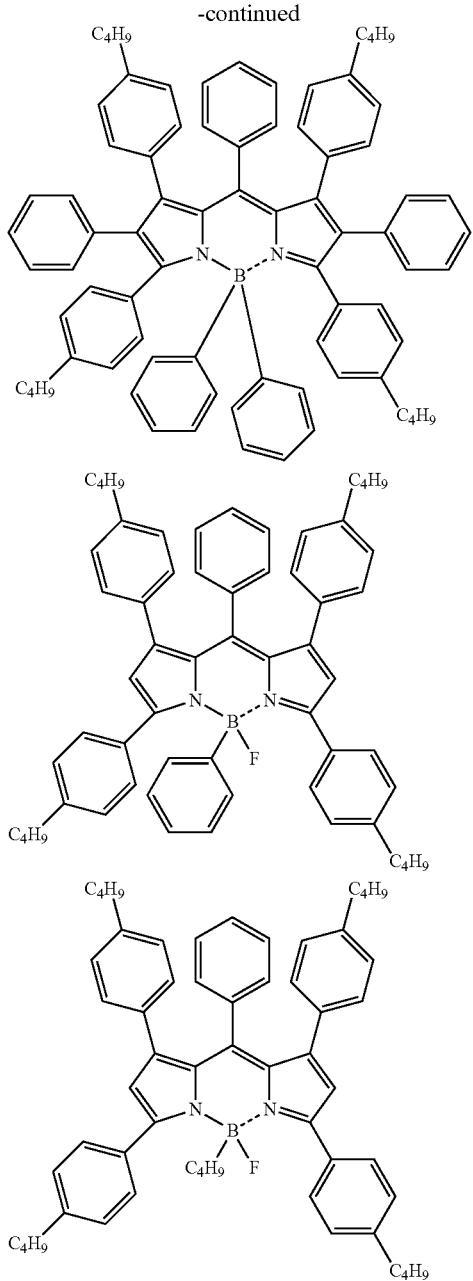
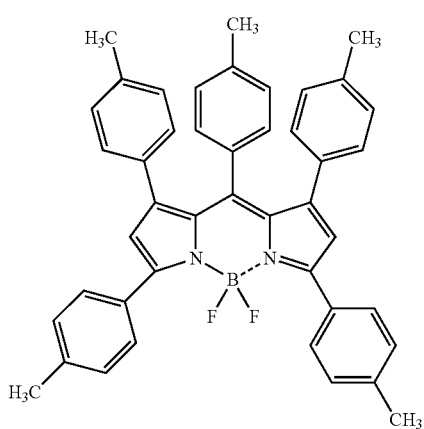
[Formula 61]
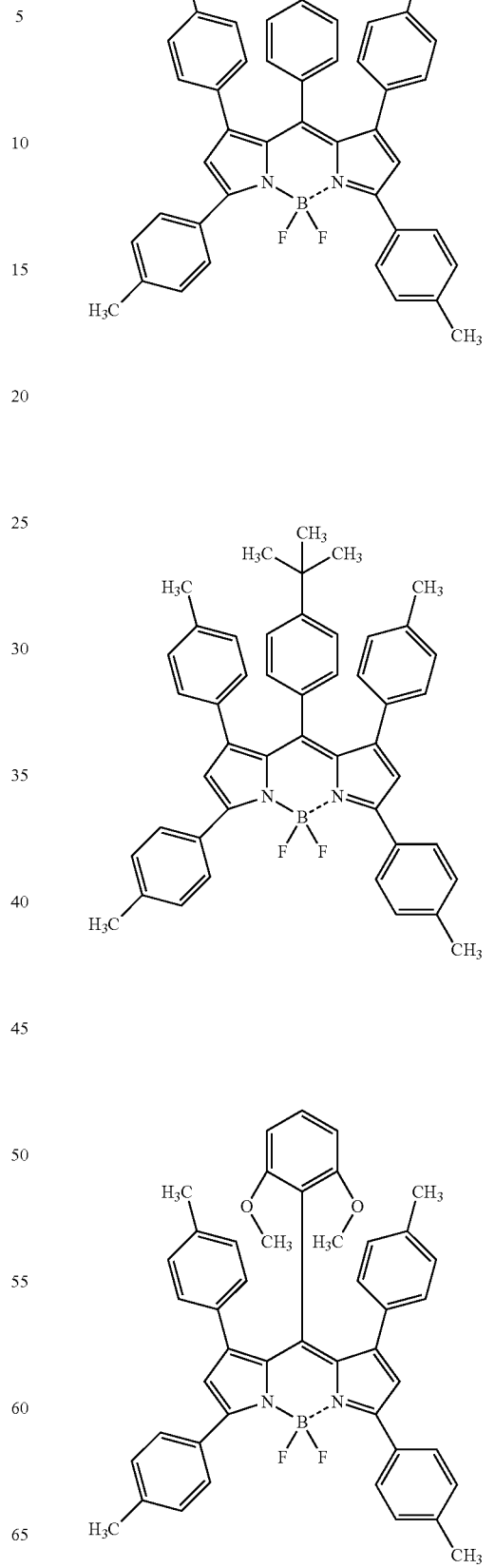

89
-continued
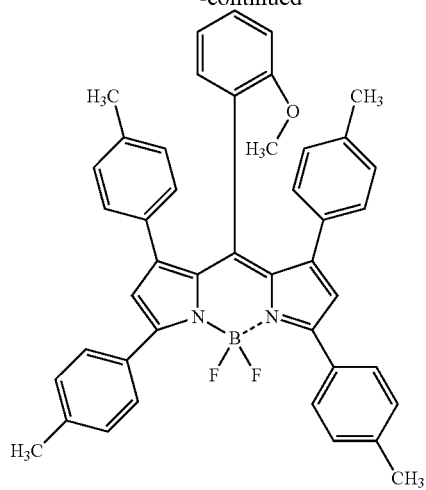
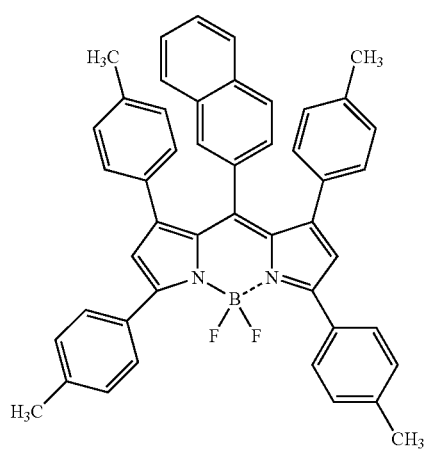
[Formula 62]
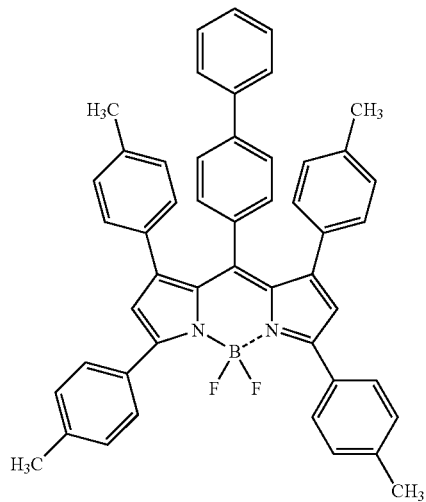
90
-continued
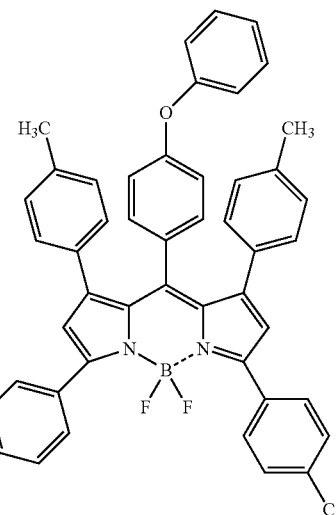
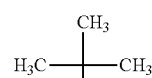
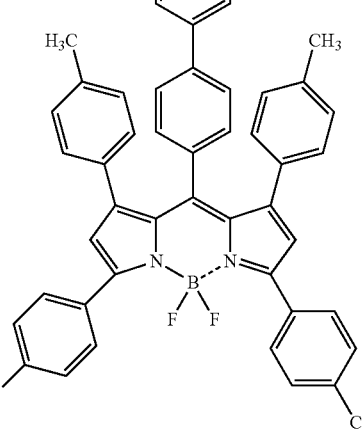
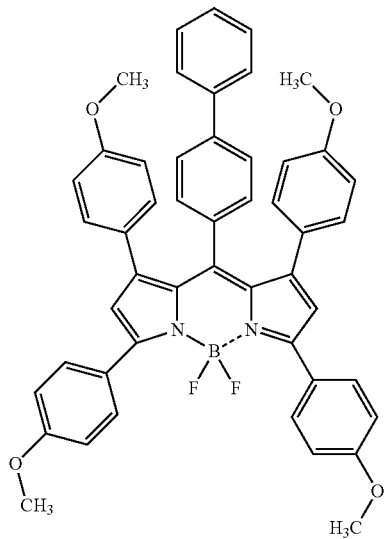

91
-continued
[Formula 63]
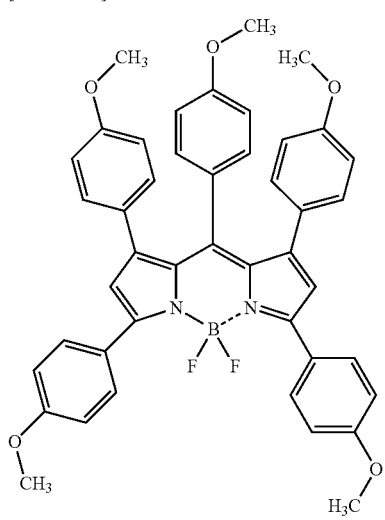
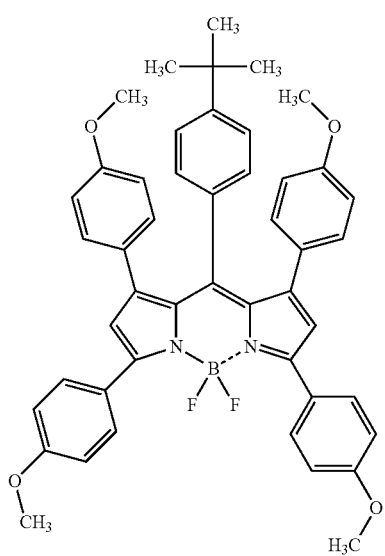
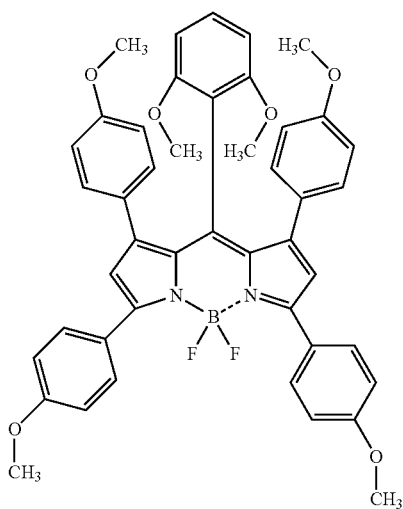
92
-continued
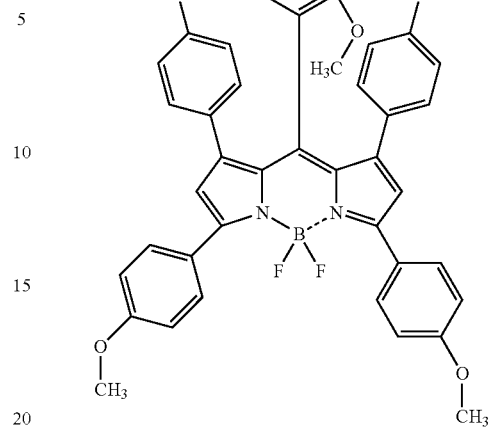
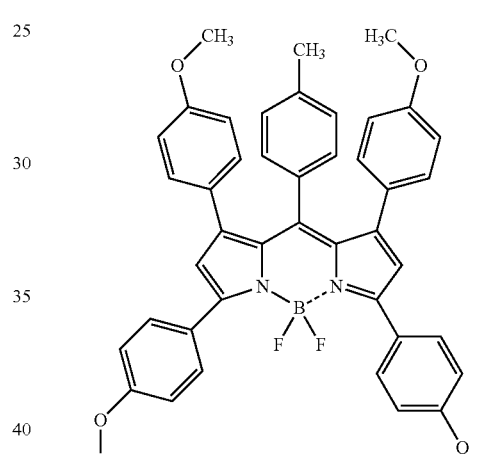
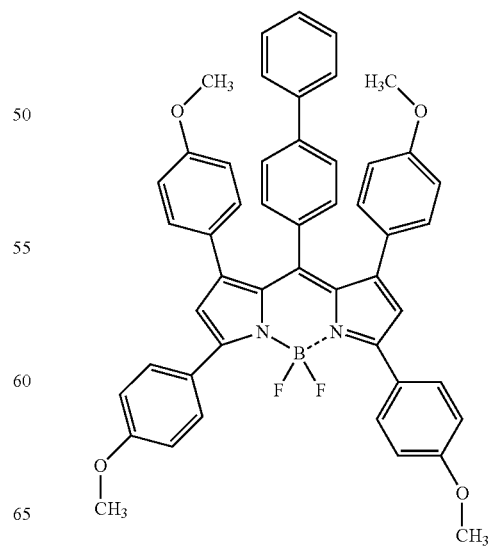

-continued
[Formula 64]
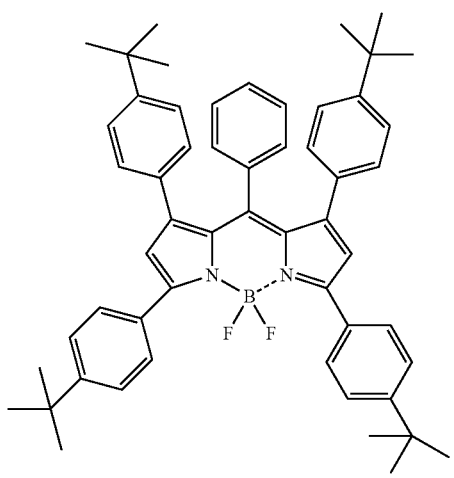
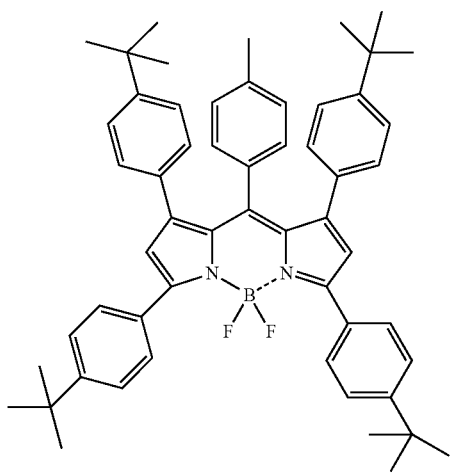
-continued
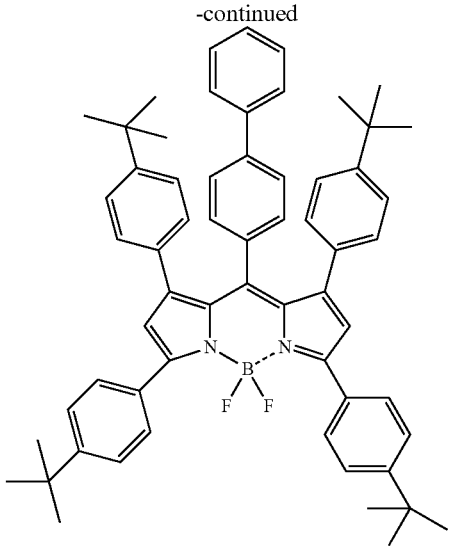
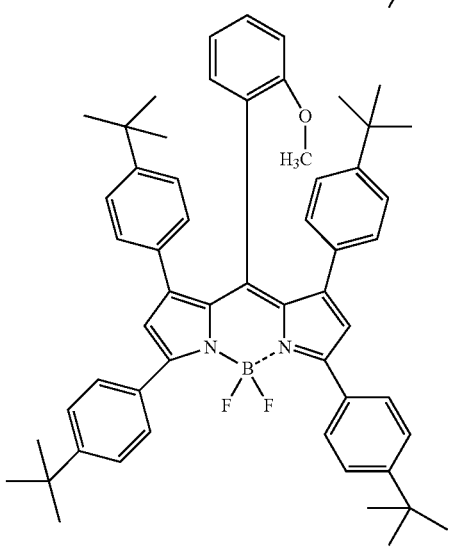
[Formula 65]
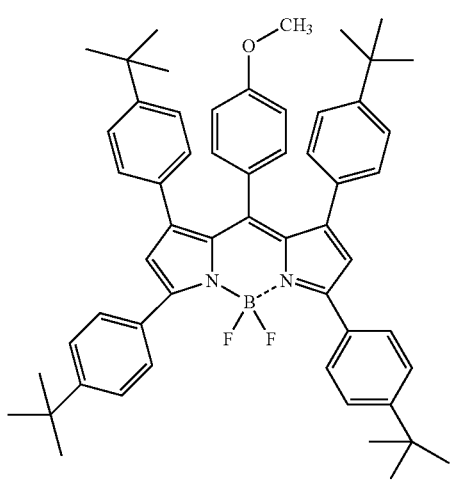
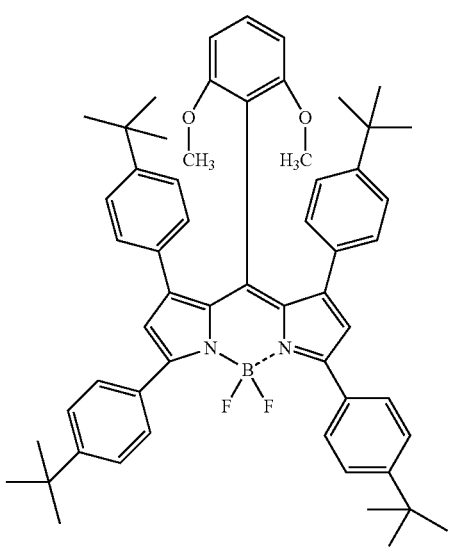

95
-continued
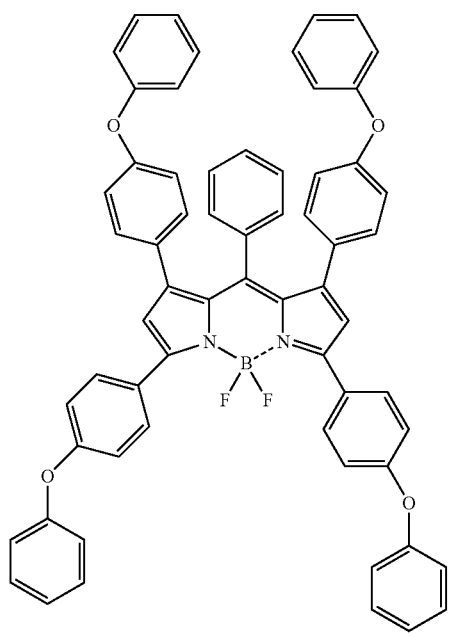
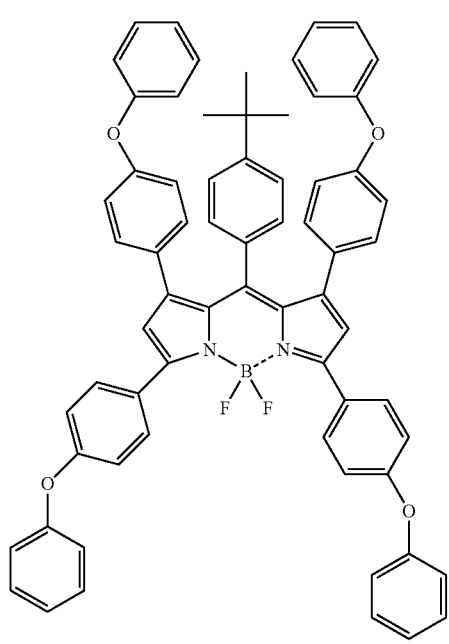
96
-continued
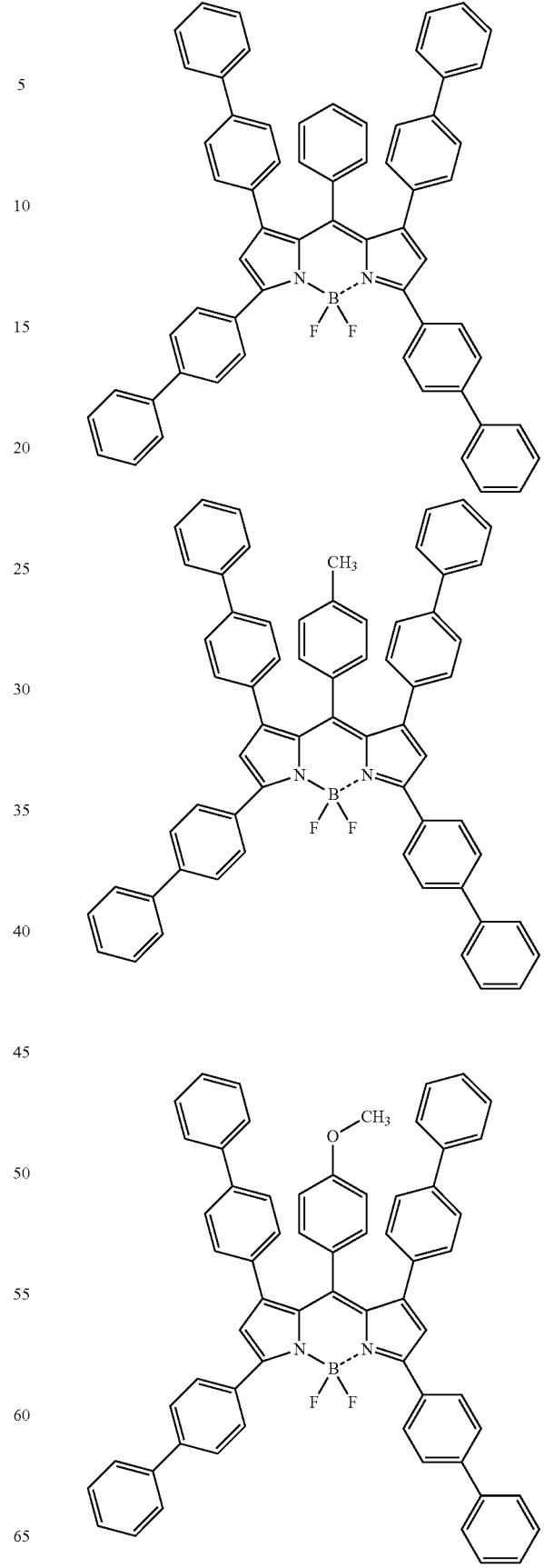

[Formula 66]
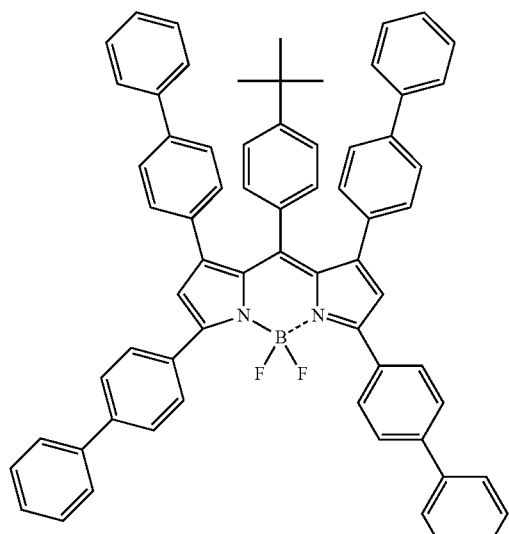
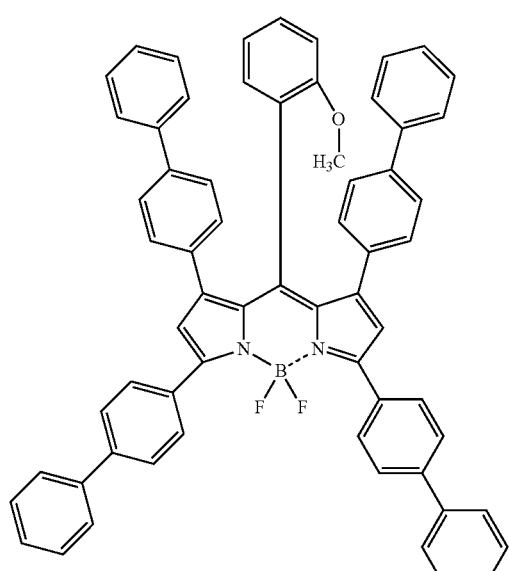
[Formula 67]
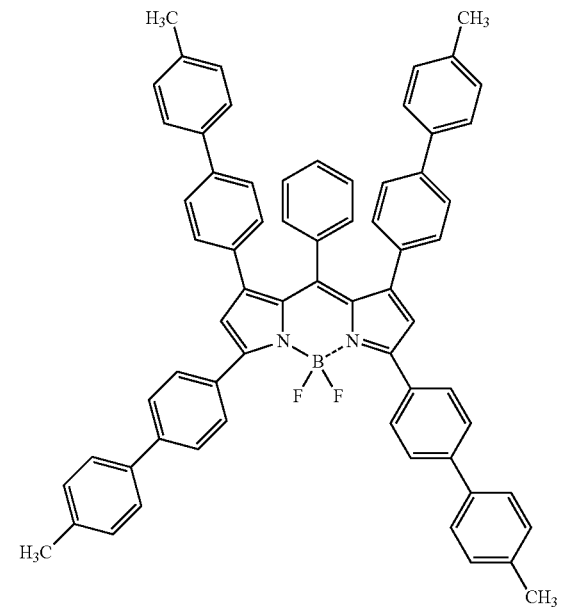
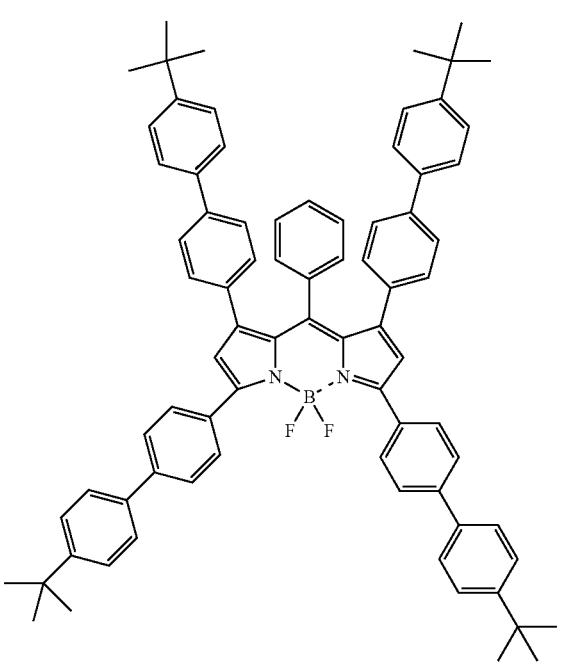

[Formula 68]
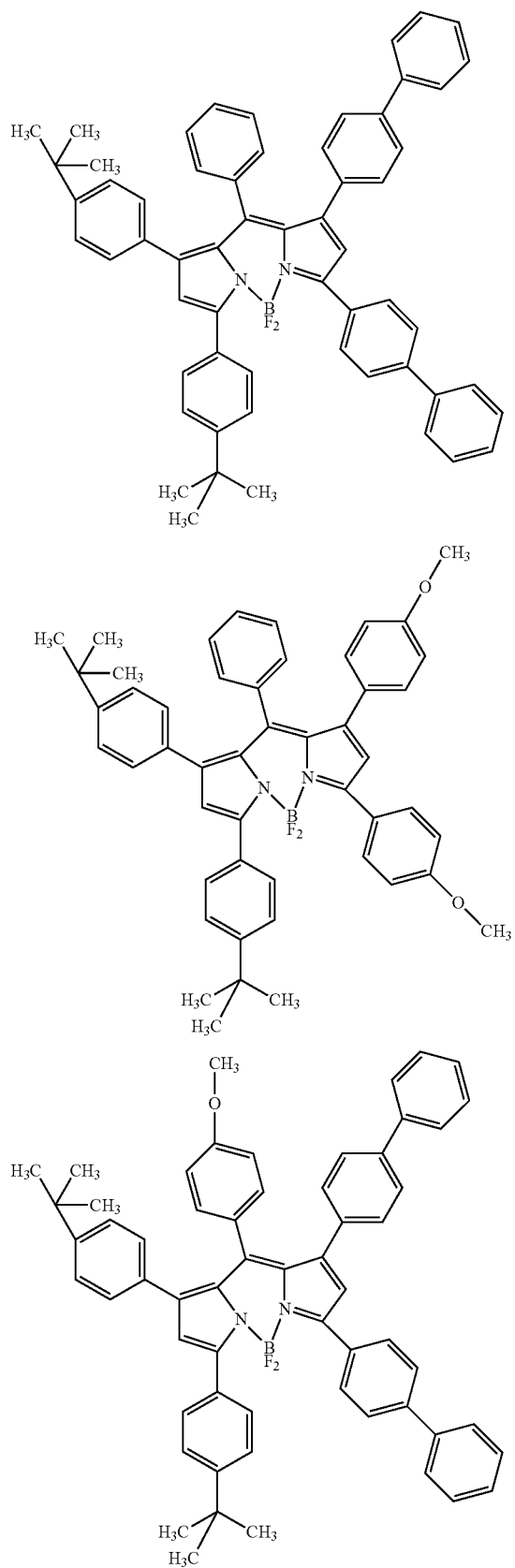
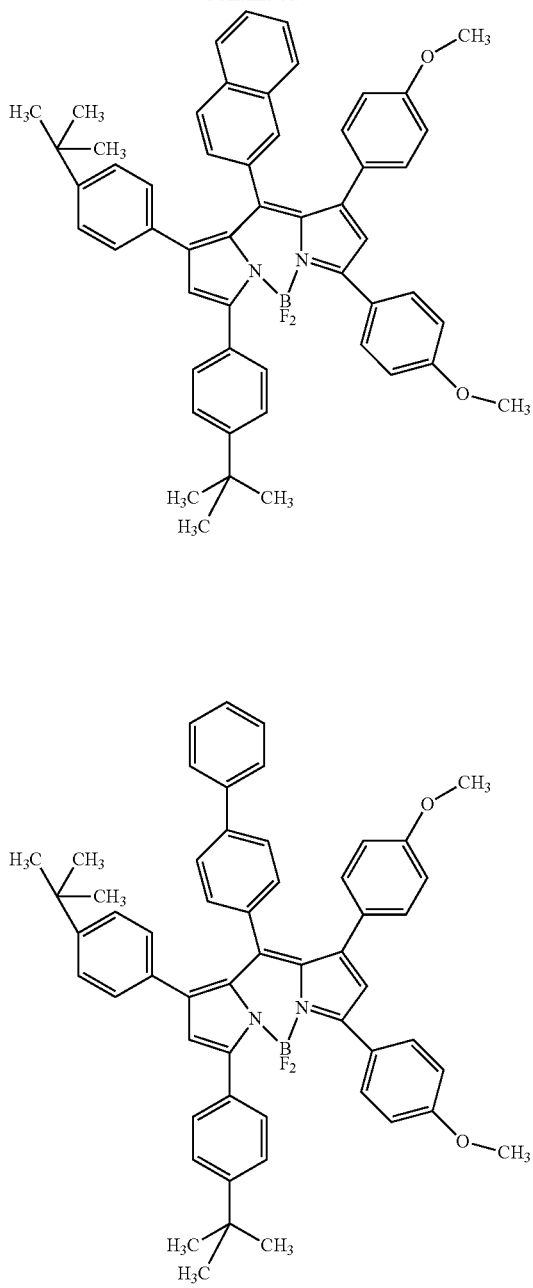
[Formula 69]
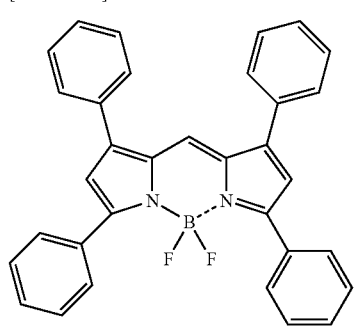

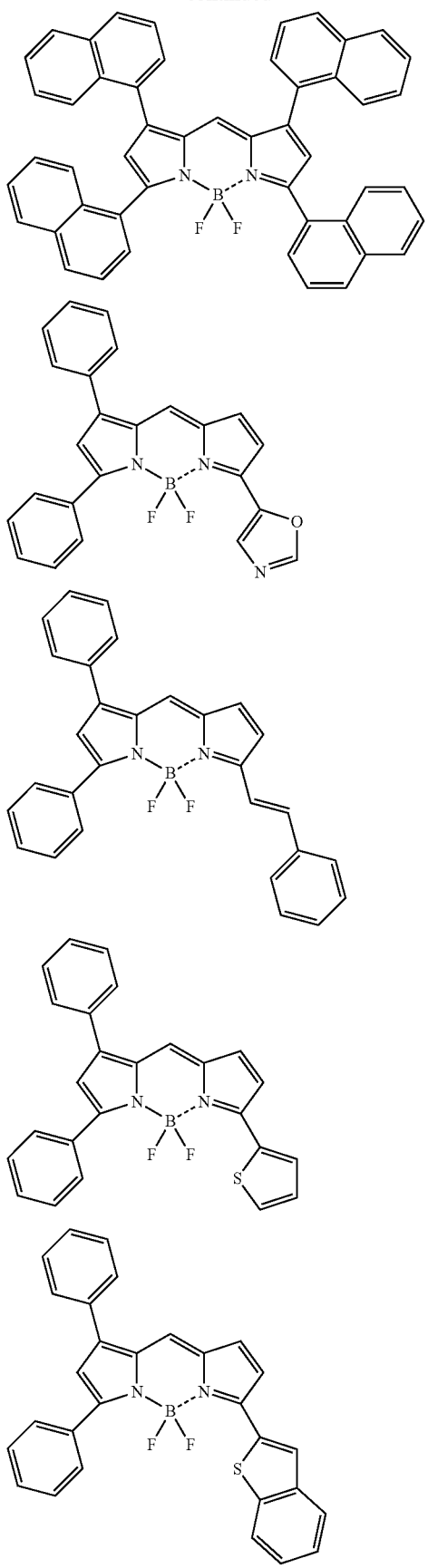
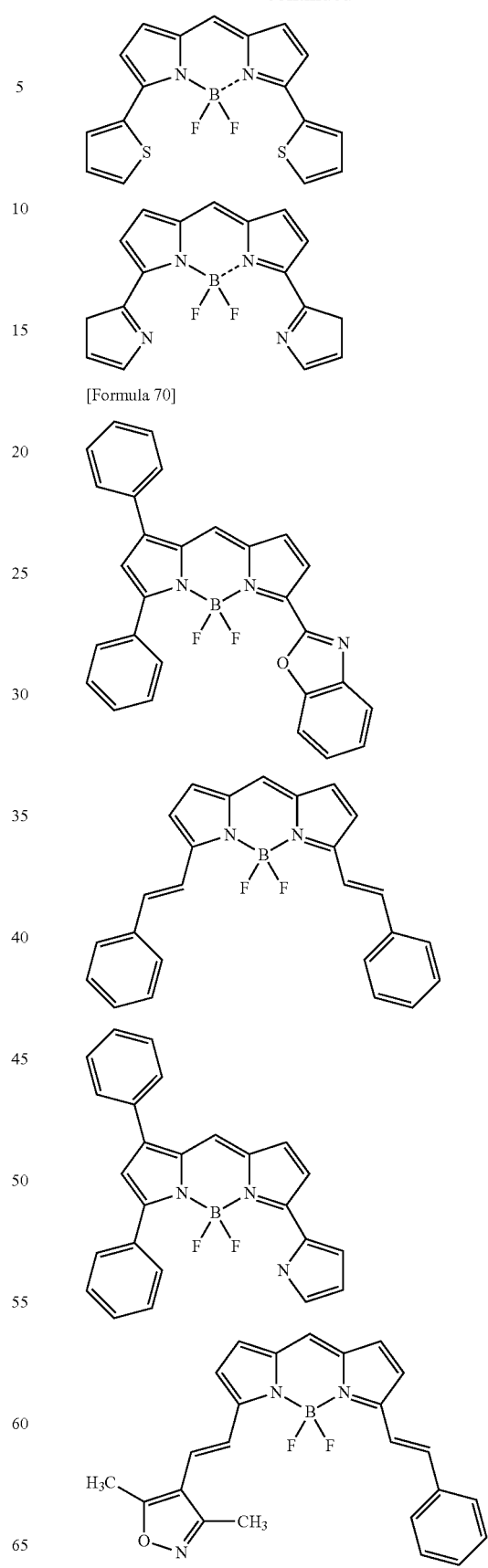
[Formula 70]

-continued
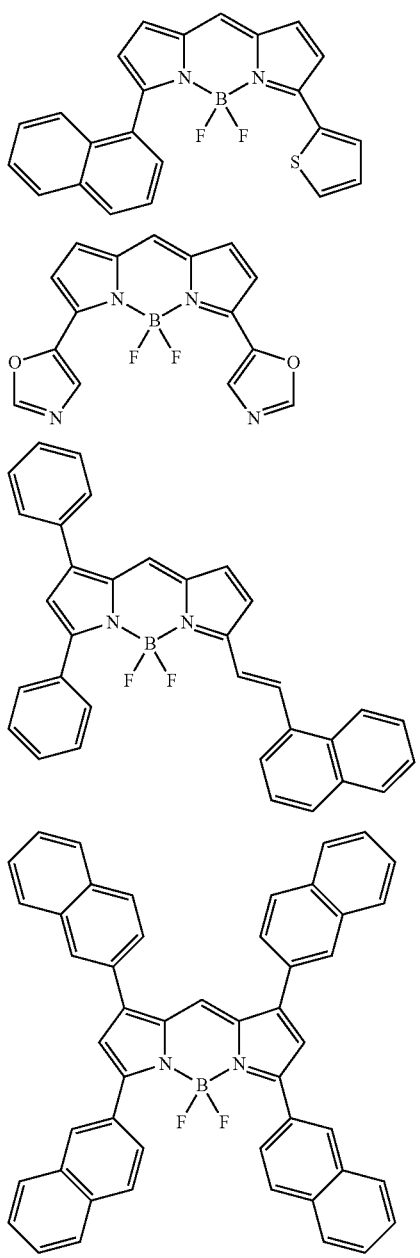
[Formula 71]
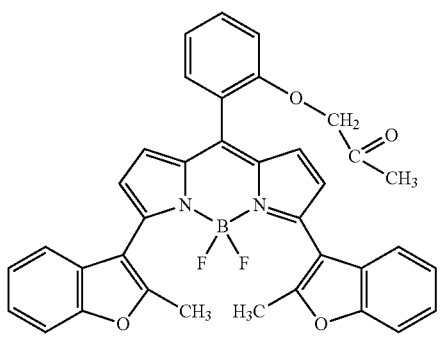
-continued
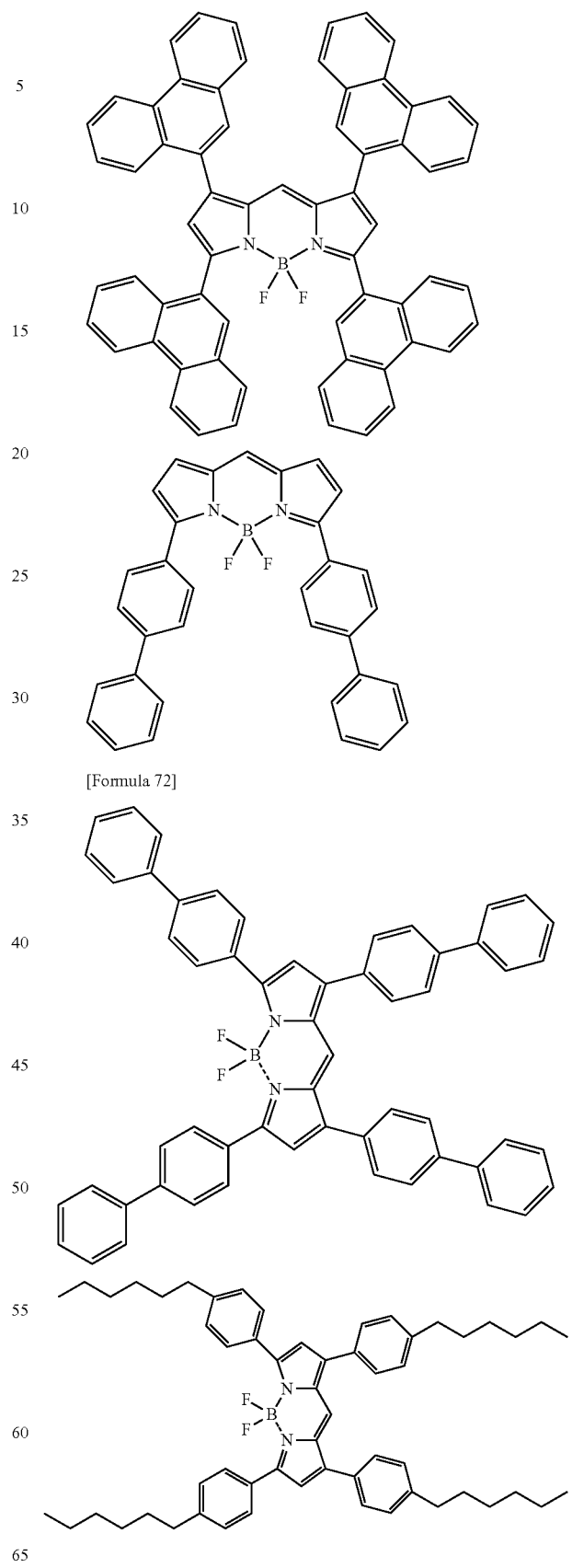
[Formula 72]

[Formula 73]
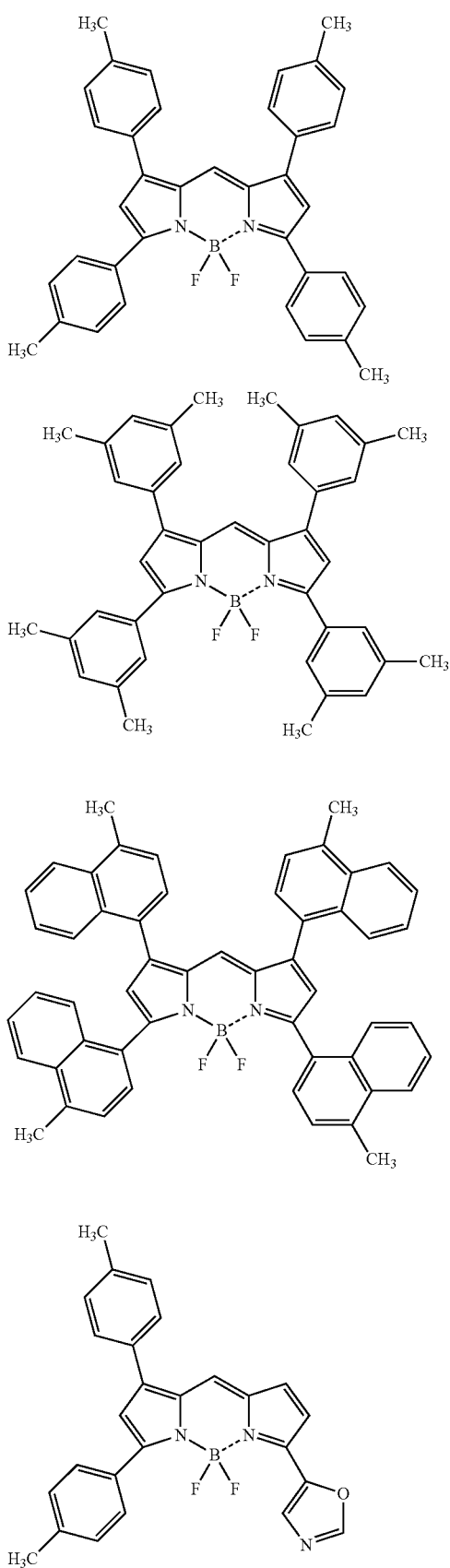
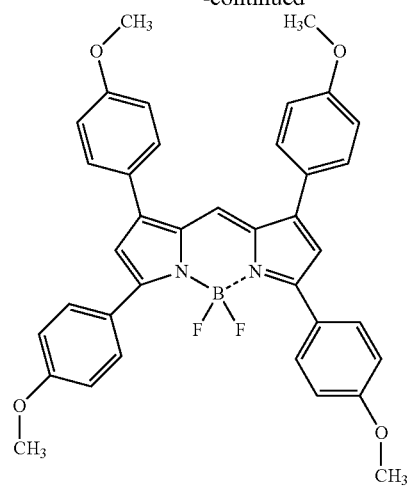
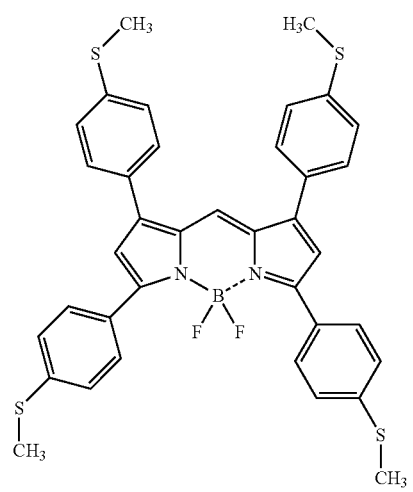
[Formula 74]
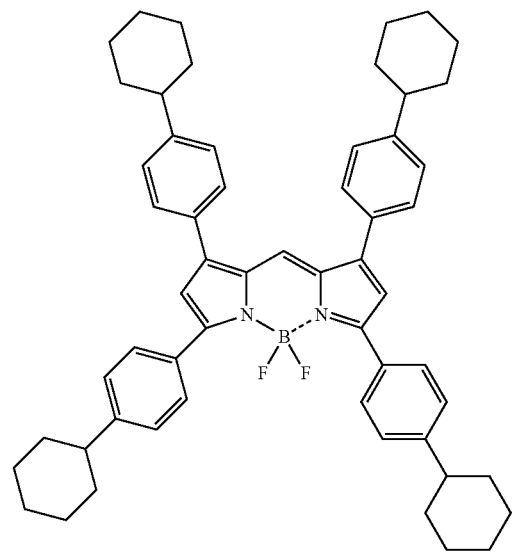

107
-continued
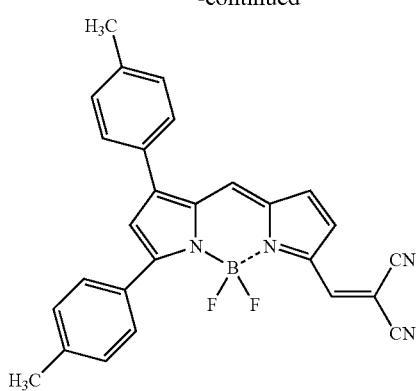
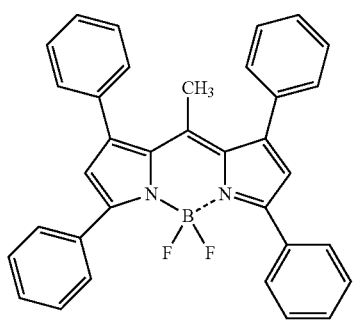
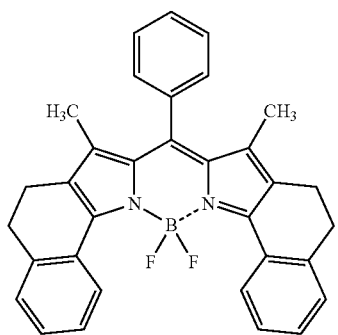
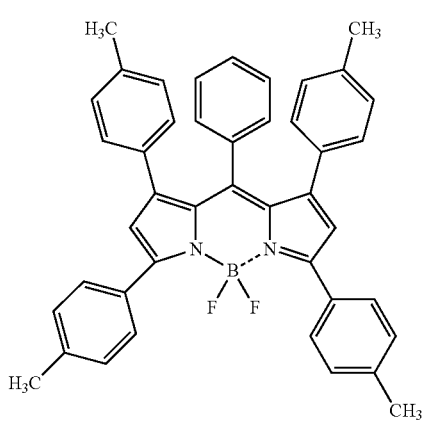
108
-continued
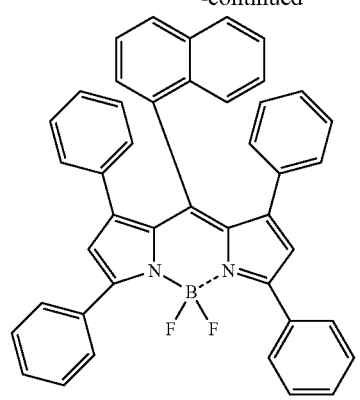
[Formula 75]
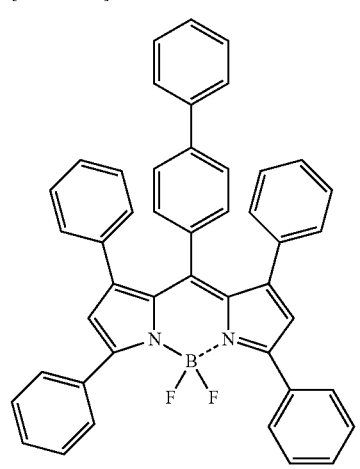
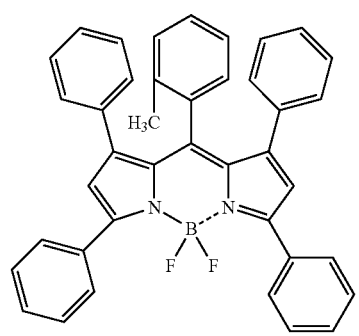
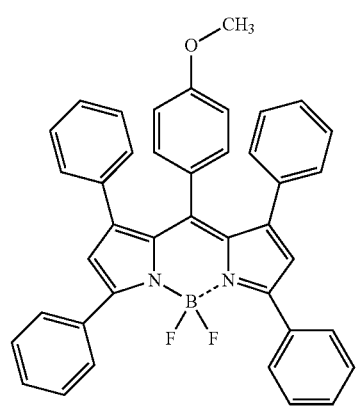

109
-continued
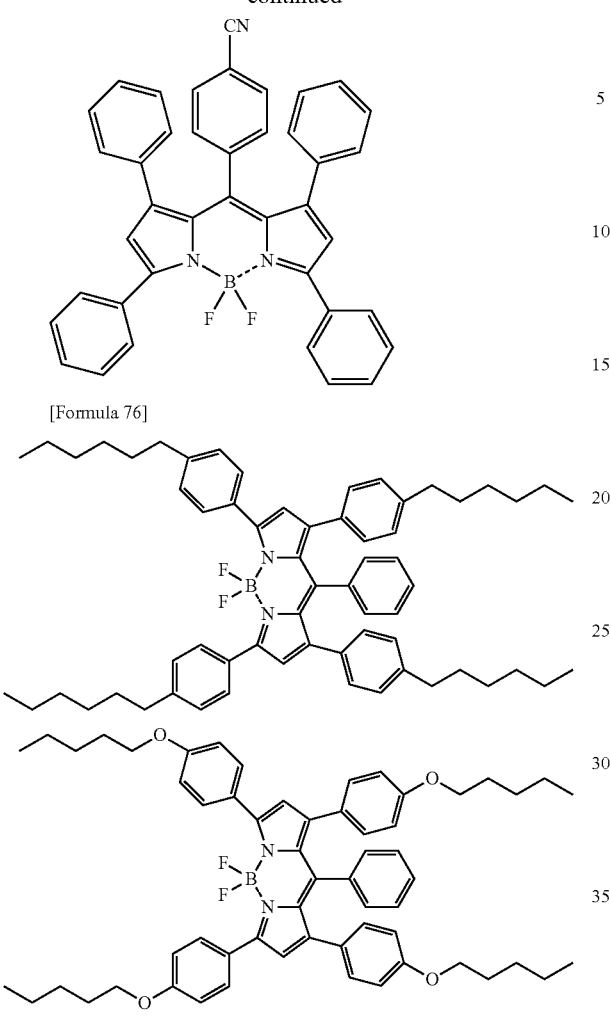
[Formula 76]
[Formula 77]
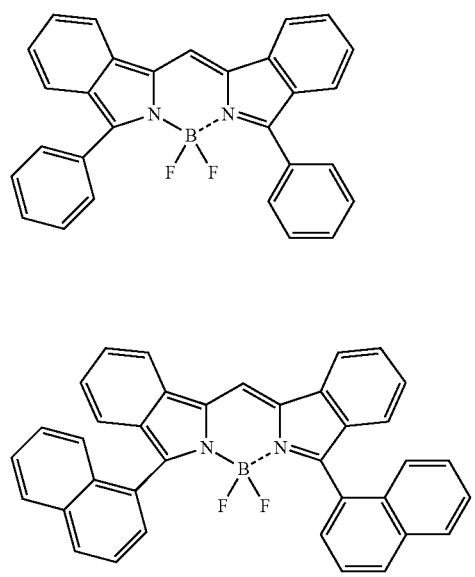
110
-continued
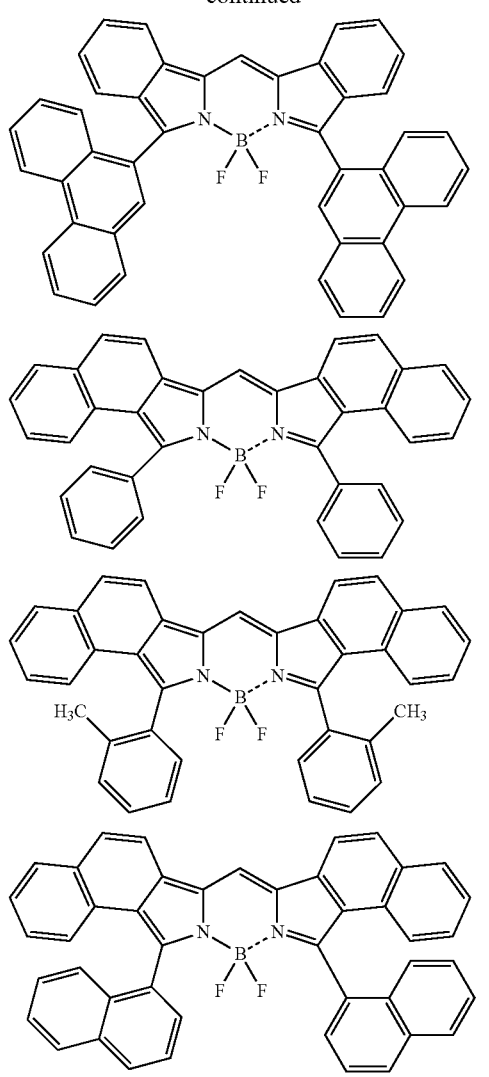
[Formula 78]

-continued
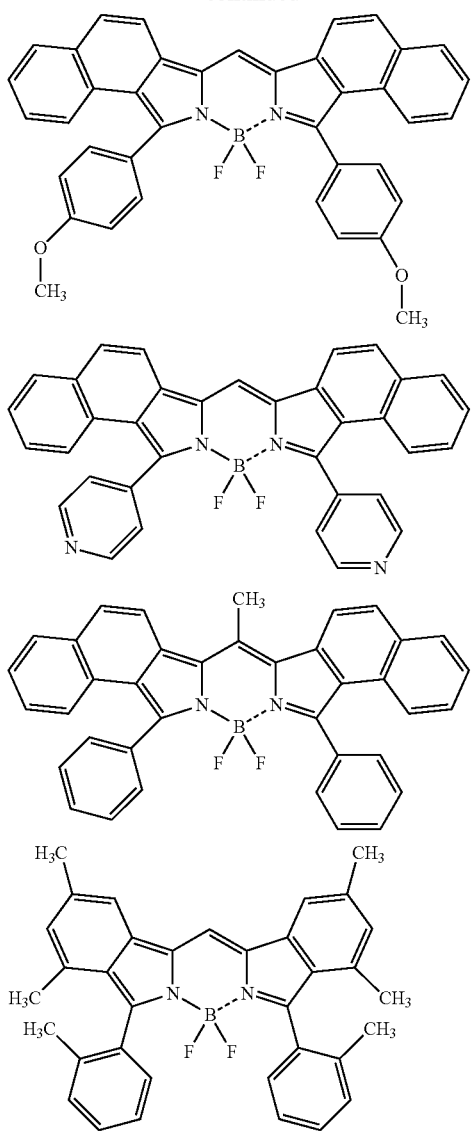
[Formula 79]
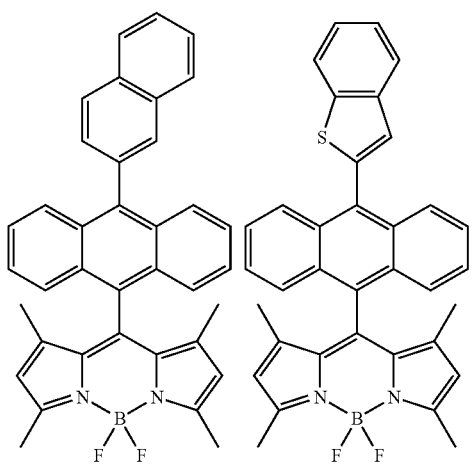
-continued
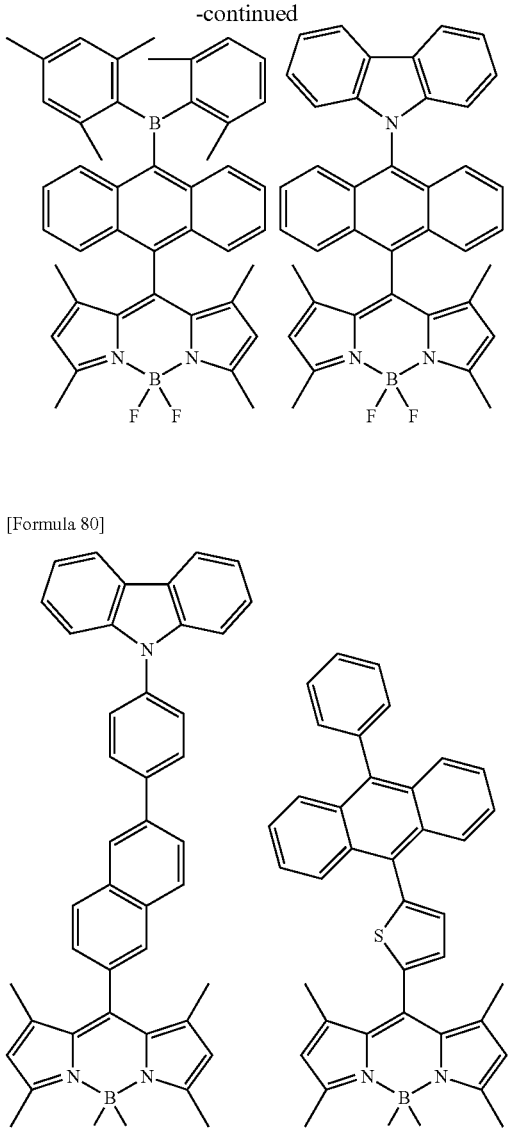
[Formula 80]
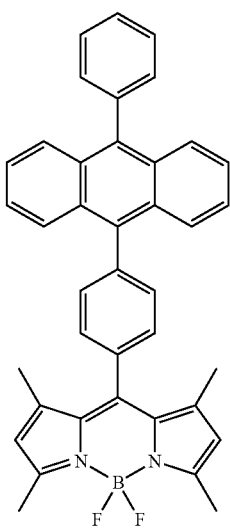

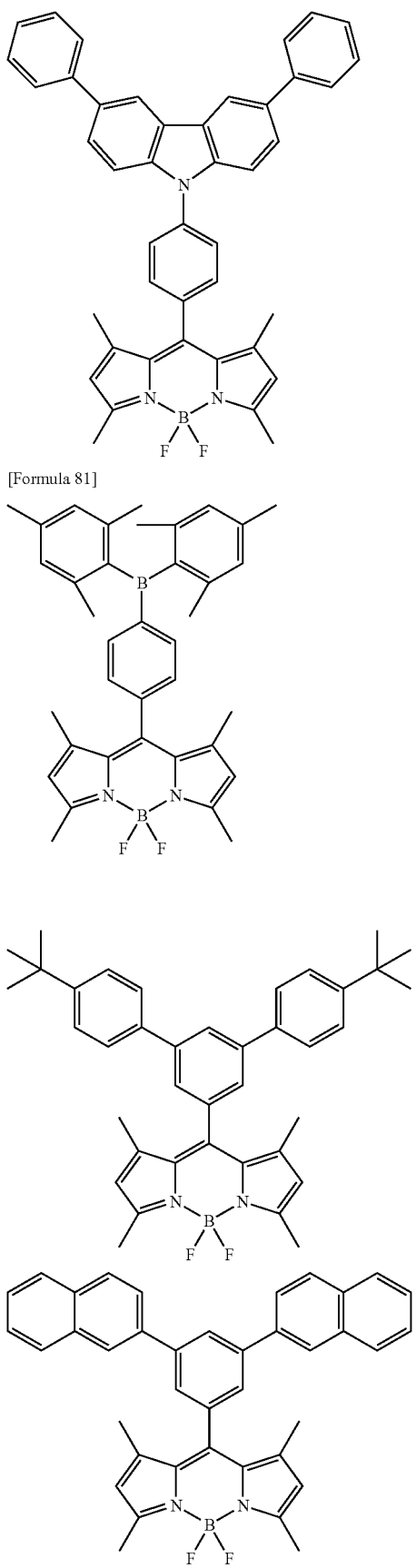
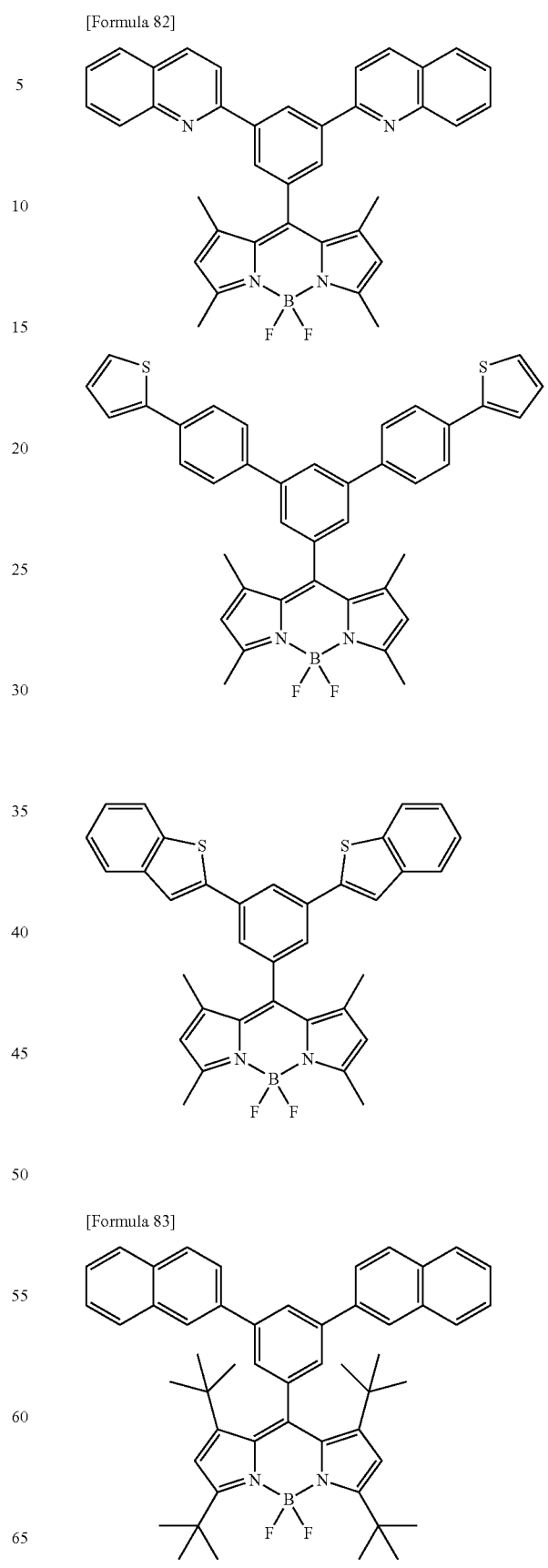

-continued
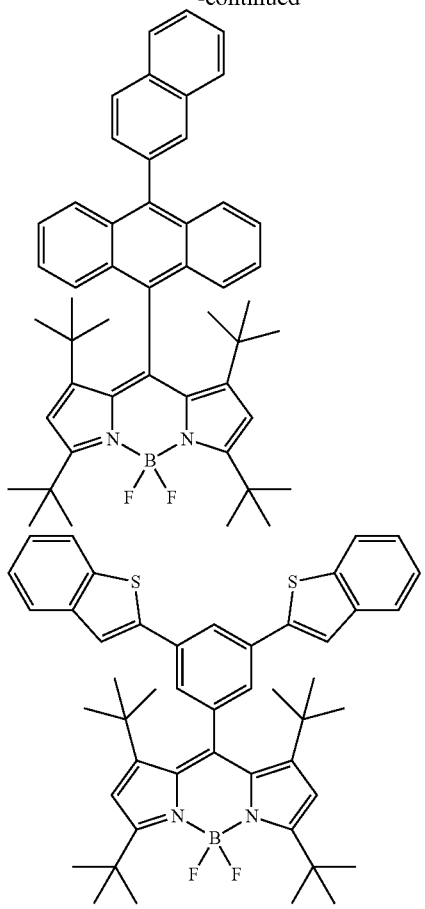
[Formula 84]
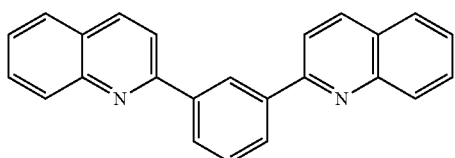
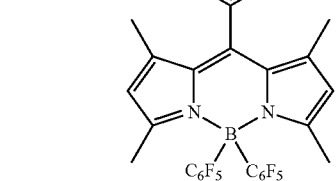
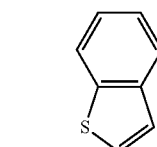
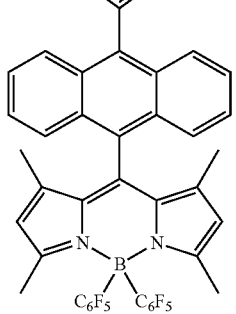
-continued
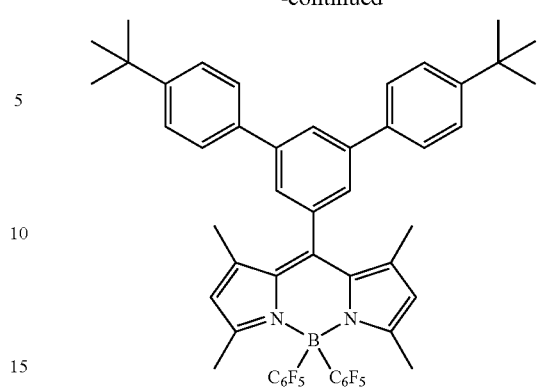
[Formula 85]
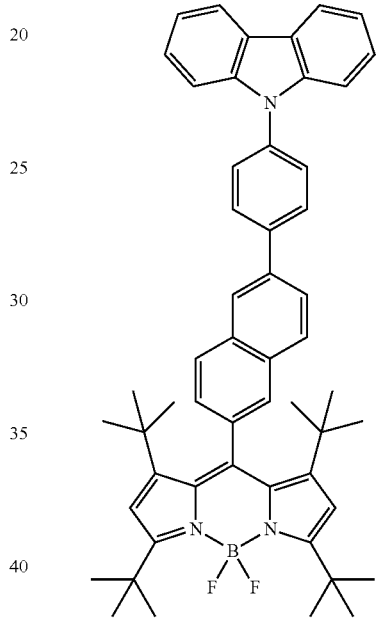
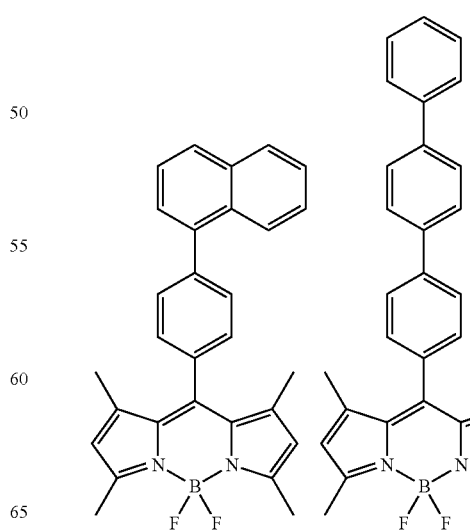

-continued
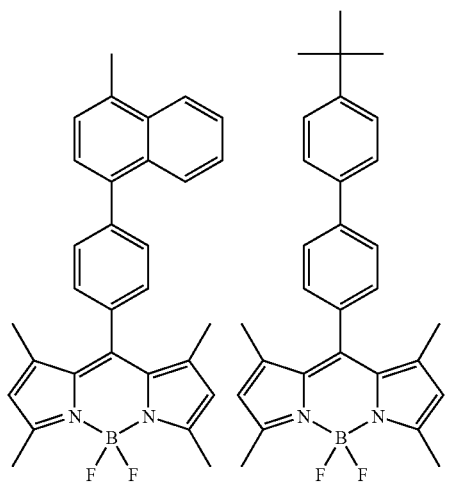
[Formula 86]
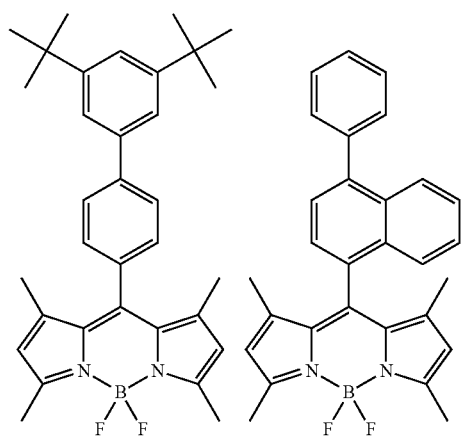
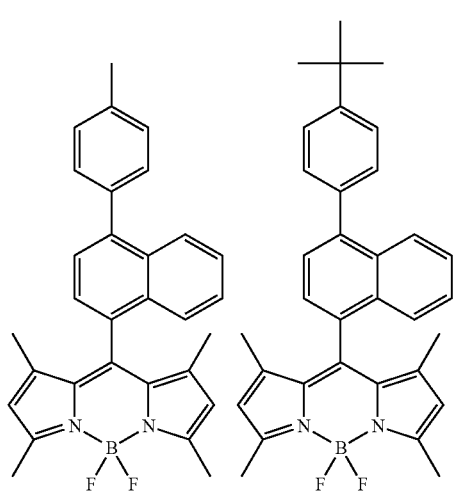
-continued
[Formula 87]
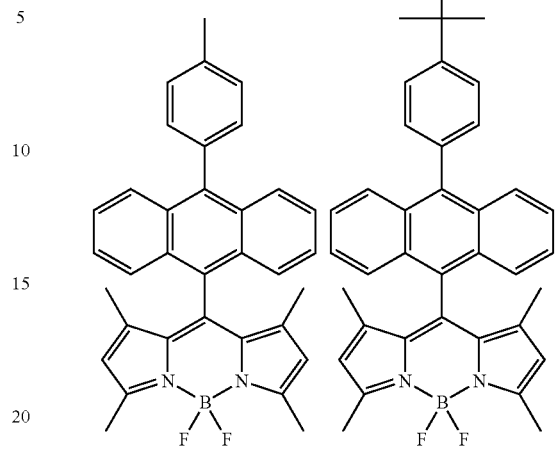
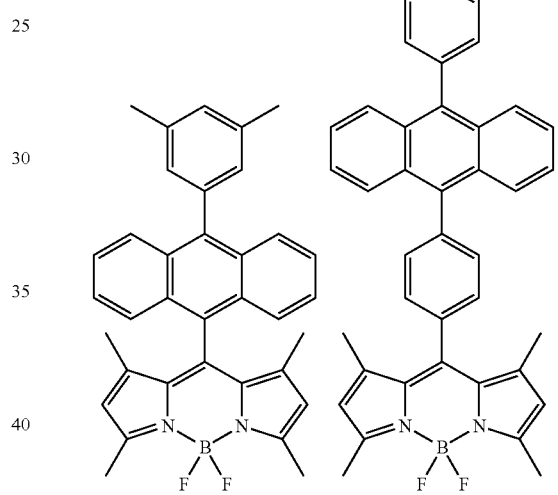
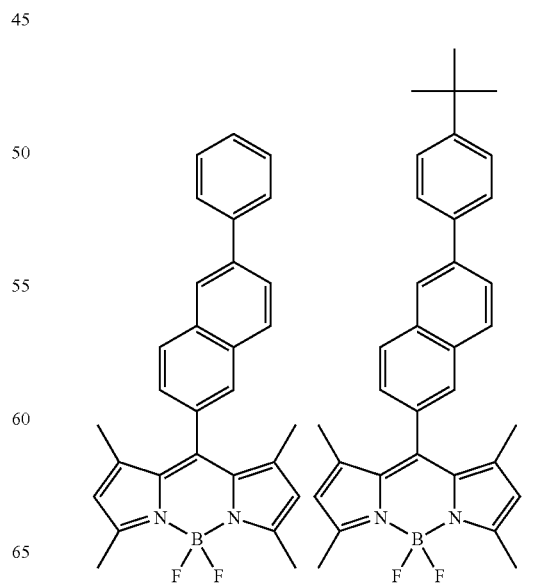

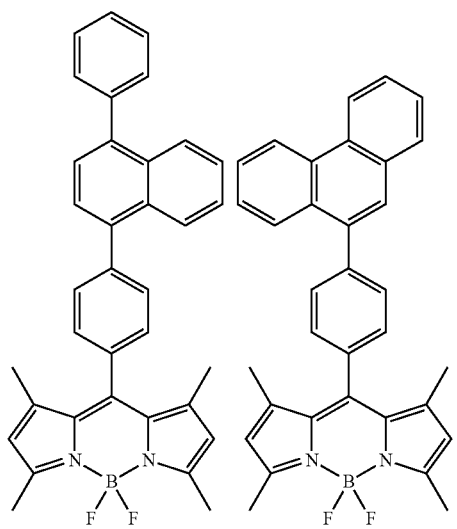
[Formula 88]
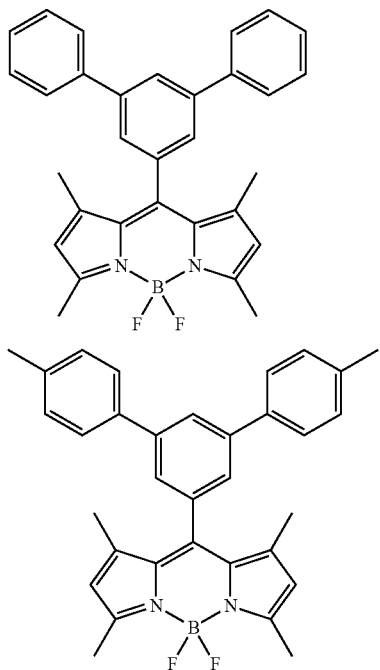
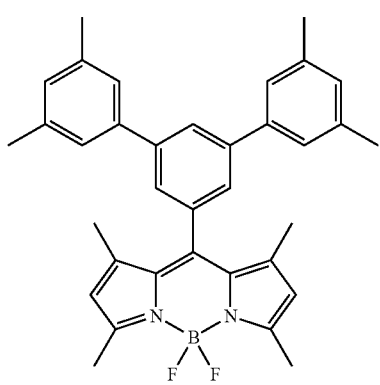
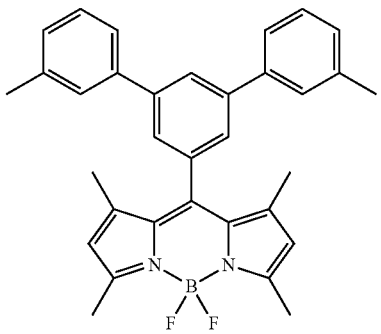
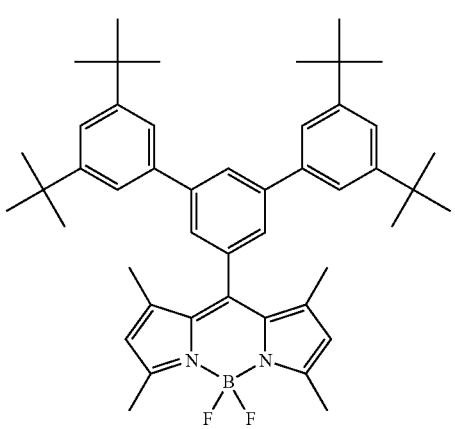
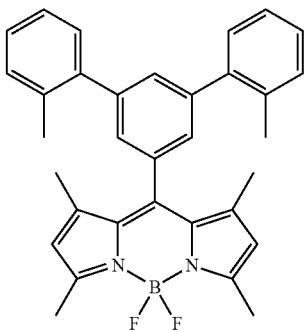
[Formula 89]
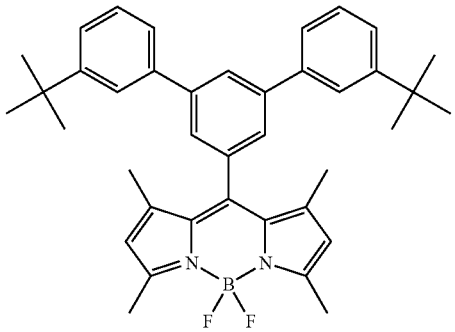

121
-continued
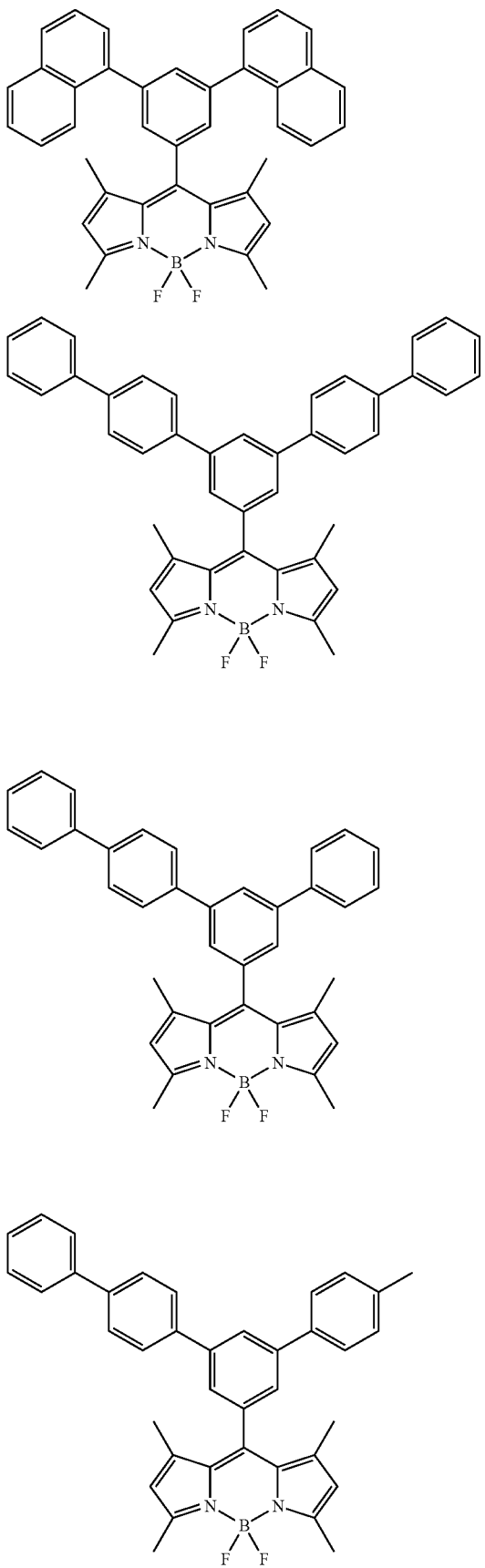
122
-continued
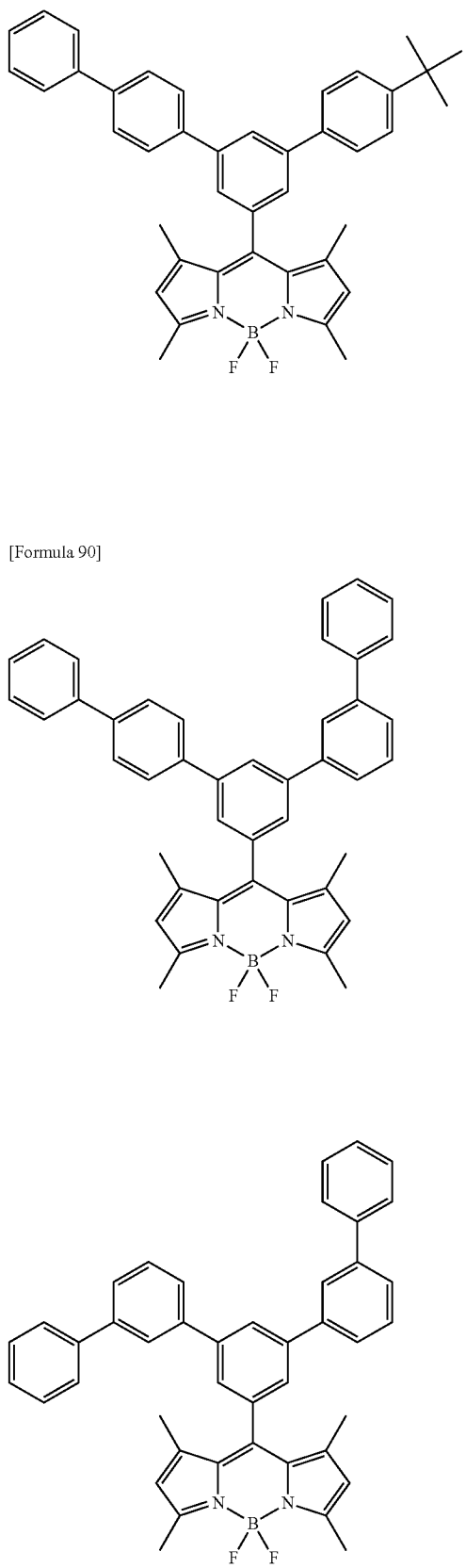
[Formula 90]

-continued
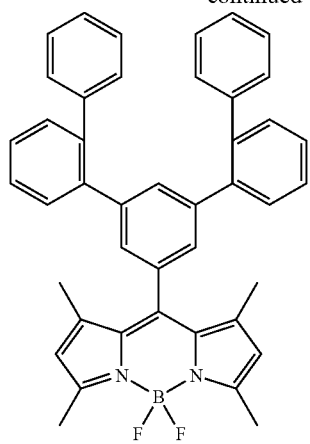
[Formula 91]
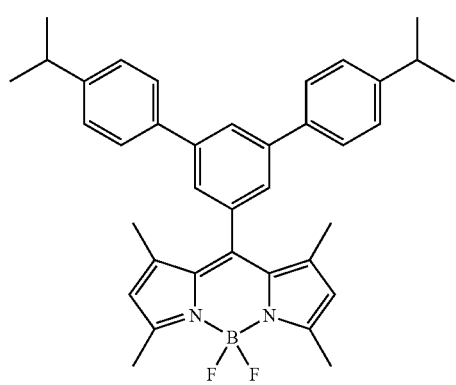
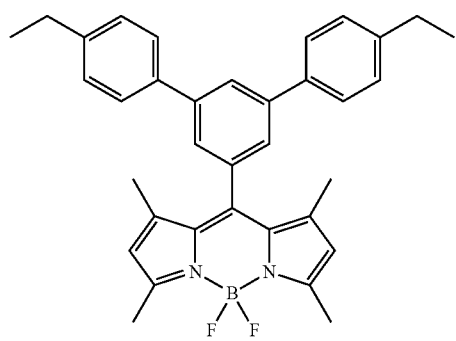
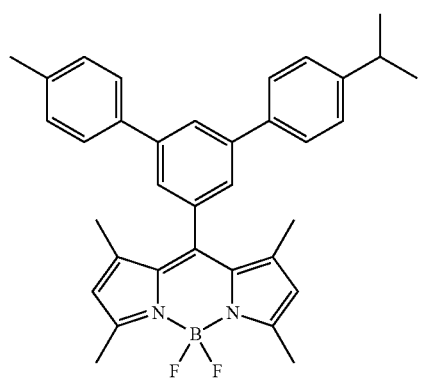
-continued
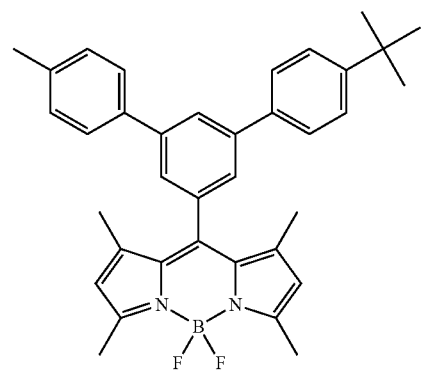
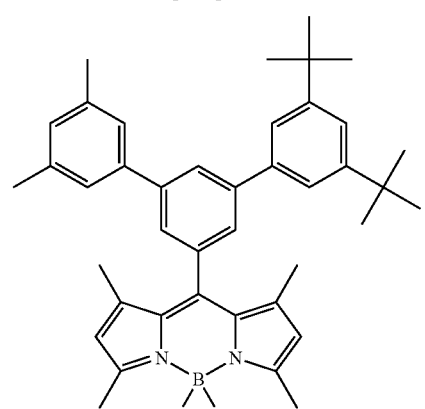
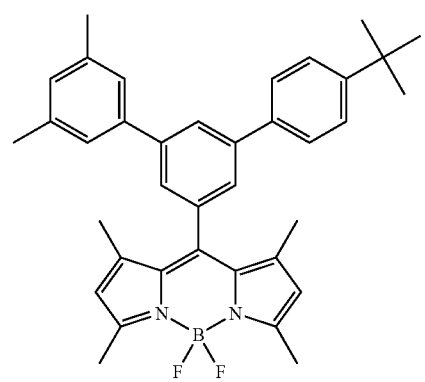
[Formula 92]
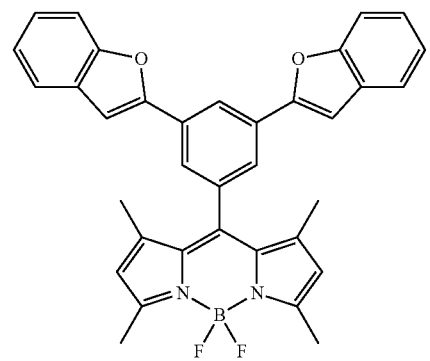

125
-continued
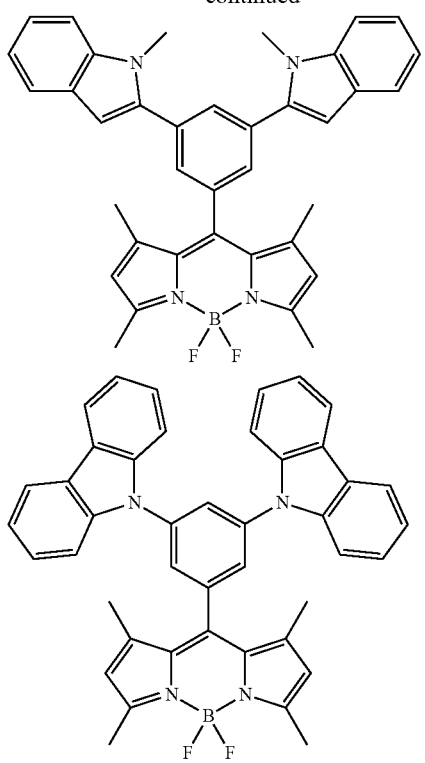
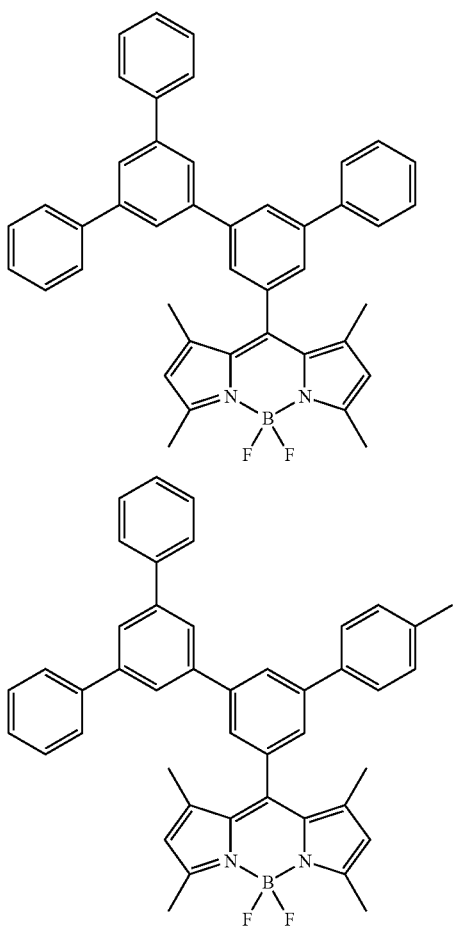
[Formula 93]
126
-continued
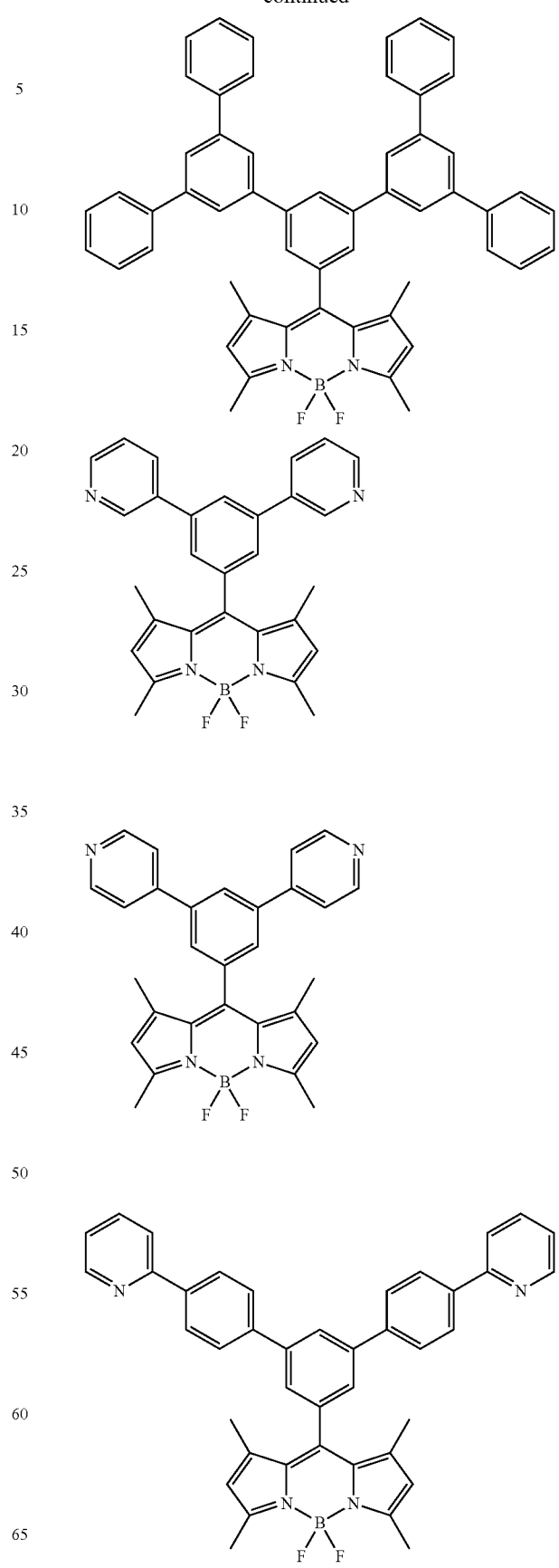

-continued
[Formula 94]
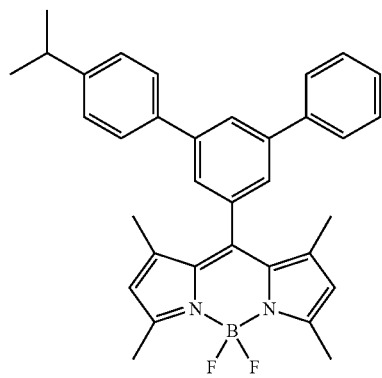
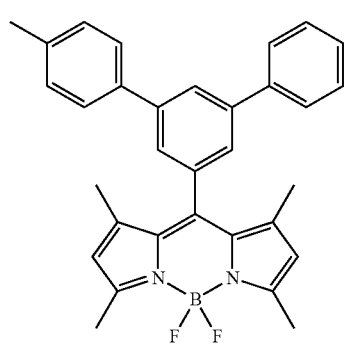
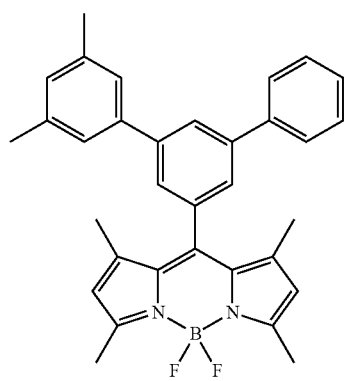
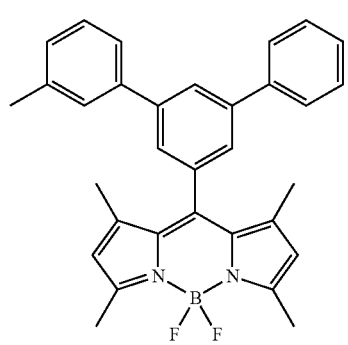
-continued
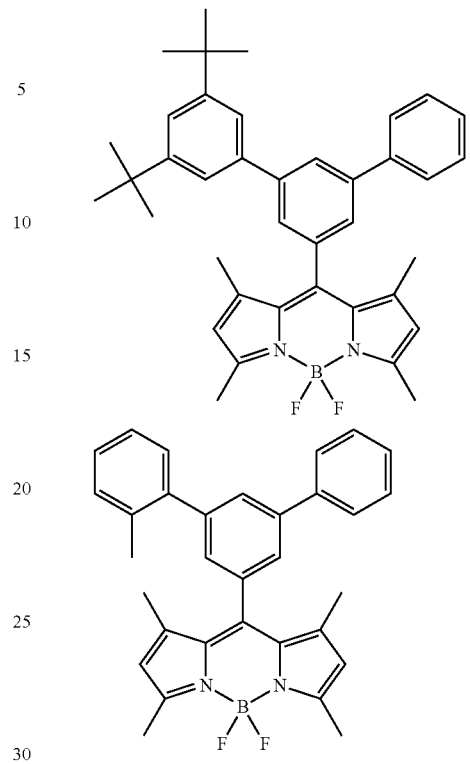
[Formula 95]
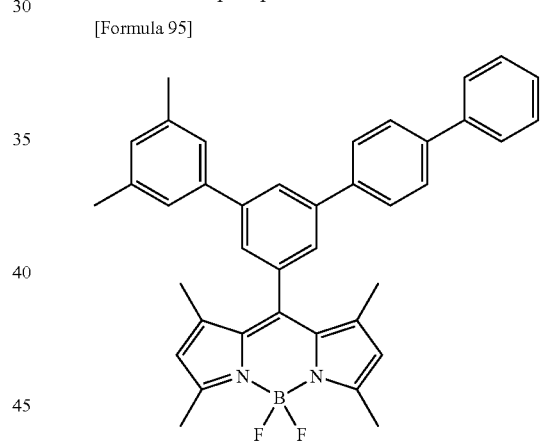
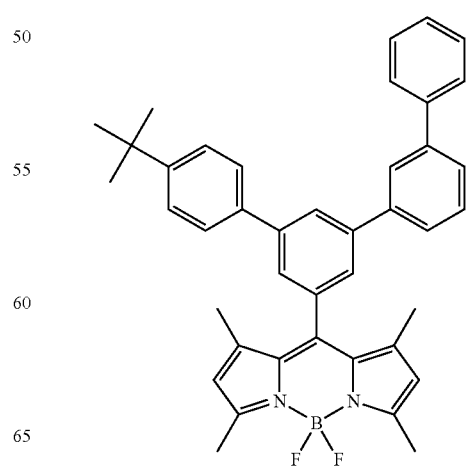

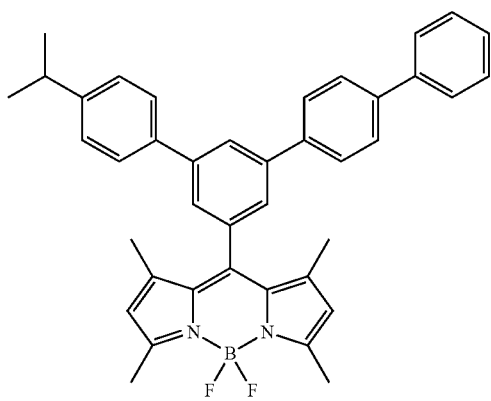
[Formula 96]
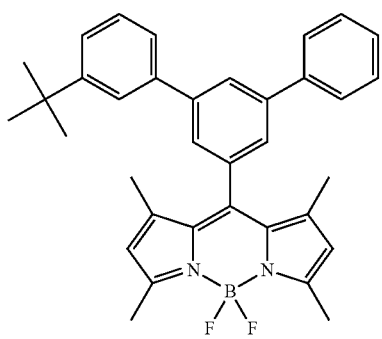
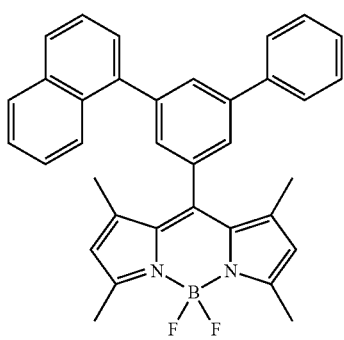
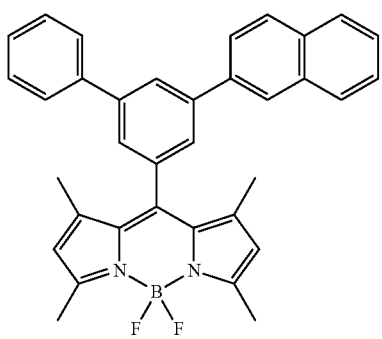
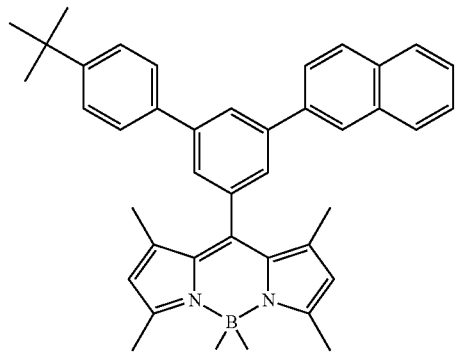
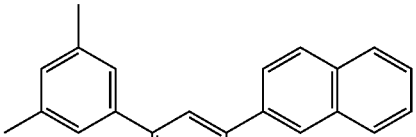
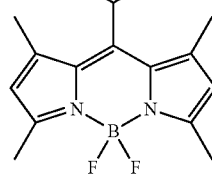
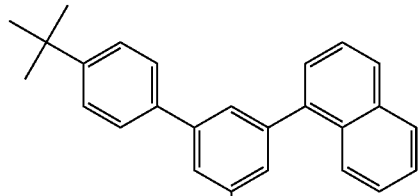
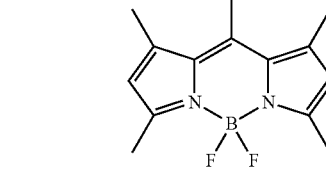
[Formula 97]
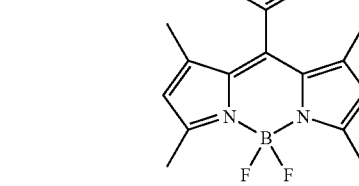

131
-continued
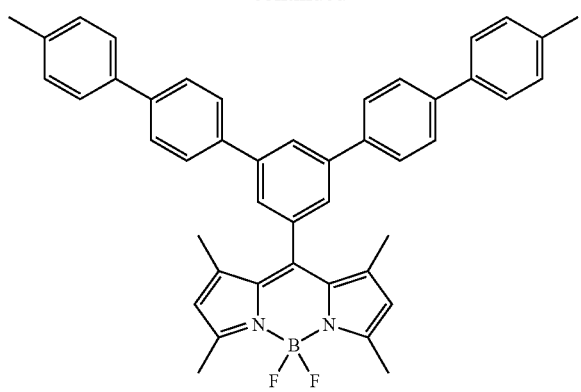
[Formula 98]
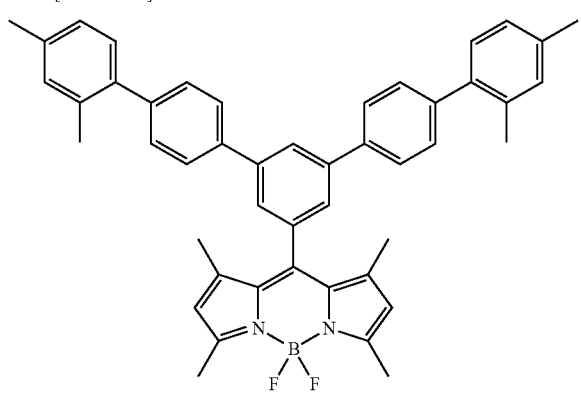
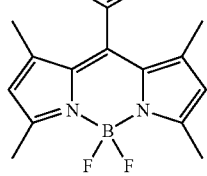
[Formula 99]
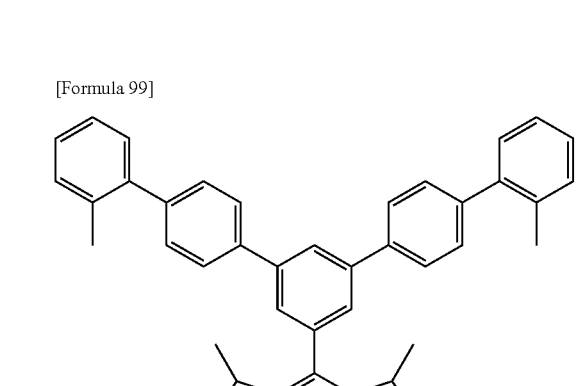
132
-continued
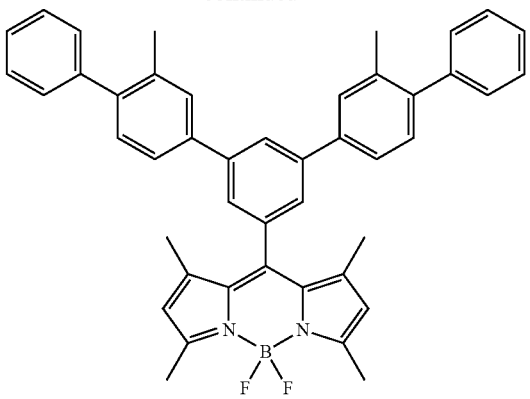
[Formula 100]
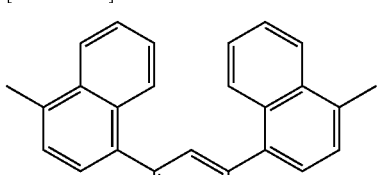
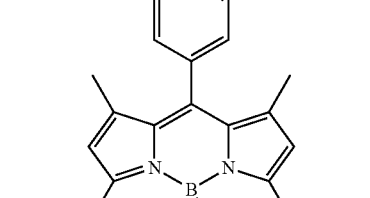
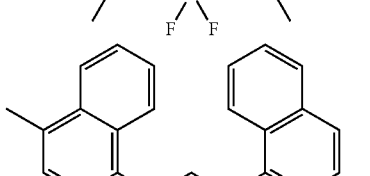
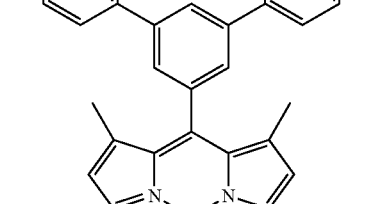
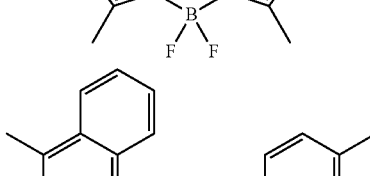
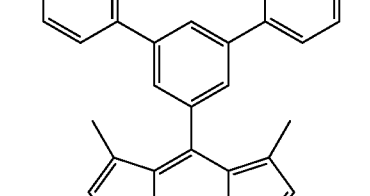
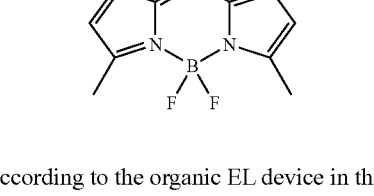
According to the organic EL device in the first exemplary embodiment, an organic EL device with high performance can be provided.

A typical compound used together with a fluorescent compound in the emitting layer is mainly an anthracene derivative. Since the anthracene derivative has a stronger electron transporting performance relative to a hole transporting performance, an improvement of carrier balance in the emitting layer has been difficult. Accordingly, reduction in a drive voltage of the organic EL device has been desired.

The organic EL device in the first exemplary embodiment contains the first compound exhibiting delayed fluorescence and the second compound having a specific structure represented by the formula (2) and the like in the emitting layer. It is inferred that use of the first compound having a bipolar performance in the organic EL device in the first exemplary embodiment improves carrier balance in the emitting layer, as compared with use of an anthracene derivative that is a typical fluorescent host. Consequently, it is inferred that the drive voltage of the organic EL device is reduced as compared with a drive voltage of a typical fluorescent device.

The organic EL device in the first exemplary embodiment preferably emits light exhibiting an emission peak in a wavelength range from 500 nm to 550 nm. In other words, a main peak wavelength of the light emitted from the organic EL device preferably falls within a range from 500 nm to 550 nm. When the organic EL device of the exemplary embodiment emits light, it is preferable that the second compound in the emitting layer 5 mainly emits light.

TADF Mechanism

In the organic EL device of the exemplary embodiment, the first compound is preferably a compound having a small $\Delta ST(M1)$ so that inverse intersystem crossing from the triplet energy level of the first compound to the singlet energy level thereof is easily caused by a heat energy given from the outside. An energy state conversion mechanism to perform spin exchange from the triplet state of electrically excited excitons within the organic EL device to the singlet state by inverse intersystem crossing is referred to as TADF Mechanism.

Figure 4:
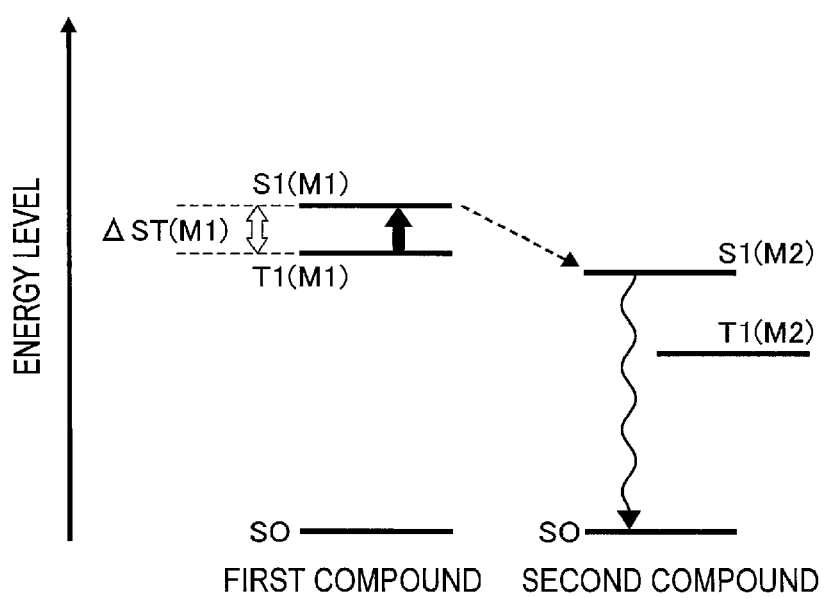
FIG. 4 shows a relationship between energy levels of a first compound and a second compound and an energy transfer between the first compound and the second compound in an emitting layer.

FIG. 4 shows an example of a relationship between energy levels of the first compound and the second compound in the emitting layer. In FIG. 4, S0 represents a ground state, S1(M1) represents a lowest singlet state of the first compound, T1(M1) represents a lowest triplet state of the first compound, S1(M2) represents a lowest singlet state of the second compound, T1(M2) represents a lowest triplet state of the second compound. A dashed arrow directed from S1(M1) to S1(M2) in FIG. 4 represents Förster energy transfer from the lowest singlet state of the first compound to the lowest singlet state of the second compound. In the exemplary embodiment, a difference between the lowest singlet state S1 and the lowest triplet state T1 is defined as $\Delta ST$.

As shown in FIG. 4, when a compound having a small $\Delta ST(M1)$ is used as the first compound, inverse intersystem crossing from the lowest triplet state T1(M1) to the lowest singlet state S1(M1) can be caused by a heat energy. Consequently, Förster energy transfer from the lowest singlet state S1(M1) of the first compound to the lowest singlet state S1(M2) of the second compound is caused. Consequently, fluorescence from the lowest singlet state S1(M2) of the second compound can be observed. It is inferred that the internal quantum efficiency can be theoretically raised up to 100% also by using delayed fluorescence by the TADF mechanism.

In the exemplary embodiment, a singlet energy S(M1) of the first compound is preferably larger than the singlet energy S(M2) of the second compound.

In the exemplary embodiment, an energy gap $T_{77K}(M1)$ at 77 [K] of the first compound is preferably larger than an energy gap $T_{77K}(M2)$ at 77 [K] of the second compound.

Relationship Between Triplet Energy and Energy Gap at 77K

Description will be made on a relationship between a triplet energy and an energy gap at 77K. In the exemplary embodiment, the energy gap at 77 [K] is different from a typical triplet energy in some aspects.

For general measurement of the triplet energy, a target compound to be measured is dissolved in a solvent to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. The triplet energy is calculated by a predetermined conversion equation based on a wavelength value at an intersection of the tangent and the abscissa axis.

The delayed fluorescent compound used in the exemplary embodiment is preferably a compound having a small $\Delta ST$. When $\Delta ST$ is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. The compound to be measured is dissolved in EPA (diethylether:isopentane:ethanol=5:5:2 in volume ratio) at a concentration of 10 μmol/L, and the resulting solution is set in a quartz cell to provide a measurement sample. A phosphorescent spectrum (ordinate axis: phosphorescent luminous intensity, abscissa axis: wavelength) of each of the samples is measured at a low temperature (77K). A tangent is drawn to the rise of the phosphorescent spectrum on the short-wavelength side. An energy amount is calculated as the energy gap $T_{77K}$ according to a conversion equation (F1) below based on a wavelength value $\lambda_{edge}$ (nm) at an intersection of the tangent and the abscissa axis.

$$T_{77K}[\text{eV}]=1239.85/\lambda_{edge} \quad \text{The conversion equation (F1):}$$

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent is checked at each point on the curve toward the long-wavelength of the phosphorescence spectrum. An inclination of the tangent was increased as the curve rose (i.e., a value of the ordinate axis was increased). A tangent drawn at a point of the maximum inclination (i.e., a tangent at an inflection point) is defined as the tangent to the rise of the phosphorescence spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being the closest to the short-wavelength side and having the maximum inclination is defined as a tangent to the rise of the phosphorescence spectrum on the short-wavelength side.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Singlet Energy S

Singlet energy S is measured as follows.

A 10-μmol/L toluene solution of a compound to be measured was prepared and put in a quartz cell. An absorption spectrum (ordinate axis: luminous intensity, abscissa axis: wavelength) of the thus-obtained sample was measured at a room temperature (300 K). A tangent was drawn to the fall of the absorption spectrum on the long-wavelength side, and a wavelength value $\lambda_{edge}$ (nm) at an intersection of the tangent and the abscissa axis was assigned to a conversion equation 2 below to calculate a singlet energy.

$$S[eV]=1239.85/\lambda_{edge} \quad \text{Conversion Equation 2:}$$

In the measurement of the singlet energy S, the absorption spectrum was measured using a spectrophotometer manufactured by Hitachi, Ltd. (device name: U3310). It should be noted that the absorption spectrum measuring device may be different from the above device.

The tangent to the fall of the absorption spectrum on the long-wavelength side is drawn as follows. While moving on a curve of the absorption spectrum from the maximum spectral value closest to the long-wavelength side in a long-wavelength direction, a tangent at each point on the curve was checked. An inclination of the tangent was decreased and increased in a repeated manner as the curve fell (i.e., a value of the ordinate axis was decreased). A tangent drawn at a point of the minimum inclination closest to the long-wavelength side (except when absorbance was 0.1 or less) was defined as the tangent to the fall of the absorption spectrum on the long-wavelength side.

The maximum absorbance of 0.2 or less is not included in the above-mentioned maximum absorbance on the long-wavelength si de.

Film Thickness of Emitting Layer

A film thickness of the emitting layer 5 of the organic EL device of the exemplary embodiment is preferably in a range from 5 nm to 50 nm, more preferably in a range from 7 nm to 50 nm, and further preferably in a range from 10 nm to 50 nm. When the film thickness of the emitting layer 5 is 5 nm or more, the emitting layer 5 is easily formable and chromaticity is easily adjustable. When the film thickness of the emitting layer 5 is 50 nm or less, an increase in the drive voltage is suppressible.

Content Ratio of Compounds in Emitting Layer

In the organic EL device 1 of the exemplary embodiment, a content ratio of the first compound in the emitting layer 5 is preferably in a range from 90 mass % to 99 mass % and a content ratio of the second compound in the emitting layer 5 is preferably in a range from 1 mass % to 10 mass %. An upper limit of the total of the respective content ratios of the first and second compounds in the emitting layer 5 is 100 mass %. It should be noted that the emitting layer 5 of the exemplary embodiment may further contain another material in addition to the first and second compounds.

Substrate

A substrate 2 is used as a support for the organic EL device 1. For instance, glass, quartz, plastics and the like are usable for the substrate 2. A flexible substrate is also usable. The flexible substrate is a bendable substrate, which is exemplified by a plastic substrate formed of polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, alloy, an electrically conductive compound and a mixture thereof, which have a large work function, specifically, of 4.0 eV or more, is preferably usable as the anode 3 formed on the substrate 2. Specific examples of the material for the anode include indium tin oxide (ITO), indium tin oxide containing silicon or silicon oxide, indium zinc oxide, tungsten oxide, indium oxide containing zinc oxide and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), or nitrides of a metal material (e.g., titanium nitride) are usable.

The above materials are typically deposited as a film by sputtering. For instance, indium zinc oxide can be deposited as a film by sputtering using a target that is obtained by adding zinc oxide in a range from 1 mass % to 10 mass % to indium oxide. Moreover, for instance, indium oxide containing tungsten oxide and zinc oxide can be deposited as a film by sputtering using a target that is obtained by adding tungsten oxide in a range from 0.5 mass % to 5 mass % and zinc oxide in a range from 0.1 mass % to 1 mass % to indium oxide. In addition, vapor deposition, coating, ink jet printing, spin coating and the like may be used for forming a film.

Among the organic layers formed on the anode 3, a hole injecting layer 6 formed adjacent to the anode 3 is formed of a composite material that facilitates injection of holes irrespective of the work function of the anode 3. Accordingly, a material usable as an electrode material (e.g., metal, alloy, an electrically conductive compound, a mixture thereof, and elements belonging to Groups 1 and 2 of the periodic table of the elements) is usable as the material for the anode 3.

The elements belonging to Groups 1 and 2 of the periodic table of the elements, which are materials having a small work function, namely, an alkali metal such as lithium (Li) and cesium (Cs) and an alkaline earth metal such as magnesium (Mg), calcium (Ca) and strontium (Sr), alloy thereof (e.g., MgAg, AlLi), a rare earth metal such as europium (Eu) and ytterbium (Yb), and alloy thereof are also usable as the material for the anode. When the anode 3 is formed of the alkali metal, alkaline earth metal and alloy thereof, vapor deposition and sputtering are usable. Further, when the anode is formed of silver paste and the like, coating, ink jet printing and the like are usable.

Hole Injecting Layer

A hole injecting layer 6 is a layer containing a highly hole-injectable substance. Examples of the highly hole-injectable substance include molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenyl carbazole-3-yl)-N-phenylamino]-9-phenyl carbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

Moreover, a high-molecule compound (e.g., an oligomer, dendrimer and polymer) is also usable as the highly hole-injectable substance. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamido] (abbreviation: PTPDMA), and poly[N,N'-bis(4-butylphenyl)-N,N'-bis(phenyl)benzidine] (abbreviation: Poly-TPD). Furthermore, the examples of the high-molecule compound include a high-molecule compound added with an acid such as poly(3,4-ethylene dioxythiophene)/poly(styrene sulfonic acid) (PEDOT/PSS), and polyaniline/poly(styrene sulfonic acid) (PAni/PSS).

Hole Transporting Layer

A hole transporting layer 7 is a layer containing a highly hole-transportable substance. An aromatic amine compound, carbazole derivative, anthracene derivative and the like are usable for the hole transporting layer 7. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BAFLP), 4,4'-bis[N-(9,9-dimethylfluoren-2-yl)-N-phenylamino]biphenyl (abbreviation: DFLDPBi), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB). The above-described substances mostly have a hole mobility of $10^{-6}$ cm$^2$/(V·s) or more.

A carbazole derivative (e.g., CBP, 9-[4-(N-carbazolyl)]phenyl-10-phenyl anthracene (CzPA), and 9-phenyl-3-[4-(10-phenyl-9-anthryl)phenyl]-9H-carbazole (PCzPA)) and an anthracene derivative (e.g., t-BuDNA, DNA, and DPAnth) may be used for the hole transporting layer 7. A high polymer compound such as poly(N-vinylcarbazole) (abbreviation: PVK) and poly(4-vinyltriphenylamine) (abbreviation: PVTPA) is also usable.

However, any substance having a hole transporting performance higher than an electron transporting performance may be used in addition to the above substances. A highly hole-transportable substance may be provided in the form of a single layer or a laminated layer of two or more layers of the above substance.

When the hole transporting layer includes two or more layers, one of the layers with a larger energy gap is preferably provided closer to the emitting layer 5.

In the exemplary embodiment, the hole transporting layer 7 preferably has a function of preventing triplet excitons generated in the emitting layer 5 from dispersing to the hole transporting layer to trap the triplet excitons in the emitting layer 5.

Electron Transporting Layer

An electron transporting layer 8 is a layer containing a highly electron-transportable substance. As the electron transporting layer, 1) a metal complex such as an aluminum complex, beryllium complex and zinc complex, 2) heteroaromatic compound such as an imidazole derivative, benzimidazole derivative, azine derivative, carbazole derivative, and phenanthroline derivative, and 3) a high-molecule compound are usable. Specifically, as a low-molecule organic compound, a metal complex such as Alq, tris(4-methyl-8-quinolinato)aluminum (abbreviation: Almq$_3$), bis(10-hydroxybenzo[h]quinolinato)beryllium (abbreviation: BeBq$_2$), BAlq, Znq, ZnPBO and ZnBTZ are usable. In addition to the metal complex, a heteroaromatic compound such as 2-(4-biphenyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenyl)-1,2,4-triazole (abbreviation: TAZ), 3-(4-tert-butylphenyl)-4-(4-ethylphenyl)-5-(4-biphenyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) are usable. In the exemplary embodiment, a benzimidazole compound is suitably usable. The above-described substances mostly have an electron mobility of $10^{-6}$ cm$^2$/(V·s) or more. However, any substance having an electron transporting performance higher than a hole transporting performance may be used for the electron transporting layer 8 in addition to the above substances. The electron transporting layer 8 may be provided in the form of a single layer or a laminated layer of two or more layers of the above substance(s).

Moreover, a high-molecule compound is also usable for the electron transporting layer 8. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)](abbreviation: PF-BPy) and the like are usable.

In the exemplary embodiment, the electron transporting layer 8 preferably has a function of preventing triplet excitons generated in the emitting layer 5 from dispersing to the electron transporting layer 8 and the electron injecting layer 9 to trap the triplet excitons in the emitting layer 5.

Electron Injecting Layer

An electron injecting layer 9 is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF2), and lithium oxide (LiOx). In addition, a compound containing an alkali metal, alkaline earth metal and a compound thereof in the electron transportable substance, specifically, a compound containing magnesium (Mg) in Alq and the like may be used. In this arrangement, electrons can be more efficiently injected from the cathode 4.

Alternatively, a composite material provided by mixing an organic compound with an electron donor may be used for the electron injecting layer 9. The composite material exhibits excellent electron injecting performance and electron transporting performance since the electron donor generates electron in the organic compound. In this arrangement, the organic compound is preferably a material exhibiting an excellent transforming performance of the generated electrons. Specifically, for instance, the above-described substance for the electron transporting layer 8 (e.g., the metal complex and heteroaromatic compound) is usable. The electron donor may be any substance exhibiting an electron donating performance to the organic compound. Specifically, an alkali metal, alkaline earth metal and a rare earth metal are preferable, examples of which include lithium, cesium, magnesium, calcium, erbium and ytterbium. Moreover, an alkali metal oxide and alkaline earth metal oxide are preferable, examples of which include lithium oxide, calcium oxide, and barium oxide. Further, Lewis base such as magnesium oxide is also usable. Furthermore, tetrathiafulvalene (abbreviation: TTF) is also usable.

Cathode

Metal, alloy, an electrically conductive compound, a mixture thereof and the like, which have a small work function, specifically, of 3.8 eV or less, is preferably usable as a material for the cathode 4. Specific examples of the material for the cathode include: the elements belonging to Groups 1 and 2 of the periodic table of the elements, namely, an alkali metal such as lithium (Li) and cesium (Cs) and an alkaline earth metal such as magnesium (Mg), calcium (Ca) and strontium (Sr); alloy thereof (e.g., MgAg, AlLi); a rare earth metal such as europium (Eu) and ytterbium (Yb); and alloy thereof.

When the cathode 4 is formed of the alkali metal, alkaline earth metal and alloy thereof, vapor deposition and sputtering are usable. Moreover, when the anode is formed of silver paste and the like, coating, ink jet printing and the like are usable.

By providing the electron injecting layer 9, various conductive materials such as Al, Ag, ITO, graphene and indium tin oxide containing silicon or silicon oxide are usable for forming the cathode 4 irrespective of the magnitude of the work function. The conductive materials can be deposited as a film by sputtering, ink jet printing, spin coating and the like.

Layer Formation Method(s)

A method for forming each layer of the organic EL device 1 in the exemplary embodiment is subject to no limitation except for the above particular description. However, known methods of dry film-forming and wet film-forming are applicable. Examples of the dry film-forming include vacuum deposition, sputtering, plasma and ion plating. Examples of the wet film-forming include spin coating, dipping, flow coating and ink-j et.

Film Thickness

A film thickness of each of the organic layers of the organic EL device 1 according to the exemplary embodiment is subject to no limitation except for the above particular description. The thickness is generally preferably in a range from several nanometers to 1 µm, since too small thickness are likely to cause defects such as a pin hole while too large thickness requires high voltage to be applied and lowers efficiency.

In the exemplary embodiment, the number of carbon atoms forming a ring (also referred to as ring carbon atoms) means the number of carbon atoms included in atoms forming the ring itself of a compound in which the atoms are bonded to form the ring (e.g., a monocyclic compound, a fused ring compound, a cross-linked compound, a carbocyclic compound, and a heterocyclic compound). When the ring is substituted by a substituent, carbon atom(s) included in the substituent is not counted as the ring carbon atoms. The same applies to the "ring carbon atoms" described below, unless particularly noted. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring or a naphthalene ring is substituted, for instance, by an alkyl group, the carbon atoms of the alkyl group are not counted as the ring carbon atoms. For instance, when a fluorene ring (inclusive of a spirofluorene ring) is bonded as a substituent to a fluorene ring, the carbon atoms of the fluorene ring as a substituent are not counted as the ring carbon atoms.

In the exemplary embodiment, the number of atoms forming a ring (also referred to as ring atoms) means the number of atoms forming the ring itself of a compound in which the atoms are bonded to form the ring (e.g., a monocyclic compound, a fused ring compound, a cross-linked compound, a carbocyclic compound, and a heterocyclic compound). Atom(s) not forming the ring (e.g., hydrogen atom(s) for saturating the valence of the atom which forms the ring) and atom(s) in a substituent by which the ring is substituted are not counted as the ring atoms. The same applies to the "ring atoms" described below, unless particularly noted. For instance, a pyridine ring has 6 ring atoms, a quinazoline ring has 10 ring atoms, and a furan ring has 5 ring atoms. Hydrogen atoms respectively bonded to carbon atoms of the pyridine ring or the quinazoline ring and atoms forming a substituent are not counted as the ring atoms. For instance, when a fluorene ring (inclusive of a spirofluorene ring) is bonded as a substituent to a fluorene ring, the atoms of the fluorene ring as a substituent are not included in the ring atoms.

Next, each of substituents described in the above formulae will be described.

Examples of the aromatic hydrocarbon group (occasionally referred to as an aryl group) having 6 to 30 ring carbon atoms or having 6 to 40 ring carbon atoms in the exemplary embodiment are a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aryl group in the exemplary embodiment preferably has 6 to 20 ring carbon atoms, more preferably 6 to 14 ring carbon atoms, further preferably 6 to 12 ring carbon atoms. Among the aryl group, a phenyl group, biphenyl group, naphthyl group, phenanthryl group, terphenyl group and fluorenyl group are particularly preferable. A carbon atom at a position 9 of each of 1-fluorenyl group, 2-fluorenyl group, 3-fluorenyl group and 4-fluorenyl group is preferably substituted by a substituted or unsubstituted alkyl group having 1 to 30 carbon atoms or a substituted or unsubstituted aryl group having 6 to 18 ring carbon atoms later described in the exemplary embodiment.

In the exemplary embodiment, the heterocyclic group (occasionally referred to as heteroaryl group, heteroaromatic ring group or aromatic heterocyclic group) having 5 to 30 ring atoms preferably contains at least one atom selected from the group consisting of nitrogen, sulfur, oxygen, silicon, selenium atom and germanium atom, and more preferably contains at least one atom selected from the group consisting of nitrogen, sulfur and oxygen.

Examples of the heterocyclic group (occasionally referred to as heteroaryl group, heteroaromatic ring group or aromatic heterocyclic group) having 5 to 30 ring atoms in the exemplary embodiment include a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group in the exemplary embodiment preferably has 5 to 20 ring atoms, more preferably 5 to 14 ring atoms. Among the above, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are particularly preferable. A nitrogen atom at a position 9 of each of 1-carbazolyl group, 2-carbazolyl group, 3-carbazolyl group and 4-carbazolyl group is preferably substituted by a substituted or unsubstituted aryl group having 6 to 30 ring carbon atoms or a substituted or unsubstituted heterocyclic group having 5 to 30 ring atoms in the exemplary embodiment.

In the exemplary embodiment, the heterocyclic group may be a group derived from any one of moieties represented by formulae (XY-1) to (XY-18).

[Formula 101]

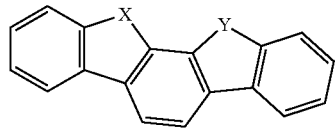
(XY-1)

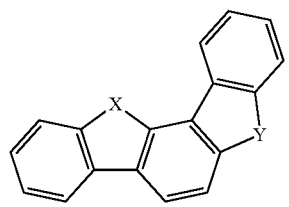
(XY-2)

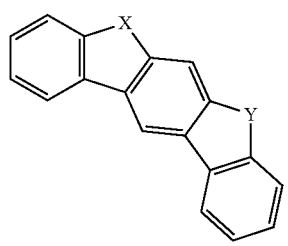
(XY-3)

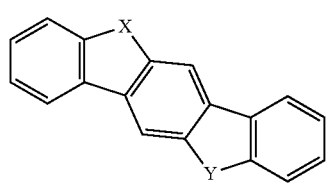
(XY-4)

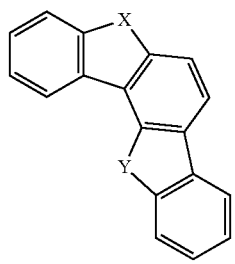
(XY-5)

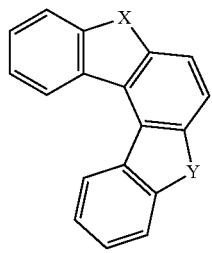
(XY-6)

[Formula 102]

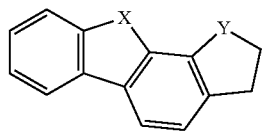
(XY-7)

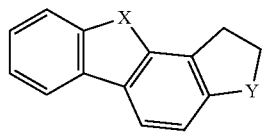
(XY-8)

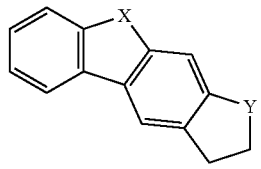
(XY-9)

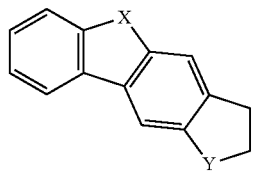
(XY-10)

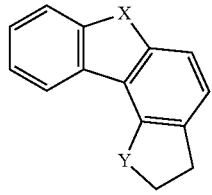
(XY-11)

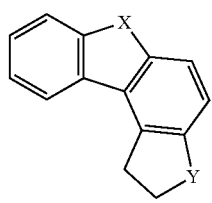
(XY-12)

[Formula 103]

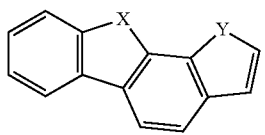
(XY-13)

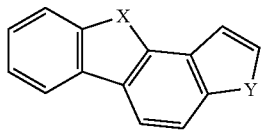
(XY-14)

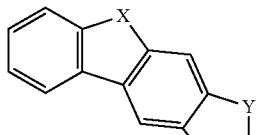
(XY-15)

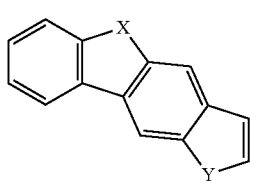
(XY-16)

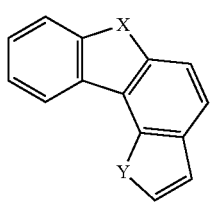
(XY-17)

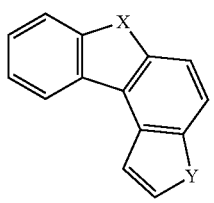
(XY-18)

In the formulae (XY-1) to (XY-18), X and Y are each independently a hetero atom, and are preferably an oxygen atom, sulfur atom, selenium atom, silicon atom or germanium atom. The moieties represented by the formulae (XY-1) to (XY-18) may each be bonded in any position to be a heterocyclic group, which may be substituted.

In the exemplary embodiment, examples of the substituted or unsubstituted carbazolyl group may include a group in which a carbazole ring is further fused with a ring(s) as shown in the following formulae. Such a group may be substituted. The group may be bonded in any position as desired.

[Formula 104]

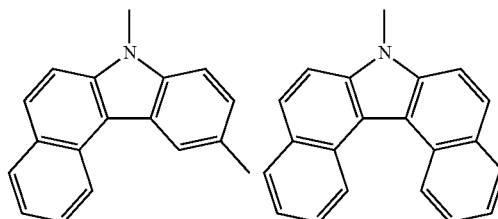

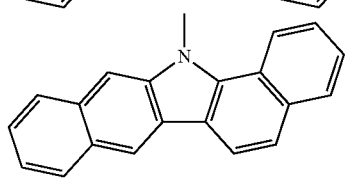

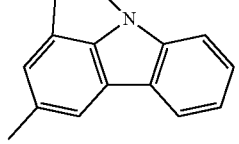

The alkyl group having 1 to 30 carbon atoms in the exemplary embodiment may be linear, branched or cyclic. Examples of the linear or branched alkyl group include: a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

The linear or branched alkyl group in the exemplary embodiment preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are particularly preferable.

Examples of the cycloalkyl group having 3 to 30 in the exemplary embodiment are a cyclopropyl group, cyclobutyl group, cyclopentyl group, cyclohexyl group, 4-metylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are particularly preferable.

A halogenated alkyl group provided by substituting an alkyl group with a halogen atom is exemplified by one provided by substituting an alkyl group having 1 to 30 carbon atoms with one or more halogen atoms. Specific examples of the above halogenated alkyl group are a fluoromethyl group, difluoromethyl group, trifluoromethyl group, fluoroethyl group, trifluoromethylmethyl group, trifluoroethyl group and pentafluoroethyl group.

Examples of the substituted silyl group in the exemplary embodiment are an alkylsilyl group having 3 to 30 carbon atoms and an aryl silyl group having 6 to 30 ring carbon atoms.

The alkylsilyl group having 3 to 30 carbon atoms in the exemplary embodiment is exemplified by a trialkylsilyl group having the above examples of the alkyl group having 1 to 30 carbon atoms. Specific examples of the alkylsilyl group are a trimethylsilyl group, triethyl silyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be the same or different.

Examples of the arylsilyl group having 6 to 30 ring carbon atoms in the exemplary embodiment are a dialkylarylsilyl group, alkyldiarylsilyl group and triarylsilyl group.

The dialkylarylsilyl group is exemplified by a dialkylarylsilyl group including two of the alkyl group listed as the examples of the alkyl group having 1 to 30 carbon atoms and one of the aryl group listed as the examples of the aryl group having 6 to 30 ring carbon atoms. The dialkylarylsilyl group preferably has 8 to 30 carbon atoms.

The alkyldiarylsilyl group is exemplified by an alkyldiarylsilyl group including one of the alkyl group listed as the examples of the alkyl group having 1 to 30 carbon atoms and two of the aryl group listed as the examples of the aryl group having 6 to 30 ring carbon atoms. The alkyldiarylsilyl group preferably has 13 to 30 carbon atoms.

The triarylsilyl group is exemplified by a triarylsilyl group including three of the aryl group listed as the examples of the aryl group having 6 to 30 ring carbon atoms. The triarylsilyl group preferably has 18 to 30 carbon atoms.

The alkoxy group having 1 to 30 carbon atoms in the exemplary embodiment is represented by —$OZ_1$. $Z_1$ is exemplified by the above alkyl group having 1 to 30 carbon atoms. Examples of the alkoxy group are a methoxy group, ethoxy group, propoxy group, butoxy group, pentyloxy group and hexyloxy group. The alkoxy group preferably has 1 to 20 carbon atoms.

A halogenated alkoxy group provided by substituting an alkoxy group with a halogen atom is exemplified by one provided by substituting an alkoxy group having 1 to 30 carbon atoms with one or more fluorine atoms.

The aryloxy group having 6 to 30 ring carbon atoms in the exemplary embodiment is represented by —$OZ_2$. $Z_2$ is exemplified by the above aryl group having 6 to 30 ring carbon atoms. The aryloxy group preferably has 6 to 20 ring carbon atoms. The aryloxy group is exemplified by a phenoxy group.

The alkylamino group having 2 to 30 carbon atoms is represented by —$NHR_V$ or —$N(R_V)_2$. $R_V$ is exemplified by the alkyl group having 1 to 30 carbon atoms.

The arylamino group having 6 to 60 ring carbon atoms is represented by —$NHR_W$ or —$N(R_W)_2$. $R_W$ is exemplified by the above aryl group having 6 to 30 ring carbon atoms.

The alkylthio group having 1 to 30 carbon atoms is represented by —$SR_V$. $R_V$ is exemplified by the alkyl group having 1 to 30 carbon atoms. The alkylthio group preferably has 1 to 20 carbon atoms.

The arylthio group having 6 to 30 ring carbon atoms is represented by —$SR_W$. $R_W$ is exemplified by the above aryl group having 6 to 30 ring carbon atoms. The arylthio group preferably has 6 to 20 ring carbon atoms.

Examples of the halogen atom include a fluorine atom, chlorine atom, bromine tom and iodine atom, among which a fluorine atom is preferable.

An aldehyde group, carbonyl group, ester group, carbamoyl group and amino group may be substituted by an aliphatic hydrocarbon, alicyclic hydrocarbon, aromatic hydrocarbon, heterocycle or the like. The aliphatic hydrocarbon, alicyclic hydrocarbon, aromatic hydrocarbon, and heterocycle may further have a substituent.

A siloxanyl group is a silicon-compound group with an ether bond and is exemplified by a trimethyl siloxanyl group.

In the exemplary embodiment, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

In the exemplary embodiment, a hydrogen atom includes isotope having different numbers of neutrons, specifically, protium, deuterium and tritium.

Examples of the substituent meant by "substituted or unsubstituted" are an alkenyl group, alkynyl group, aralkyl group, halogen atom, cyano group, hydroxyl group, nitro group and carboxy group, in addition to the above-described aryl group, heterocyclic group, alkyl group (linear or branched alkyl group, cycloalkyl group and haloalkyl group), alkylsilyl group, arylsilyl group, alkoxy group, aryloxy group, alkylamino group, arylamino group, alkylthio group, and arylthio group.

Among the above substituents, an aryl group, heterocyclic group, alkyl group, halogen atom, alkylsilyl group, arylsilyl group and cyano group are preferable. More preferable substituents are one listed as the preferable substituents described for each substituent.

The above substituents may be further substituted by an alkenyl group, alkynyl group, aralkyl group, halogen atom, cyano group, hydroxyl group, nitro group and carboxy group, in addition to the above-described aryl group, heterocyclic group, alkyl group, alkylsilyl group, arylsilyl group, alkoxy group, aryloxy group, alkylamino group, arylamino group, alkylthio group, and arylthio group. In addition, plural ones of these substituents may be mutually bonded to form a ring.

The alkenyl group is preferably an alkenyl group having 2 to 30 carbon atoms, which may be linear, branched or cyclic. Examples of the alkenyl group include a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group, and cyclohexadienyl group.

The alkynyl group is preferably an alkynyl group having 2 to 30 carbon atoms, which may be linear, branched or cyclic. Examples of the alkynyl group include ethynyl, propynyl, and 2-phenylethynyl.

The aralkyl group is preferably an aralkyl group having 6 to 30 ring carbon atoms and is represented by —$Z_3$-$Z_4$. $Z_3$ is exemplified by an alkylene group corresponding to the above alkyl group having 1 to 30 carbon atoms. $Z_4$ is exemplified by the above aryl group having 6 to 30 ring carbon atoms. This aralkyl group is preferably an aralkyl group having 7 to 30 carbon atoms, in which an aryl moiety has 6 to 30 carbon atoms, preferably 6 to 20 carbon atoms, more preferably 6 to 12 carbon atoms and an alkyl moiety has 1 to 24 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

"Unsubstituted" in "substituted or unsubstituted" means that a group is not substituted by the above-described substituents but bonded with a hydrogen atom.

In the exemplary embodiment, "XX to YY carbon atoms" in the description of "substituted or unsubstituted ZZ group having XX to YY carbon atoms" represent carbon atoms of an unsubstituted ZZ group and do not include carbon atoms of a substituent(s) of a substituted ZZ group. "YY" is larger than "XX" and each of "XX" and "YY" represents an integer of 1 or more.

In the exemplary embodiment, "XX to YY atoms" in the description of "substituted or unsubstituted ZZ group having XX to YY atoms" represent atoms of an unsubstituted ZZ group and does not include atoms of a substituent(s) of a substituted ZZ group. "YY" is larger than "XX" and each of "XX" and "YY" represents an integer of 1 or more.

In the exemplary embodiment, when substituents are mutually bonded to form a cyclic structure, the cyclic structure is a saturated ring, unsaturated ring, aromatic hydrocarbon ring, or a heterocyclic ring.

In the exemplary embodiment, examples of the aromatic hydrocarbon group and the heterocyclic group for the linking group include a divalent or multivalent group obtained by removing at least one atom from the above-described monovalent groups.

Moreover, in the exemplary embodiment, examples of the aromatic hydrocarbon group and the heterocyclic group include cyclic structures from which the above-described monovalent groups are derived.

Organic-EL-Device Material

In the exemplary embodiment, an organic-EL-device material contains the delayed-fluorescent first compound and the second fluorescent compound represented by the formula (2). The organic-EL-device material may consist solely of the first and second compounds according to the exemplary embodiment, or may further contain another compound.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Electronic Device

The organic EL device 1 of the exemplary embodiment is usable in an electronic device such as a display device and a light-emitting device. Examples of the display unit include display components such as en organic EL panel module, TV, mobile phone, tablet, and personal computer. Examples of the light-emitting unit include an illuminator and a vehicle light.

Second Exemplary Embodiment

An arrangement of an organic EL device according to a second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable, unless otherwise specified.

The organic EL device according to the second exemplary embodiment is different from the organic EL device according to the first exemplary embodiment in further containing a third compound in the emitting layer. Other components are the same as those in the first exemplary embodiment.

Third Compound

The third compound has a larger singlet energy than a singlet energy of the first compound.

Ratio of Three Components

In the emitting layer of the organic EL device of the exemplary embodiment, it is preferable that the content ratio of the first compound is in a range from 10 mass % to 80 mass %, the content ratio of the second compound is in a range from 1 mass % to 10 mass %, and the content ratio of the third compound is in a range from 10 mass % to 80 mass %. An upper limit of the total of the respective content ratios of the first, second and third compounds in the emitting layer is 100 mass %. It should be noted that the emitting layer of the exemplary embodiment may further contain another material in addition to the first, second and third compounds.

The third compound is not particularly limited, but is preferably a compound except for an amine compound. For instance, at least one compound selected from a carbazole derivative, dibenzofuran derivative, and dibenzothiophene derivative is usable as the third compound. However, the third compound is not limited to these derivatives.

The third compound preferably has at least one of a partial structure represented by a formula (31) below and a partial structure represented by a formula (32) below in one molecule.

[Formula 105]

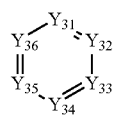

(31)

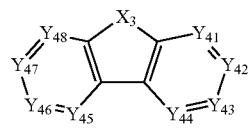

(32)

In the formula (31): $Y_{31}$ to $Y_{36}$ are each independently a nitrogen atom or a carbon atom bonded to another atom in the molecule of the third compound; and at least one of $Y_{31}$ to $Y_{36}$ is a carbon atom bonded to another atom in the molecule of the third compound.

In the formula (32): $Y_{41}$ to $Y_{48}$ are each independently a nitrogen atom or a carbon atom bonded to another atom in the molecule of the third compound; at least one of $Y_{41}$ to $Y_{48}$ is a carbon atom bonded to another atom in the molecule of the third compound; and <<nret>>

$X_3$ is a nitrogen atom, an oxygen atom or a sulfur atom.

In the formula (32), at least two of $Y_{41}$ to $Y_{48}$ are preferably carbon atoms bonded to other atoms in the molecule of the third compound; and a cyclic structure including the carbon atoms is preferably formed.

For instance, the partial structure represented by the formula (32) is preferably one selected from the group consisting of partial structures represented by formulae (321), (322), (323), (324), (325) and (326).

[Formula 106]

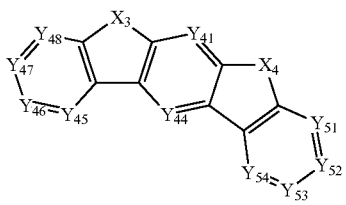
(321)

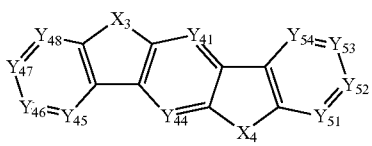
(322)

[Formula 107]

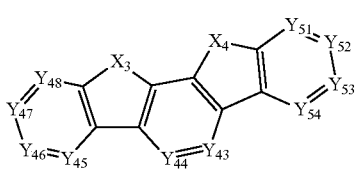
(323)

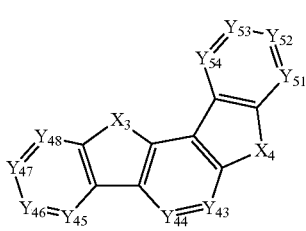
(324)

[Formula 108]

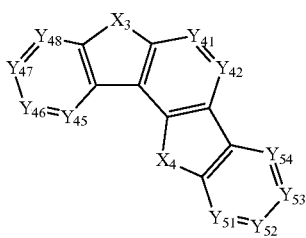
(325)

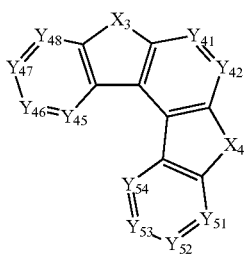
(326)

In the above formulae (321) to (326): $X_3$ is a nitrogen atom, an oxygen atom or a sulfur atom; $Y_{41}$ to $Y_{48}$ are each independently a nitrogen atom or a carbon atom bonded to another atom in the molecule of the third compound; $X_4$ is a nitrogen atom, an oxygen atom, a sulfur atom or a carbon atom; and $Y_{51}$ to $Y_{54}$ are each independently a nitrogen atom or a carbon atom bonded to another atom in the molecule of the third compound.

In the exemplary embodiment, the third compound preferably has the partial structure represented by the formula (323) among the partial structures represented by the formulae (321) to (326).

The partial structure represented by the formula (31) is in a form of at least one group selected from the group consisting of groups represented by formulae (33) and (34) below and is preferably contained in the third compound.

For the third compound, bonding positions are preferably both situated in meta positions as shown in the formulae (33) and (34) to keep an energy gap $T_{77K}(M3)$ at 77 [K] high.

[Formula 109]

In the formula (33) and the formula (34), $Y_{31}$, $Y_{32}$, $Y_{34}$ and $Y_{36}$ are each independently a nitrogen atom or $CR_{31}$, in which $R_{31}$ is a hydrogen atom or a substituent. When $R_{31}$ is the substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, halogen atom, cyano group, nitro group, and carboxy group. The substituted or unsubstituted aromatic hydrocarbon group having 6 to 30 ring carbon atoms in $R_{31}$ is preferably a non-fused ring.

Wavy lines in the formulae (33) and (34) each show a bonding position with another atom or another structure in the molecule of the third compound.

$Y_{31}$, $Y_{32}$, $Y_{34}$ and $Y_{36}$ in the formula (33) are preferably each independently $CR_{31}$. A plurality of $R_{31}$ may be the same or different.

$Y_{32}$, $Y_{34}$ and $Y_{36}$ in the formula (34) are preferably each independently $CR_{31}$. A plurality of $R_{31}$ may be the same or different.

The substituted germanium group is preferably represented by $-Ge(R_{101})_3$. $R_{101}$ is each independently a substituent. The substituent $R_{101}$ is preferably a substituted or unsubstituted alkyl group having 1 to 30 carbon atoms or a substituted or unsubstituted aromatic hydrocarbon group having 6 to 30 ring carbon atoms. A plurality of $R_{101}$ are optionally mutually the same or different.

The partial structure represented by the formula (32) is preferably in a form of at least one group selected from the group consisting of a group represented by a formula (35)

below, a group represented by a formula (36) below, a group represented by a formula (37) below, a group represented by a formula (38) below, a group represented by a formula (39) below and a group represented by a formula (30a) below, and is preferably contained in the second compound.

[Formula 110]

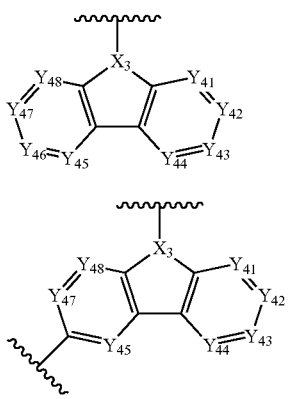

(35)

(36)

[Formula 111]

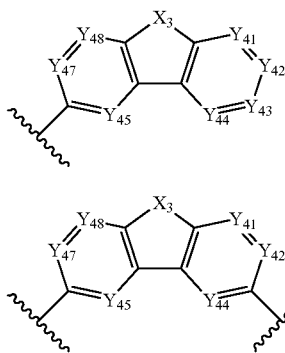

(37)

(38)

[Formula 112]

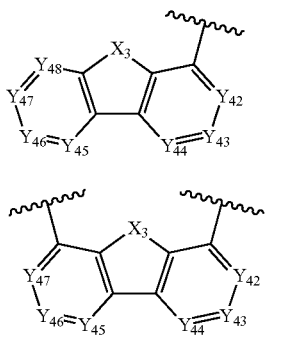

(39)

(30a)

In the above formulae (35) to (39) and (30a): $Y_{41}$, $Y_{42}$, $Y_{43}$, $Y_{44}$, $Y_{45}$, $Y_{46}$, $Y_{47}$ and $Y_{48}$ are each independently a nitrogen atom or $CR_{32}$, in which $R_{32}$ is a hydrogen atom or a substituent. When $R_{32}$ is the substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, halogen atom, cyano group, nitro group, and carboxy group. The substituted or unsubstituted aromatic hydrocarbon group having 6 to 30 ring carbon atoms in $R_{32}$ is preferably a non-fused ring.

$X_3$ in the formulae (35) and (36) is a nitrogen atom.

$X_3$ in (37) to (39) and (30a) is $NR_{33}$, an oxygen atom or a sulfur atom, in which <<nret>>.

$R_{33}$ is a hydrogen atom or a substituent. When $R_{33}$ is the substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or un substituted fluoroalkyl group having 1 to 30 carbon atoms, a substituted or unsubstituted cycloalkyl group having 3 to 30 carbon atoms, a substituted or unsubstituted aralkyl group having 7 to 30 carbon atoms, a substituted silyl group, a substituted germanium group, a substituted phosphine oxide group, fluorine atom, cyano group, nitro group, and carboxy group. The substituted or unsubstituted aromatic hydrocarbon group having 6 to 30 ring carbon atoms in $R_{33}$ is preferably a non-fused ring.

Wavy lines in the formulae (35) to (39) and (30a) each show a bonding position with another atom or another structure in the molecule of the third compound.

$Y_{41}$ to $Y_{48}$ in the formula (35) are preferably each independently $CR_{32}$. $Y_{41}$ to $Y_{45}$, $Y_{47}$ and $Y_{48}$ in the formula (36) and the formula (37) are preferably each independently $CR_{32}$. $Y_{41}$, $Y_{42}$, $Y_{44}$, $Y_{45}$, $Y_{47}$ and $Y_{48}$ in the formula (38) are preferably each independently $CR_{32}$. $Y_{42}$ to $Y_{48}$ in the formula (39) are preferably each independently $CR_{32}$. $Y_{42}$ to $Y_{47}$ in the formula (30a) are preferably each independently $CR_{32}$. A plurality of $R_{32}$ are optionally mutually the same or different.

In the third compound, $X_3$ is preferably an oxygen atom or a sulfur atom, more preferably an oxygen atom.

In the third compound, $R_{31}$ and $R_{32}$ are each independently a hydrogen atom or a substituent. The substituent in $R_{31}$ and $R_{32}$ is preferably selected from the group consisting of a fluorine atom, a cyano group, a substituted or unsubstituted alkyl group having 1 to 30 carbon atoms, a substituted or unsubstituted aromatic hydrocarbon group having 6 to 30 ring carbon atoms, and substituted or unsubstituted heterocyclic group having 5 to 30 ring atoms. $R_{31}$ and $R_{32}$ are more preferably a hydrogen atom, a cyano group, a substituted or unsubstituted aromatic hydrocarbon group having 6 to 30 ring carbon atoms, or a substituted or unsubstituted heterocyclic group having 5 to 30 ring atoms. However, the substituted or unsubstituted aromatic hydrocarbon group having 6 to 30 ring carbon atoms in $R_{31}$ and $R_{32}$ is preferably a non-fused ring.

The third compound is also preferably an aromatic hydrocarbon compound or an aromatic heterocyclic compound. The third compound preferably contains no fused aromatic hydrocarbon ring in a molecule.

Method of Preparing Third Compound

The third compound can be prepared by a method described in International Publication Nos. WO2012/153780 and WO2013/038650 and the like.

Examples of the substituent for the third compound are shown below, but the invention is not limited thereto.

Specific examples of the aromatic hydrocarbon group (occasionally referred to as an aryl group) include a phenyl group, tolyl group, xylyl group, naphthyl group, phenanthryl group, pyrenyl group, chrysenyl group, benzo[c]phenanthryl group, benzo[g]chrysenyl group, benzoanthryl group, triphenylenyl group, fluorenyl group, 9,9-dimethylfluorenyl group, benzofluorenyl group, dibenzofluorenyl group, biphenyl group, terphenyl group, quarterphenyl group and fluoranthenyl group, among which a phenyl group, biphenyl group, terphenyl group, quarterphenyl group, naphthyl group, triphenylenyl group and fluorenyl group may be preferable.

Specific examples of the substituted aromatic hydrocarbon group include a tolyl group, xylyl group and 9,9-dimethylfluorenyl group.

As is understood from the specific examples, the aryl group includes both fused aryl group and non-fused aryl group.

Preferable examples of the aromatic hydrocarbon group include a phenyl group, biphenyl group, terphenyl group, quarterphenyl group, naphthyl group, triphenylenyl group and fluorenyl group.

Specific examples of the aromatic heterocyclic group (occasionally referred to as a heteroaryl group, a heteroaromatic ring group and a heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thiophenyl group, benzothiophenyl group, dibenzothiophenyl group, azadibenzothiophenyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothiophenyl group, carbazolyl group, pyridyl group, pyrimidinyl group, triazinyl group, azadibenzofuranyl group and azadibenzothiophenyl group may be preferable.

The aromatic heterocyclic group is preferably any one of a dibenzofuranyl group, dibenzothiophenyl group, carbazolyl group, pyridyl group, pyrimidinyl group, triazinyl group, azadibenzofuranyl group and azadibenzothiophenyl group, and further preferably any one of a dibenzofuranyl group, dibenzothiophenyl group, azadibenzofuranyl group and azadibenzothiophenyl group.

In the third compound, the substituted silyl group is also preferably a substituted or unsubstituted trialkylsilyl group, a substituted or unsubstituted arylalkylsilyl group, or a substituted or un substituted triarylsilyl group.

Specific examples of the substituted or unsubstituted trialkylsilyl group include trimethylsilyl group and triethylsilyl group.

Specific examples of the substituted or unsubstituted arylalkylsilyl group include diphenylmethylsilyl group, ditolylmethylsilyl group, and phenyl dimethylsilyl group.

Specific examples of the substituted or un substituted triarylsilyl group include triphenylsilyl group and tritolylsilyl group.

In the third compound, the substituted phosphine oxide is also preferably a substituted or unsubstituted diaryl phosphine oxide group.

Specific examples of the substituted or unsubstituted diaryl phosphine oxide group include a diphenyl phosphine oxide group and ditolyl phosphine oxide group.

According to the organic EL device in the second exemplary embodiment, an organic EL device with high performance can be provided.

The organic EL device in the second exemplary embodiment contains in the emitting layer the delayed-fluorescent first compound, the second compound having the specific structure represented by the formula (2) and the like, and the third compound having a larger singlet energy than that of the first compound, thereby improving the luminous efficiency. It is inferred that the luminous efficiency is improved because the carrier balance of the emitting layer is improved by containing the third compound.

Modification of Embodiments

It should be noted that the invention is not limited to the above exemplary embodiments but may include any modification and improvement as long as such modification and improvement are compatible with the invention.

For instance, the emitting layer is not limited to a single layer, but may be provided by laminating a plurality of emitting layers. When the organic EL device has the plurality of emitting layers, it is only required that at least one of the emitting layers contains the first and second compounds. For instance, the rest of the emitting layers may be a fluorescent emitting layer or a phosphorescent emitting layer using emission by electronic transition from the triplet state directly to the ground state.

When the organic EL device includes the plurality of emitting layers, the plurality of emitting layers may be adjacent to each other, or may be laminated on each other via an intermediate layer, a so-called tandem organic EL device.

For instance, a blocking layer may be provided in contact with an anode-side or a cathode-side of the emitting layer. It is preferable that the blocking layer is adjacent to the emitting layer and blocks at least one of holes, electrons and excitons.

For instance, when the blocking layer is provided in contact with the cathode-side of the emitting layer, the blocking layer permits transport of electrons, but prevents holes from reaching a layer provided near the cathode (e.g., the electron transporting layer) beyond the blocking layer. When the organic EL device includes an electron transporting layer, the blocking layer is preferably interposed between the emitting layer and the electron transporting layer.

When the blocking layer is provided in contact with the emitting layer near the anode, the blocking layer permits transport of holes, but prevents electrons from reaching a layer provided near the anode (e.g., the hole transporting layer) beyond the blocking layer. When the organic EL device includes a hole transporting layer, the blocking layer is preferably interposed between the emitting layer and the hole transporting layer.

Further, a blocking layer may be provided in contact with the emitting layer to prevent an excitation energy from leaking from the emitting layer into a layer in the vicinity thereof. Excitons generated in the emitting layer are prevented from moving into a layer provided near the electrode (e.g., an electron transporting layer and a hole transporting layer) beyond the blocking layer.

The emitting layer and the blocking layer are preferably bonded to each other.

Further, the specific arrangement and disposition for practicing the invention may be altered to other arrangements and treatments as long as such other arrangements and dispositions are compatible with the invention.

EXAMPLES

Examples of the invention will be described below. However, the invention is not limited by these Examples.

Compounds used for preparing the organic EL device are shown below.
[Formula 113]
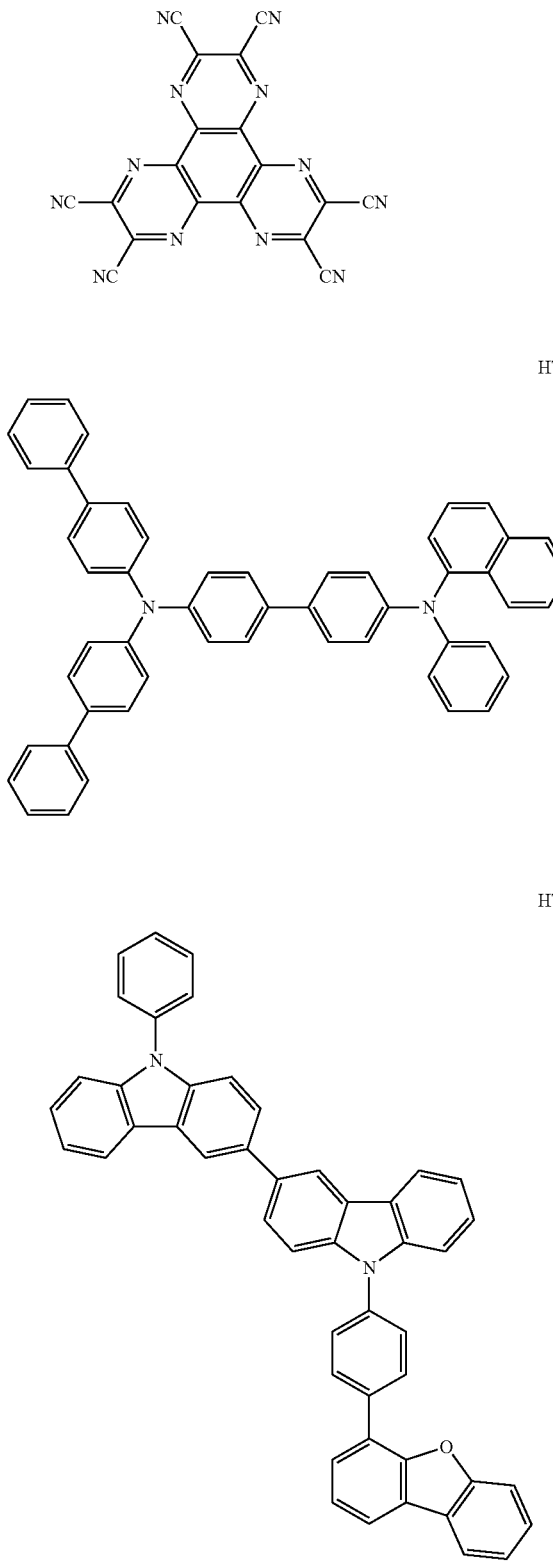
[Formula 114]
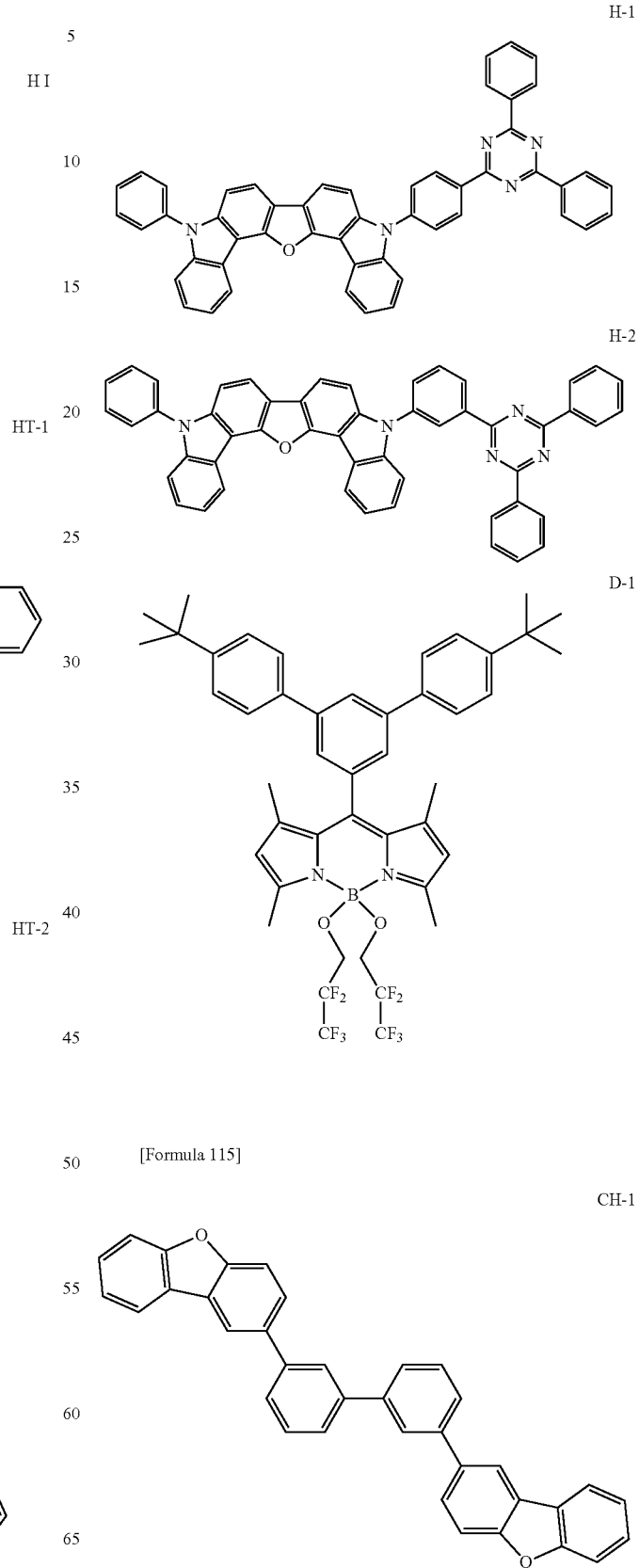
[Formula 115]

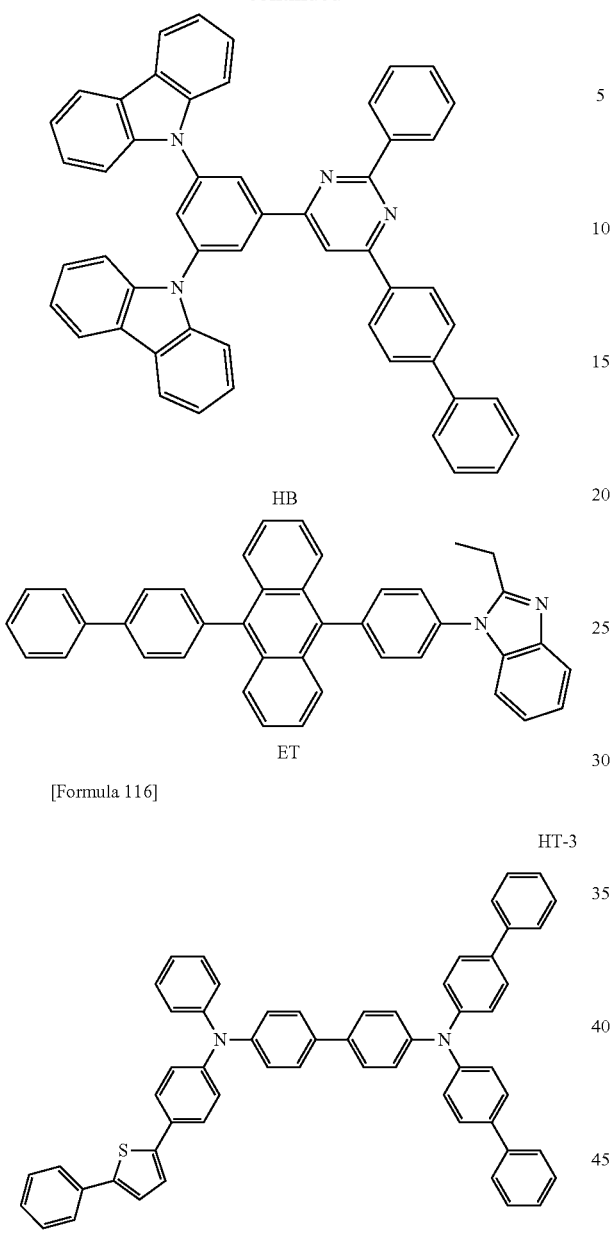
HB
ET
[Formula 116]
HT-3
HT-4
[Formula 117]
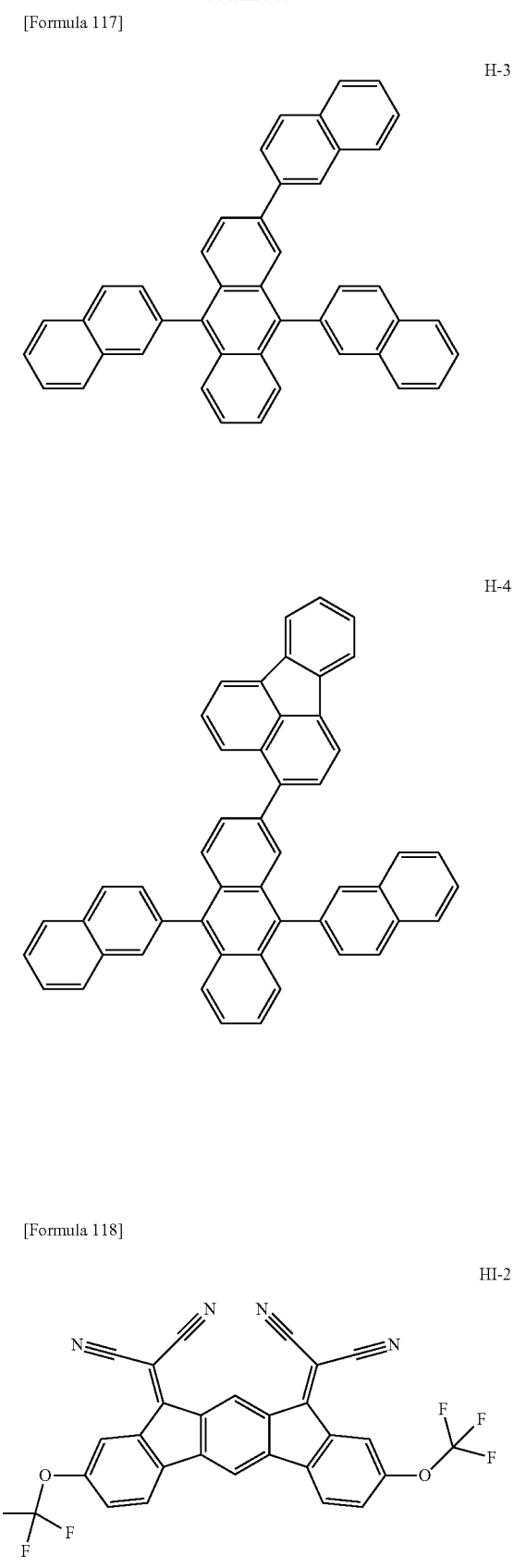
H-3
H-4
[Formula 118]
HI-2

HT-5

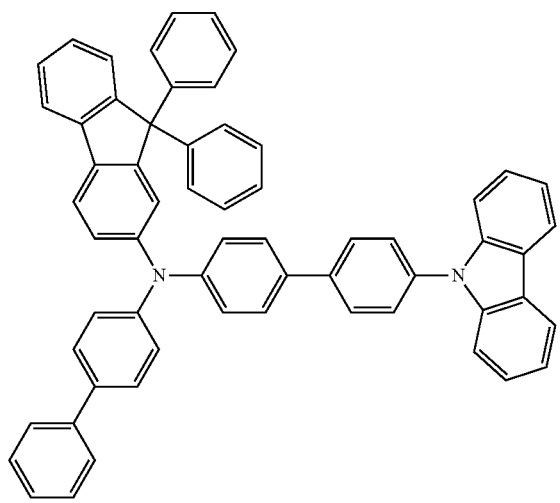

HT-6

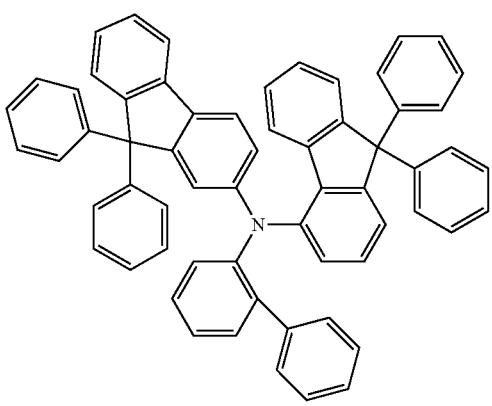

[Formula 119]

H-5

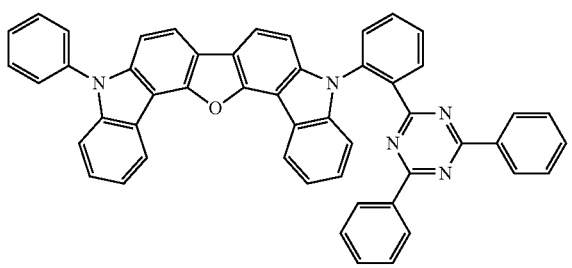

D-2

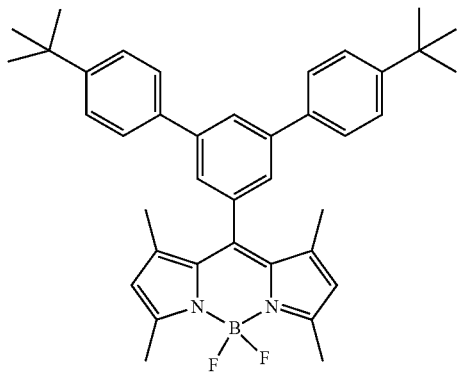

HB-2

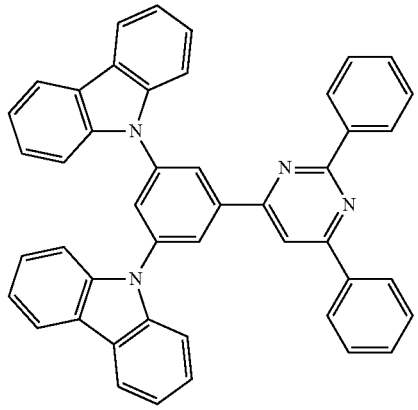

A compound D-1 was synthesized with reference to the disclosure of International Publication No. WO2010/098098.

Evaluation of Compounds

Next, delayed fluorescence and a singlet energy of the compound D-1 was measured. A measurement method and a calculation method are shown below.

Delayed Fluorescence

Delayed fluorescence was checked by measuring transitional PL using the device shown in FIG. 2. A sample was prepared by co-depositing the above compounds H-1 and TH-2 on a quartz substrate at a ratio of the compound H-1 of 12 mass % to form a 100-nm-thick thin film. There are two types of emission: Prompt emission observed immediately when the excited state is achieved by exciting the compound H-1 with a pulse beam (i.e., a beam emitted from a pulse laser) having an absorbable wavelength; and Delay emission observed not immediately when but after the excited state is achieved. The delayed fluorescence in the exemplary embodiment means that an amount of Delay Emission is 5% or more based on an amount of Prompt Emission.

Delayed fluorescence of each of the compounds H-2 and H-5 was checked in the same manner as that of the compound H-1.

It was found that the amount of Delay Emission was 5% or more based on the amount of Prompt Emission in the compounds H-2 and H-5.

The amount of Prompt Emission and the amount of Delay Emission can be obtained according to the method as a method described in "Nature 492, 234-238, 2012." A device used for calculating the amounts of Prompt Emission and Delay Emission is not limited to the device of FIG. 2 and a device described in the above document.

Singlet Energy S

A singlet energy S was measured as follows. A 10-μmol/L toluene solution of a compound to be measured was prepared and put in a quartz cell. An absorption spectrum (ordinate axis: luminous intensity, abscissa axis: wavelength) of the thus-obtained sample was measured at a room temperature (300 K). A tangent was drawn to the fall of the absorption spectrum on the long-wavelength side, and a wavelength value λedge (nm) at an intersection of the tangent and the abscissa axis was assigned to a conversion equation 1 below to calculate a singlet energy.

$$S[eV]=1239.85/\lambda_{edge}$$   Conversion Equation 1:

In Example, the absorption spectrum was measured using a spectrophotometer manufactured by Hitachi, Ltd. (device name: U3310). It should be noted that the absorption spectrum measuring device may be different from the above device.

The calculated singlet energies S are shown below.
H-1: 2.89 eV
H-2: 2.94 eV
H-5: 2.87 eV
CH-1: 3.55 eV Preparation and Evaluation of Organic EL Device The organic EL device was prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus.

Initially, a compound HI was vapor-deposited on a surface of the glass substrate where the transparent electrode line was provided in a manner to cover the transparent electrode, thereby forming a 5-nm-thick hole injecting layer.

Next, the compound HT-1 was vapor-deposited on the hole injecting layer to form a 110-nm-thick first hole transporting layer on the HI film.

Next, the compound HT-2 was deposited on the first hole transporting layer to form a 15-nm-thick second hole transporting layer.

Further, the compound H-1 (the first compound) and the compound D-1 (the second compound) were co-deposited on the second hole transporting layer to form a 25-nm-thick emitting layer. A concentration of the compound D-1 in the emitting layer was given at 1 mass %.

Next, a compound HB was deposited on the emitting layer to form a 5-nm-thick blocking layer.

Next, a compound ET-1 was deposited on the blocking layer to form a 35-nm-thick electron transporting layer.

Lithium fluoride (LiF) was then deposited on the electron transporting layer to form a 1-nm-thick electron injecting electrode (cathode).

A metal aluminum (Al) was then deposited on the electron injecting electrode to form an 80-nm-thick metal Al cathode.

A device arrangement of the organic EL device of Example 1 is shown in symbols as follows.

ITO(130)/HI(5)/HT-1(110)/HT-2(15)/H-1: D-1 (25, 1%)/HB(5)/ET(35)/LiF(1)/Al(80)

Numerals in parentheses represent a film thickness (unit: nm). The numerals in the form of percentage in parentheses indicate a ratio (mass %) of the second compound in the emitting layer.

Example 2

An organic EL device of Example 2 was prepared in the same manner as the organic EL device of Example 1 except that a process for forming the emitting layer was changed as follows. In Example 2, the compound H-1 (the first compound), the compound D-1 (the second compound) and a compound CH-1 (the third compound) were co-deposited on the second hole transporting layer to form a 25-nm-thick emitting layer. The concentration of the compound D-1 in the emitting layer was given at 1 mass % and the concentration of the compound H-1 in the emitting layer was given at 50 mass %.

A device arrangement of the organic EL device of Example 2 is shown in symbols as follows.

ITO(130)/HI(5)/HT-1(110)/HT-2(15)/CH-1: H-1: D-1 (25, 50%, 1%)/HB(5)/ET(35)/LiF(1)/Al(80)

Numerals in parentheses represent a film thickness (unit: nm). The numerals in the form of percentage in parentheses indicate a ratio (mass %) of the first compound and the ratio (mass %) of the second compound in the emitting layer.

Example 3

An organic EL device of Example 3 was prepared in the same manner as the organic EL device of Example 2 except that the compound H-2 was used in place of the compound H-1 in the emitting layer of Example 2.

A device arrangement of the organic EL device of Example 3 is shown in symbols as follows.

ITO(130)/HI(5)/HT-1(110)/HT-2(15)/CH-1: H-2: D-1 (25, 50%, 1%)/HB(5)/ET(35)/LiF(1)/Al(80)

Numerals in parentheses represent a film thickness (unit: nm). The numerals in the form of percentage in parentheses indicate the ratio (mass %) of the first compound and the ratio (mass %) of the second compound in the emitting layer.

Comparative 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound HI was vapor-deposited on a surface of the glass substrate where the transparent electrode line was provided in a manner to cover the transparent electrode, thereby forming a 5-nm-thick hole injecting layer.

Next, the compound HT-3 was vapor-deposited on the hole injecting layer to form a 50-nm-thick first hole transporting layer on the HI film.

Next, the compound HT-4 was deposited on the first hole transporting layer to form a 60-nm-thick second hole transporting layer.

Further, the compound H-3 (the first compound) and the compound D-1 (the second compound) were co-deposited on the second hole transporting layer to form a 30-nm-thick emitting layer. A concentration of the compound D-1 in the emitting layer was given at 5 mass %.

Next, a compound ET was deposited on the emitting layer to form a 20-nm-thick electron transporting layer.

Lithium fluoride (LiF) was then deposited on the electron transporting layer to form a 1-nm-thick electron injecting electrode (cathode).

A metal aluminum (Al) was then deposited on the electron injecting electrode to form an 80-nm-thick metal Al cathode.

A device arrangement of the organic EL device of Comparative 1 is shown in symbols as follows.

ITO(130)/HI(5)/HT-3(50)/HT-4(60)/H-3: D-1 (30, 5%)/ET(20)/LiF(1)/Al(80)

Numerals in parentheses represent a film thickness (unit: nm). The numerals in the form of percentage in parentheses indicate the ratio (mass %) of the second compound in the emitting layer.

163

Comparative 2

An organic EL device of Comparative 2 was prepared in the same manner as the organic EL device of Comparative 1 except that the compound H-4 was used in place of the compound H-3 in the emitting layer of Comparative 1.

A device arrangement of the organic EL device in Comparative 2 is shown in symbols as follows.

ITO(130)/HI(5)/HT-3(50)/HT-4(60)/H-4: D-1 (30, 5%)/ET(20)/LiF(1)/Al(80)

Numerals in parentheses represent a film thickness (unit: nm). The numerals in the form of percentage in parentheses indicate the ratio (mass %) of the second compound in the emitting layer.

Evaluation of Organic EL Devices

The prepared organic EL devices were evaluated as below.

Drive Voltage

Voltage was applied between ITO transparent electrode and Al metal cathode such that a current density was 10 mA/cm$^2$, where the voltage (unit: V) was measured.

Luminance and CIE1931 Chromaticity

Voltage was applied on each of the organic EL devices such that a current density was 10 mA/cm$^2$, where coordinates of CIE1931 chromaticity were measured by a spectroradiometer (CS-1000 manufactured by Konica Minolta Holdings, Inc.).

Main Peak Wavelength $\lambda_p$

A main peak wavelength $\lambda_p$ was calculated based on the obtained spectral-radiance spectra.

Current Efficiency L/J and Power Efficiency η

Voltage was applied on each of the organic EL devices such that the current density was 10 mA/cm$^2$, where spectral-radiance spectra were measured using the above spectroradiometer. A current efficiency (unit: cd/A) and electrical power efficiency η (unit: 1 m/W) were calculated from the obtained spectral radiance spectra.

External Quantum Efficiency EQE

Voltage was applied on each of the organic EL devices such that the current density was 10 mA/cm$^2$, where spectral-radiance spectra were measured using the above spectroradiometer. The external quantum efficiency EQE (unit: %) was calculated based on the obtained spectral-radiance spectra, assuming that the spectra were provided under a Lambertian radiation.

The organic EL device of Example 1 was measured in terms of the drive voltage, CIE1931 chromaticity and main peak wavelength $\lambda_p$. The measurement results are shown in Table 2.

The prepared organic EL devices in Examples 2 and 3 were measured in terms of the luminance, CIE1931 chromaticity, main peak wavelength $\lambda_p$, current efficiency L/J, electrical power efficiency η, and external quantum efficiency EQE. The measurement results are shown in Table 3.

The prepared organic EL devices in Comparatives 1 and 2 were measured in terms of the drive voltage, luminance, CIE1931 chromaticity, main peak wavelength $\lambda_p$, current efficiency L/J, electrical power efficiency η, and external quantum efficiency EQE. The measurement results are shown in Table 4.

TABLE 2

| | Voltage | CIE Chromaticity | | $\lambda_p$ |
|---|---|---|---|---|
| | (V) | x | y | (nm) |
| Example 1 | 3.96 | 0.291 | 0.627 | 519 |

TABLE 3

| | Luminance | CIE Chromaticity | | L/J | η | EQE | $\lambda_p$ |
|---|---|---|---|---|---|---|---|
| | (nit) | x | y | (cd/A) | (lm/W) | (%) | (nm) |
| Example 2 | 912.1 | 0.225 | 0.650 | 9.12 | 6.52 | 2.63 | 518 |
| Example 3 | 976.5 | 0.251 | 0.653 | 9.76 | 6.61 | 2.82 | 518 |

TABLE 4

| | Luminance | Voltage | CIE Chromaticity | | L/J | η | EQE | $\lambda_p$ |
|---|---|---|---|---|---|---|---|---|
| | (nit) | (V) | x | y | (cd/A) | (lm/W) | (%) | (nm) |
| Comparative 1 | 549.8 | 4.17 | 0.206 | 0.724 | 5.50 | 4.14 | 1.43 | 520 |
| Comparative 2 | 561.7 | 4.13 | 0.224 | 0.716 | 5.62 | 4.27 | 1.45 | 520 |

Since the organic EL device of Example 1 contained the first and second compounds in the emitting layer, the drive voltage of the organic EL device of Example 1 was decreased as compared with those of the organic EL devices of Comparatives 1 and 2. Since the organic EL devices of Examples 2 and 3 contained the first, second and third compounds in the emitting layer, the respective luminous efficiencies of the organic EL devices of Examples 2 and 3 were improved as compared with those of the organic EL devices of Comparatives 1 and 2. Thus, the organic EL devices of Examples 1 to 3 with high performance in terms of the drive voltage or the luminous efficiency were provided.

Preparation and Evaluation of Organic EL Device

Example 4

The same glass substrate (manufactured by Geomatec Co., Ltd.) having an ITO transparent electrode (anode) as in Example 1 was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum evaporation apparatus. Initially, a compound HI-2 was vapor-deposited on a surface of the glass substrate where the transparent electrode line was provided in a manner to cover the transparent electrode, thereby forming a 5-nm-thick hole injecting layer.

Next, a compound HT-5 was deposited on the hole injecting layer to form a 125-nm-thick first hole transporting layer.

Next, a compound HT-6 was deposited on the first hole transporting layer to form a 15-nm-thick second hole transporting layer.

Further, the compound H-5 (the first compound), a compound D-2 (the second compound) and the compound CH-1

(the third compound) were co-deposited on the second hole transporting layer to form a 25-nm-thick emitting layer. The concentration of the compound H-5 in the emitting layer was given at 50 mass % and the concentration of the compound D-2 in the emitting layer was given at 0.5 mass %.

A compound HB-2 was then vapor-deposited on the emitting layer to form a 5-nm-thick blocking layer.

Next, the compound ET was deposited on the blocking layer to form a 35-nm-thick electron transporting layer.

Lithium fluoride (LiF) was then deposited on the electron transporting layer to form a 1-nm-thick electron injecting electrode (cathode).

A metal aluminum (Al) was then deposited on the electron injecting electrode to form an 80-nm-thick metal Al cathode.

A device arrangement of the organic EL device of Example 4 is shown in symbols as follows.

ITO(130)/HI-2(5)/HT-5(125)/HT-6(15)/CH-1:H-5:D-2 (25, 50%, 0.5%)/HB-2(5)/ET(35)/LiF(1)/Al(80)

Numerals in parentheses represent a film thickness (unit: nm). The numerals in the form of percentage in parentheses indicate the ratio (mass %) of the first compound and the ratio (mass %) of the second compound in the emitting layer.

Evaluation of Organic EL Devices

The manufactured organic EL device of Example 4 was evaluated in terms of luminous intensity, CIE1931 chromaticity, main peak wavelength $\lambda_p$, current efficiency L/J, electrical power efficiency η and external quantum efficiency EQE. Evaluation in terms of the above items was made by the same method as described above.

TABLE 5

| | Luminance | CIE Chromaticity | | L/J | η | EQE | $\lambda_p$ |
|---|---|---|---|---|---|---|---|
| | (cd/m²) | X | y | (cd/A) | (lm/W) | (%) | (nm) |
| Example 4 | 3066.0 | 0.250 | 0.658 | 30.66 | 19.50 | 8.56 | 521 |

As shown in Table 5, since the organic EL devices of Example 4 contained the first, second and third compounds in the emitting layer, the luminous efficiency of the organic EL device of Example 4 was improved as compared with the luminous efficiency of each of the organic EL devices of Comparatives 1 and 2. Thus, the organic EL device of Example 4 with high performance in terms of the luminous efficiency was provided.

The invention claimed is:

1. An organic electroluminescence device comprising:
an anode;
an emitting layer; and
a cathode,
wherein
the emitting layer comprises a first compound, a second compound, and a third compound,
the first compound is a delayed fluorescent compound represented by a formula (1),

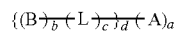  (1)

where, in the formula (1):
A is an acceptor moiety, which is a group having a partial structure of formula (a-2);

when a plurality of A are present, the plurality of A are optionally mutually the same or different and are optionally mutually bonded to form a saturated or unsaturated ring;
B is a donor moiety, which is a group having a partial structure selected from formulae (b-1) to (b-4);
when a plurality of B are present, the plurality of B are optionally mutually the same or different and are optionally mutually bonded to form a saturated or unsaturated ring;
a is an integer of 2 to 5,
b and d are each independently an integer of 1 to 5;
c is an integer of 0 to 5;
when c is 0, A is bonded to B by a single bond or a spiro bond;
when c is an integer of 1 to 5, L is a linking group selected from the group consisting of a substituted or unsubstituted aromatic hydrocarbon group having 6 to 30 ring carbon atoms and a substituted or unsubstituted heterocyclic group having 5 to 30 ring atoms;
when a plurality of L are present, the plurality of L are optionally mutually the same or different and are optionally mutually bonded to form a saturated or unsaturated ring,

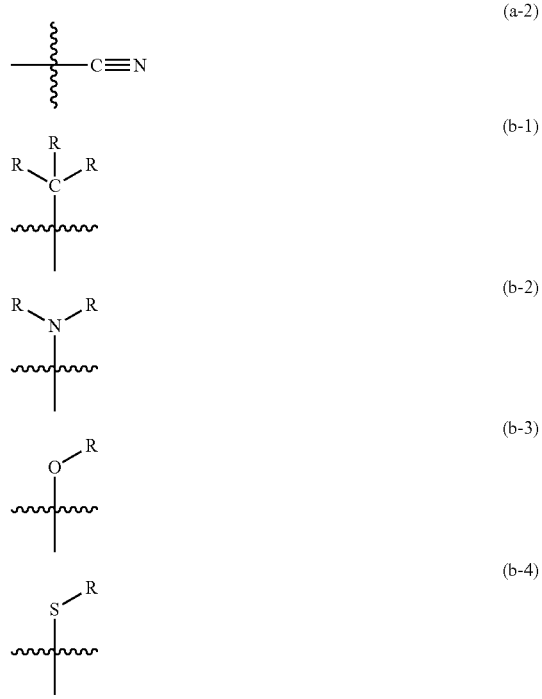

where, in the formulae (b-1) to (b-4):
R is each independently a hydrogen atom or a substituent; when R is a substituent, the substituent is selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms; and when a plurality of R are present, the plurality of R are optionally mutually the same or different and are optionally mutually bonded to form a saturated or unsaturated ring, the second compound is represented by formula (2),

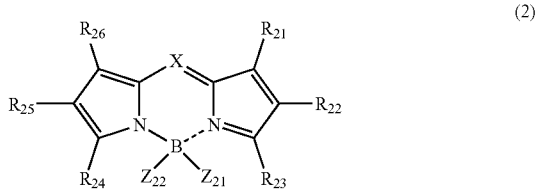

(2)

where: X is a nitrogen atom or a carbon atom to be bonded to Y;
Y is a hydrogen atom or a substituent;
$R_{21}$ to $R_{26}$ are each independently a hydrogen atom or a substituent, two or more of $R_{21}$ to $R_{26}$ being mutually bonded to form a cyclic structure or not mutually bonded;
when Y and $R_{21}$ to $R_{26}$ are substituents, the substituents are selected from the group consisting of a substituted or unsubstituted alkyl group, a substituted or unsubstituted cycloalkyl group, a substituted or unsubstituted aryl group, a substituted or unsubstituted alkoxy group, a substituted or unsubstituted alkylthio group, a substituted or unsubstituted aryloxy group, a substituted or unsubstituted arylthio group, a substituted or unsubstituted alkenyl group, a substituted or unsubstituted aralkyl group, a substituted or unsubstituted heteroaryl group, a halogen atone, a haloalkyl group, a carboxy group, an ester group, a carbamoyl group, an amino group, a nitro group, a cyano group, a silyl group, and a siloxanyl group; and
$Z_{21}$ and $Z_{22}$ are each independently selected from the group consisting of a halogen atom, a substituted or unsubstituted aryl group, a substituted or unsubstituted alkoxy group, and a substituted or unsubstituted aryloxy group, $Z_{21}$ and $Z_{22}$ being mutually bonded to form a cyclic structure or not mutually bonded, and
the third compound has a larger singlet energy than a singlet energy of the first compound,
wherein the emitting layer does not comprise an anthracene derivative.

2. The organic electroluminescence device according to claim 1, wherein
$R_{21}$ to $R_{26}$ are not mutually bonded, and
$Z_{21}$ and $Z_{22}$ are not mutually bonded.

3. The organic electroluminescence device according to claim 2, wherein at least one of $Z_{21}$ and $Z_{22}$ in the formula (2) is represented by a formula (2a) below,

(2a)

where: A is a substituted or unsubstituted alkyl group having 1 to 6 carbon atoms or a substituted or unsubstituted aryl group having 6 to 12 ring carbon atoms;
$L_2$ is a substituted or unsubstituted alkylene group having 1 to 6 carbon atoms or a substituted or unsubstituted arylene group having 6 to 12 ring carbon atoms;
m is an integer of 0 to 7; and
a plurality of $L_2$ are optionally mutually the same or different.

4. The organic electroluminescence device according to claim 3, wherein at least one of A and $L_2$ in the formula (2a) is substituted by a halogen atom.

5. The organic electroluminescence device according to claim 3, wherein the second compound is represented by a formula (20) below,

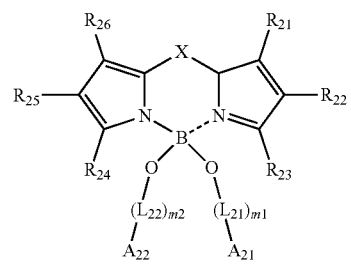

(20)

where: X, Y and $R_{21}$ to $R_{26}$ respectively represent the same as X, Y and $R_{21}$ to $R_{26}$ in the formula (2);
$A_{21}$ and $A_{22}$ represent the same as A in the formula (2a) and are optionally mutually the same or different;
$L_{21}$ and $L_{22}$ represent the same as $L_2$ in the formula (2a) and are optionally mutually the same or different;
m1 and m2 are each independently an integer of 0 to 7;
a plurality of $L_{21}$ are optionally mutually the same or different; and
a plurality of $L_{22}$ are optionally mutually the same or different.

6. The organic electroluminescence device according to claim 2, wherein at least one of $Z_{21}$ and $Z_{22}$ is any one of an alkoxy group substituted by a fluorine atom, an aryloxy group substituted by a fluorine atom, and an aryloxy group substituted by a fluoroalkyl group.

7. The organic electroluminescence device according to claim 2, wherein at least one of $Z_{21}$ and $Z_{22}$ is a fluorine atom.

8. The organic electroluminescence device according to claim 2, wherein when Y and $R_{21}$ to $R_{26}$ are substituents, the substituents each are selected from the group consisting of a substituted or unsubstituted alkyl group having 1 to 30 carbon atoms, a substituted or unsubstituted cycloalkyl group having 3 to 30 carbon atoms, a substituted or unsubstituted aryl group having 6 to 30 ring carbon atoms, a substituted or unsubstituted alkoxy group having 1 to 30 carbon atoms, a substituted or unsubstituted alkylthio group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 6 to 30 ring carbon atoms, a substituted or unsubstituted heteroaryl group having 5 to 30 ring atoms, halogen atom, haloalkyl group, carboxy group, ester group, carbamoyl group, amino group, nitro group, cyano group, silyl group and siloxanyl group.

9. The organic electroluminescence device according to claim 2, wherein when Y and $R_{21}$ to $R_{26}$ are substituents, the substituents each are selected from the group consisting of a substituted or unsubstituted alkyl group having 1 to 30 carbon atoms, a substituted or unsubstituted cycloalkyl group having 3 to 30 carbon atoms, a substituted or unsubstituted aryl group having 6 to 30 ring carbon atoms, a substituted or unsubstituted alkoxy group having 1 to 30 carbon atoms, a substituted or unsubstituted aryloxy group having 6 to 30 ring carbon atoms, a substituted or unsubstituted heteroaryl group having 5 to 30 ring atoms, halogen atom and haloalkyl group.

10. The organic electroluminescence device according to claim 2, wherein at least one of $R_{21}$, $R_{23}$, $R_{24}$ and $R_{26}$ in the formulae (2) is a substituted or unsubstituted alkyl group having 1 to 30 carbon atoms.

11. The organic electroluminescence device according to claim 2, wherein at least one of $R_{21}$, $R_{23}$, $R_{24}$ and $R_{26}$ in the formulae (2) is a substituted or unsubstituted aryl group having 6 to 30 ring carbon atoms.

12. The organic electroluminescence device according to claim 2, wherein X is a carbon atom and Y is a substituted or unsubstituted aryl group having 6 to 30 ring carbon atoms.

13. The organic electroluminescence device according to claim 2, wherein the second compound is a fluorescent compound exhibiting an emission peak in a wavelength range from 500 nm to 550 nm.

14. The organic electroluminescence device according to claim 2, wherein the organic electroluminescence device emits light having an emission peak in a wavelength range from 500 nm to 550 nm.

15. The organic electroluminescence device according to claim 2, wherein the second compound has no cyclic structure formed by bonding $Z_{21}$ and $Z_{22}$.

16. The organic electroluminescence device according to claim 2, further comprising: a hole transporting layer between the anode and the emitting layer.

17. The organic electroluminescence device according to claim 2, further comprising: an electron transporting layer between the emitting layer and the cathode.

18. An electronic device comprising the organic electroluminescence device according to claim 2.

19. The organic electroluminescence device according to claim 1, wherein the second compound is represented by a formula (21) below,

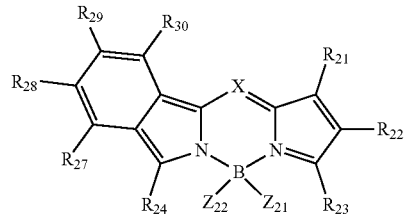

(21)

where,

X, Y, $R_{21}$ to $R_{24}$, $Z_{21}$ and $Z_{22}$ are the same as X, Y, $R_{21}$ to $R_{24}$, $Z_{21}$ and $Z_{22}$ in the formula (2), $R_{27}$ to $R_{30}$ are each independently a hydrogen atom or a substituent, and $R_{27}$ to $R_{30}$ as the substituent are the same as the substituents for $R_{21}$ to $R_{24}$.

20. An electronic device comprising the organic electroluminescence device according to claim 1.

21. The organic electroluminescence device according to claim 1, wherein b is an integer of 2 to 5.

22. The organic electroluminescence device according to claim 1, wherein the third compound comprises a partial structure of formula (32)

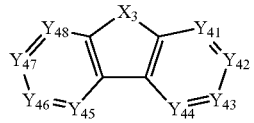

(32)

wherein $Y_{41}$ to $Y_{48}$ are each independently a nitrogen atom or a carbon atom bonded to another atom in the molecule of the third compound and at least one of $Y_{41}$ to $Y_{48}$ is a carbon atom bonded to another atom in the molecule of the third compound and $X_3$ is a nitrogen atom, an oxygen atom or a sulfur atom.

* * * * *